(12) United States Patent
Sakui et al.

(10) Patent No.: US 7,242,613 B2
(45) Date of Patent: Jul. 10, 2007

(54) NONVOLATILE SEMICONDUCTOR MEMORY DEVICE

(75) Inventors: Koji Sakui, Tokyo (JP); Yoshio Iizuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/218,598

(22) Filed: Sep. 6, 2005

(65) Prior Publication Data
US 2006/0050559 A1    Mar. 9, 2006

(30) Foreign Application Priority Data
Sep. 7, 2004   (JP)   ............................. 2004-260157

(51) Int. Cl.
*G11C 16/04*   (2006.01)
(52) U.S. Cl. ........................... 365/185.05; 365/185.17; 257/314; 257/324
(58) Field of Classification Search ........... 365/185.05, 365/185.17; 257/314, 324
See application file for complete search history.

(56) References Cited

U.S. PATENT DOCUMENTS 6,166,958 A * 12/2000 Naruke et al. ......... 365/185.24
6,577,533 B2 * 6/2003 Sakui et al. ........... 365/185.05
6,762,955 B2   7/2004 Sakui et al.
6,816,421 B2 * 11/2004 Tanzawa et al. ............ 365/201

FOREIGN PATENT DOCUMENTS

JP    6-338602    12/1994
JP    7-45797     2/1995

* cited by examiner

*Primary Examiner*—Hoai V. Ho
(74) *Attorney, Agent, or Firm*—Oblon, Spivak, McClelland, Maier & Neustadt, P.C.

(57) ABSTRACT

The nonvolatile semiconductor memory device of this invention has a trench region in a semiconductor substrate and has a NAND type memory cell unit in three dimensions in both sides of a side wall of one trench region, respectively. And these NAND memory cell units are connected to one bit line. In each NAND type memory cell unit, a plurality of the memory cell transistors and the selective gate transistors are connected in series. These pluralities of the memory cell transistors and the selective gate transistors are provided in the same trench region. Moreover, in the nonvolatile semiconductor memory device of this invention, an insulating layer containing a lamination structure of a silicon oxide film, a silicon nitride film and a silicon oxide film, or silicon, or metal or other nano crystals of conductivity substance is used for an electric charge accumulation layer of the memory cell transistor instead of a conventional floating gate.

4 Claims, 57 Drawing Sheets

Fig. 35

|  | When erasing(V) | When reading(V) | When writing(V) |
|---|---|---|---|
| Selected word line WLi | 0 | 0 | 18 |
| Non-selected word line WL0~WL15(Ecept WLi) | 0 | 4.5 | 10(=Vpass) |
| Selected gate line SSL1 | F | 0 | 0 |
| Selected gate line SSL2 | F | 4.5 | 3.5(=Vcc) |
| Selected gate line GSL | F | 4.5 | 0 |
| "0" writing bit line BL0 | F | 1.8 | 0 |
| "1" writing bit line BL1 | F | 0.7 | 3.5(=Vcc) |
| Memory cell P type well | 21 | 0 | 0 |

Fig. 44

|  | When erasing (V) | When reading (V) | When writing (V) |
|---|---|---|---|
| Selected word line WLi | 0 | 0 | 18 |
| Non-selected word line WL0~WL31 (Except WLi) | 0 | 4.5 | 10 (=Vpass) |
| Selected word line SSL1 | F | 0 | 0 |
| Selected word line SSL2 | F | 4.5 | 3.5 (=Vcc) |
| Selected word line GSL | F | 4.5 | 0 |
| "0" writing bit line BL0 | F | 1.8 | 0 |
| "1" writing bit line BL1 | F | 0.7 | 3.5 (=Vcc) |
| Memory cell P type well | 21 | 0 | 0 |

NONVOLATILE SEMICONDUCTOR MEMORY DEVICE

CROSS-REFERENCE TO RELATED APPLICATIONS

This application is based upon and claims the benefit of priority from the prior Japanese Patent Applications No. 2004-260157, filed on Sep. 7, 2004, the entire contents of which are incorporated herein by reference.

TECHNICAL FIELD

The present invention relates to a nonvolatile semiconductor memory device, and it especially relates to the nonvolatile semiconductor memory device having a NAND type memory cell unit.

BACKGROUND OF THE INVENTION

In recent years, the demand for small-size nonvolatile semiconductor memories with large capacity is increasing rapidly, and especially, compared with the conventional NOR type EEPROM, NAND type EEPROM which can expect high integration has attracted attention.

As for NAND type EEPROM, one line of one source/drain line formed in the diffusion zone of the silicon active region is formed to one bit line BL. That is, one NAND type memory cell unit is constituted to one bit line BL. Here, if a design rule is set to F (Feature Size), the line/space of bit line BL is set to 1F/1F, and the line/space of word line WL is also set to 1F/1F. For this reason, the cell size of one memory cell transistor MTr is set to $2F \times 2F = 4F^2$. Since two selective gate transistors are provided in one NAND type memory cell unit, if the size of these selective gate transistors is considered as an overhead $\alpha$, substantial one cell size becomes $4F^2 + \alpha$.

On the other hand, the following patent documents 1 discloses the nonvolatile semiconductor memory device which a trench is formed in a semiconductor substrate in order to minimize one cell size and the NAND memory cell unit forms lengthwise at the wall part of the trench side.

Patent documents 1: Japanese Laid-Open Patent Publication No. H7-45797

The technology disclosed in this patent document is that as shown FIG. 57, a trench region TC is formed in a semiconductor substrate, and memory cell transistor MTr is formed on the sidewall of the both sides of this trench region TC, respectively. In this case, a floating gate FG is formed along with the side wall of inner side of the trench region, and a source/drain SD is formed as a diffusion zone along with side wall of trench region of a semiconductor substrate. That is, as for this NAND type memory cell unit, a plurality of memory cell transistors MTr are formed along with the sidewall of trench region TC, and for this reason, a source/drain current flows along with the sidewall of a trench region. A bit line BL is formed for every NAND type memory cell unit via an interlayer insulating film. The line/space in this bit line BL is 1F/1F.

However, in the technology disclosed in the above-mentioned patent documents 1, only one silicon activation region can be located in the bit line pitch of 2F, and memory cell size cannot be effectually reduced by half, and the further high integration is demanded.

Then, the present invention is conducted in view of the above subject, and it aims at making NAND type EEPROM in three dimensions and locating source/drain line in the bit line pitch of 2F in two silicon activation regions. That is, it purposes that two NAND type memory cell units are located to one bit line. And thereby it purposes to reduce a memory cell size by half, offering the nonvolatile semiconductor memory device which can realize low bit cost as a result.

SUMMARY OF THE INVENTION

A nonvolatile semiconductor memory device of the present invention has a trench region in a semiconductor substrate and has a NAND type memory cell unit in three dimensions on both sides of a side wall of one trench region, respectively. And these NAND memory cell units are connected with one bit line. In each NAND type memory cell unit, a plurality of memory cell transistors and selective gate transistors are connected in series. These pluralities of memory cell transistors and selective gate transistors are provided in the same trench region.

In addition, in the nonvolatile semiconductor memory device of the present invention, instead of a conventional floating gate, an insulating layer containing a lamination structure of an silicon oxide film, a silicon nitride film and a silicon oxide film, or silicon, metal and other conductive substance of nano crystals is used for an electric charge accumulation layer of a memory cell transistor.

A nonvolatile semiconductor memory device according to an embodiment of the present invention comprises a memory cell array having a first NAND type memory cell unit connecting a plurality of 1st memory cell transistor in-series which a 1st electric charge accumulation layer and control gate are laminated, and a second NAND type memory cell unit connecting in-series a plurality of second memory cell transistor which 2nd electric charge accumulation layer and said control gate are laminated are arranged in the shape of an array, and wherein said 1st memory cell transistor and said 2nd memory cell transistor are formed to face each other along with both-sides of wall of a trench formed on a semiconductor substrate respectively, sharing said one control gate formed by extending in a depth direction of said trench;

wherein said control gate is formed between said 1st electric charge accumulation layer of said 1st memory cell transistor and said 2nd electric charge accumulation layer of said 2nd memory cell transistor, and electrically connects with a word line extending continuously; and wherein said 1st electric charge accumulation layer and said 2nd electric charge accumulation layer are respectively formed by laminating silicon oxide film, a silicon nitride film and silicon oxide film in order, and said control gate is made of poly silicon doped with impurities or metal.

A nonvolatile semiconductor memory device according to an embodiment of the present invention comprises a memory cell array having 1st NAND type memory cell unit and 2nd NAND type memory cell unit, the 1st memory cell unit having 1st NAND type memory cell array connecting in-series a plurality of 1st memory cell transistor which the 1st electric charge accumulation layer and control gate are laminated, 1st switch part at source line side connecting between said 1st NAND type memory cell array and a common source line, and the 1st switch part at bit line side connected between the 1st NAND type memory cell array and the bit line, the 2nd memory cell unit having 2nd NAND type memory cell array connecting in-series a plurality of 2nd memory cell transistor which the 2nd electric charge accumulation layer and the control gate are laminated, 2nd switch part at source line side connecting between said 2nd NAND type memory cell array and the common source line, and the 2nd switch part at bit line side connected between the 2nd NAND type memory cell array and the bit line, wherein said 1st memory cell transistor and said 2nd memory cell transistor are formed respectively to face each other along with both-sides of wall of a trench formed on a semiconductor substrate, sharing said one control gate formed by extending in a depth direction of said trench, wherein said control gate is formed between said 1st electric charge accumulation layer of said 1st memory cell transistor and said 2nd electric charge accumulation layer of said 2nd memory cell transistor, and electrically connects with a word line extending continuously, and wherein said 1st electric charge accumulation layer and said 2nd electric charge accumulation layer are respectively formed by laminating silicon oxide film, a silicon nitride film and silicon oxide film in order, and said control gate is made of poly silicon doped with impurities or metal.

A nonvolatile semiconductor memory device according to an embodiment of the present invention comprises a memory cell array having a first NAND type memory cell unit connecting a plurality of 1st memory cell transistor in-series which a 1st electric charge accumulation layer and control gate are laminated and a second NAND type memory cell unit connecting in-series a plurality of second memory cell transistor which 2nd electric charge accumulation layer and said control gate are laminated, are arranged in the shape of an array, and wherein said 1st memory cell transistor and said 2nd memory cell transistor are formed respectively to face each other along with both-sides of wall of a trench formed on a semiconductor substrate, sharing said one control gate formed by extending in a depth direction of said trench, and said control gate is formed between said 1st electric charge accumulation layer of said 1st memory cell transistor and said 2nd electric charge accumulation layer of said 2nd memory cell transistor, electrically connecting with a word line extending continuously, and wherein said 1st electric charge accumulation layer and said 2nd electric charge accumulation layer respectively comprises an insulating layer including silicon, metal or conductive nano crystal and said control gate is made of poly silicon doped with impurities or metal.

A nonvolatile semiconductor memory device according to an embodiment of the present invention comprises a memory cell array having 1st NAND type memory cell unit and 2nd NAND type memory cell unit, the 1st memory cell unit having 1st NAND type memory cell array connecting in-series a plurality of 1st memory cell transistor which the 1st electric charge accumulation layer and control gate are laminated, 1st switch part at source line side connecting between said 1st NAND type memory cell array and a common source line, and the 1st switch part at bit line side connected between the 1st NAND type memory cell array and the bit line, the 2nd memory cell unit having 2nd NAND type memory cell array connecting in-series a plurality of 2nd memory cell transistor which the 2nd electric charge accumulation layer and the control gate are laminated, 2nd switch part at source line side connecting between said 2nd NAND type memory cell array and the common source line, and the 2nd switch part at bit line side connected between the 2nd NAND type memory cell array and the bit line, wherein the 1st memory cell transistor and said 2nd memory cell transistor are formed respectively to face each other along with both-sides of wall of a trench formed on a semiconductor substrate, sharing said one control gate formed by extending in a depth direction of said trench, and said control gate is formed between said 1st electric charge accumulation layer of said 1st memory cell transistor and said 2nd electric charge accumulation layer of said 2nd memory cell transistor, electrically connecting with a word line extending continuously, and wherein the 1st electric charge accumulation layer and said 2nd electric charge accumulation layer respectively comprise an insulating layer including silicon, metal or conductive nano-crystal, and said control gate is made of poly silicon doped with impurities or metal.

According to the nonvolatile semiconductor memory device of the present invention, two memory transistors and a selective gate transistor are formed in three dimensions in the trench region formed in the semiconductor substrate, and two NAND type memory cell units can be formed in one bit line pitch 2F, and minimization of the size of a nonvolatile semiconductor memory device can be realized. According to the nonvolatile semiconductor memory device of the present invention, since it does not have a floating gate (Floating Gate) which is used for a conventional nonvolatile semiconductor memory device, not only that minimization of the size of a nonvolatile semiconductor memory device can be realized, but also that an aspect ratio of control gate (CG) can become smaller without being influenced by coupling between the floating gates which has been a problem conventionally. In addition, the nonvolatile semiconductor memory device of the present invention is applicable to the conventional CMOS process, and a highly efficient nonvolatile memory device can be realized by a simpler process than the process required in the conventional nonvolatile semiconductor memory device. The nonvolatile semiconductor memory device of the present invention can restrain Stress-Induced Leakage Current (SILC) which are the main causes of degrading a nonvolatile semiconductor memory element, because the memory transistor does not have a floating gate, and also, Drain-Turn-On can be restrained.

As for the NAND type memory cell of the type providing the memory transistor in the trench, interference caused by the memory cell which counters between adjoining trenches occurs easily. However, in the NAND memory cell array of the nonvolatile semiconductor memory device of the present invention, a selective gate transistor is used, and since only right or left cell array of a NAND memory cell unit to a trench is selected and the cell array of right and left to a slot is riot selected simultaneously, such interference does not occur easily. To achieve this, it is necessary that the NAND memory cell of the cell array of a NAND memory cell unit becomes E/D alternately by right and left. That is, to avoid choosing the adjoining right and left to a slot simultaneously, a selective gate transistor is made E (it lines as EDEDEDED; it does not line as EDDEEDDE.)

In addition, if a bit line shield is read out (every one bit line), the interference between memory cells is controlled by an adjoining trench. In this case, a selective gate transistor can be located in a line of EDDEEDDE.

BRIEF DESCRIPTION OF THE DRAWINGS

The accompanying drawings, which are incorporated into and form a part of the specification, illustrate one or more embodiments of the present invention, together with the description, serve to explain the principals of the invention. The drawings are only for the purpose of illustrating one or more preferred embodiments of the invention and are not to be construed as limiting the invention. In the drawings:

FIG. 18A is a diagram showing in plane view the manufacturing process of the memory cell transistor portion in FIG. 2.

FIG. 35 is a diagram explaining operation of the nonvolatile semiconductor memory device concerning the embodiment of this invention.

FIG. 44 is a diagram explaining operation of the nonvolatile semiconductor memory device concerning the embodiment of this invention.

DETAILED DESCRIPTION OF THE PREFERRED EMBODIMENTS

Figure 1:
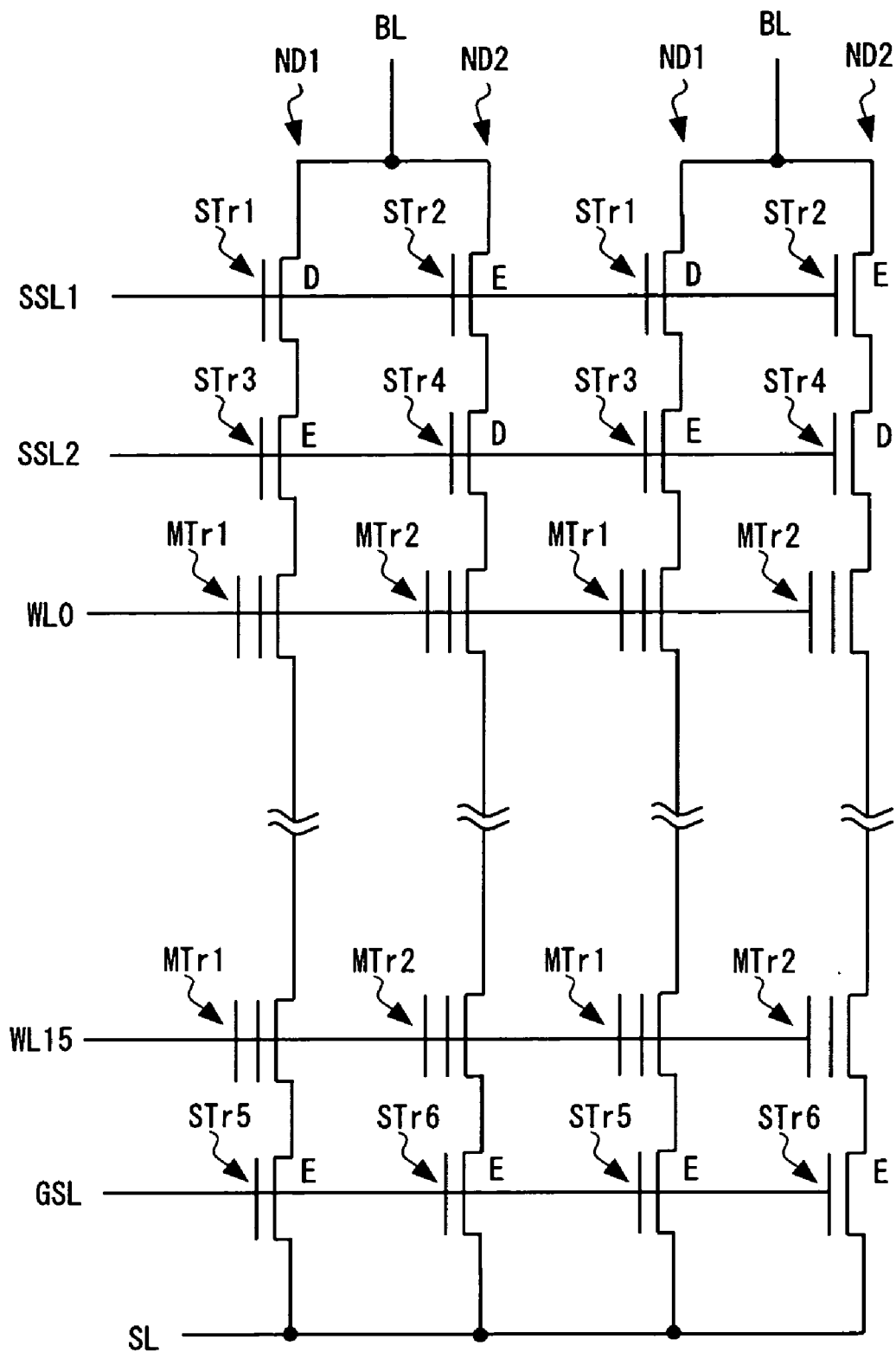
FIG. 1 is a diagram showing the equivalent circuit of the nonvolatile semiconductor memory device concerning one embodiment of this invention.

FIG. 1 is referred to. FIG. 1 shows the equivalent circuit of the nonvolatile semiconductor memory device concerning one embodiment of this invention. Hereafter, based on FIG. 1, the condition of connection of the memory cell array of the nonvolatile semiconductor memory device concerning this embodiment is explained.

As shown in FIG. 1, in the nonvolatile semiconductor memory device concerning this embodiment, two NAND type memory cell units ND1 and ND2 are provided for one bit line BL. NAND type memory cell unit ND1 is constituted by connecting in-series with selective gate transistors STr1 and STr3, 16 units of memory cell transistors MTr1 and a selective gate transistor STr5. Similarly, NAND type memory cell unit ND2 is constituted by connecting in-series selective gate transistors STr2 and STr4, 16 units of memory cell transistors MTr1 and a selective gate transistor STr6. In this embodiment, the number of memory cell transistor MTr1 which constitutes NAND type memory cell unit ND1 and the number of the memory cell transistor MTr2 which constitutes NAND type memory cell unit ND2 are set to 16 units, respectively, however, it is acceptable to set 32 units or 64 units etc. and it is not necessarily limited to this.

The drain side of the selective gate transistors STr1 and STr2 are connected with the bit line BL in common. Here, the selective gate transistors STr1 and STr4 are depression type MOS transistors (the normally on type; it is indicated as "D" in FIG. 1), and other selective gate transistors STr2, STr3, STr5 and STr6 are enhancement type MOS transistor (the normally off type; it is indicated as "E" in FIG. 1). The source side of selective gate transistors STr5 and STr6 are connected with common source line SL.

Gate electrodes of selective gate transistors STr1 and STr2 of each NAND type memory cell unit ND1 and ND2 are connected in common and are connected with a selective gate line SSL1. Gate electrodes of selective gate transistors STr3 and STr4 of each NAND type memory cell unit ND1 and ND2 are connected in common, and are connected with a selective gate line SSL2. The control gates ("CG") of memory cell transistors MTr1 and MTr2 of each NAND type memory cell unit ND1 and ND2 are connected in common respectively, and are connected with corresponding word lines WL0 to WL15 respectively. The gate electrodes of selective gate transistors STr5 and STr6 of each NAND type memory cell unit ND1 and ND2 are connected in common and are connected with a selective gate line GSL.

The switch part at bit line side in this embodiment consists of the selective gate transistor STr1, STr2, STr3 and STr4, and by this switch part at bit line side, either of NAND type memory cell unit ND1 or ND2 with 1 set of two-piece is selected. The switch part at source line side in this embodiment consists of the selective gate transistors STr5 and STr6.

In the nonvolatile semiconductor memory device of this embodiment, as shown in FIG. 1, a plurality of NAND type memory cell unit ND1 and ND2 are arranged in the shape of arrays and they constitute one memory cell array. In this embodiment, this memory cell array is called "NAND type memory cell array."

Next, based on FIG. 2 through FIG. 6, the structure of the NAND type memory cell array of the nonvolatile semiconductor memory device concerning this embodiment is explained.

Figure 2:
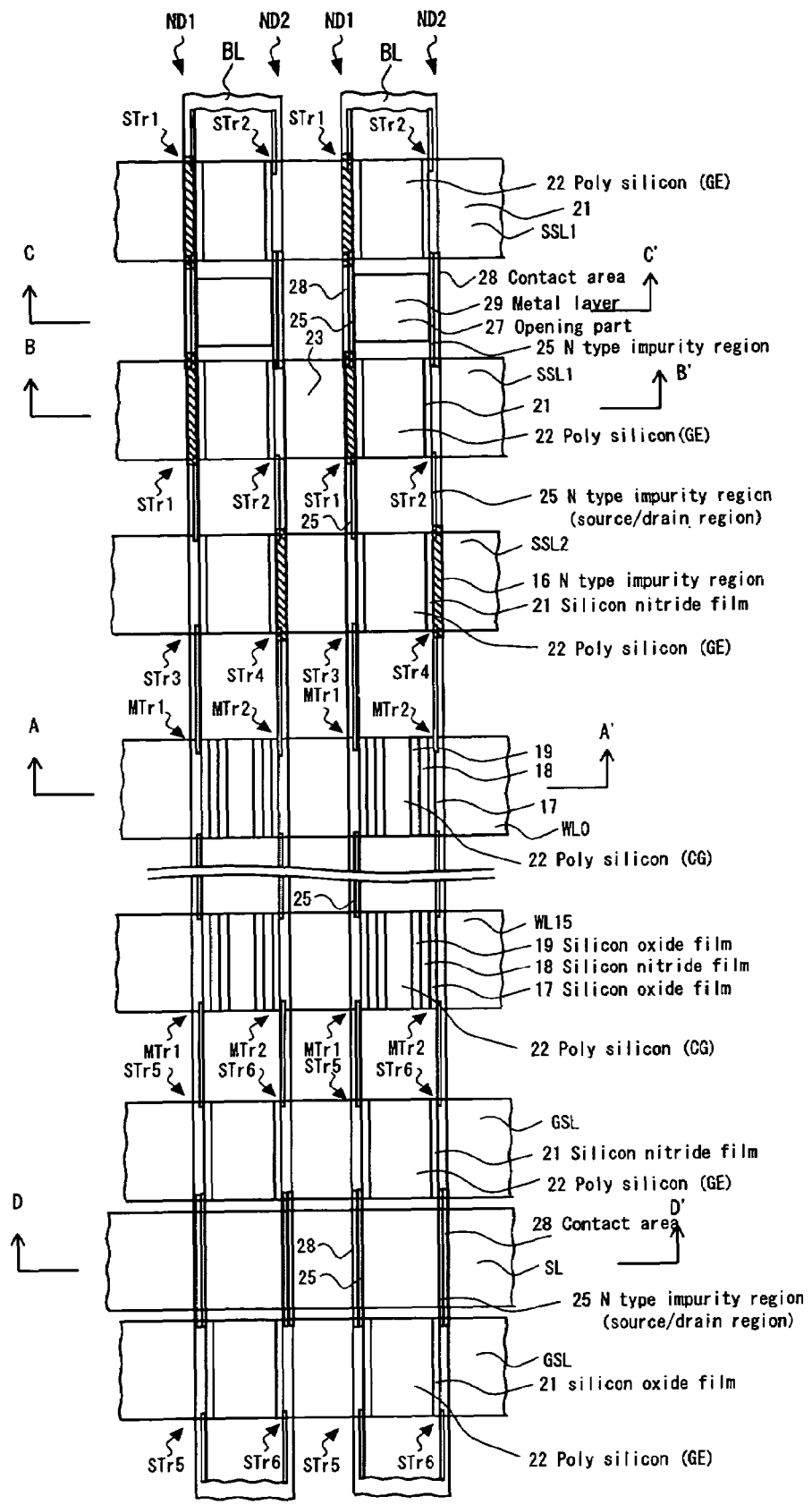
FIG. 2 is a diagram showing the structure of the memory cell unit of the nonvolatile semiconductor memory device concerning one embodiment of this invention in plane view.
Figure 3A:
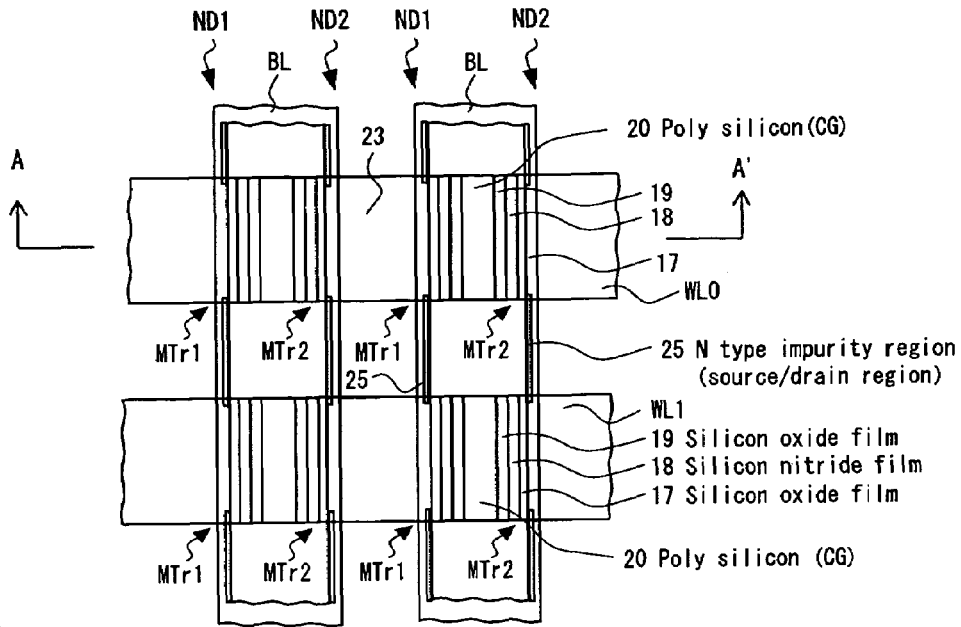
FIG. 3A is a diagram showing the structure of the memory cell transistor portion in FIG. 2 in plane view.
Figure 3B:
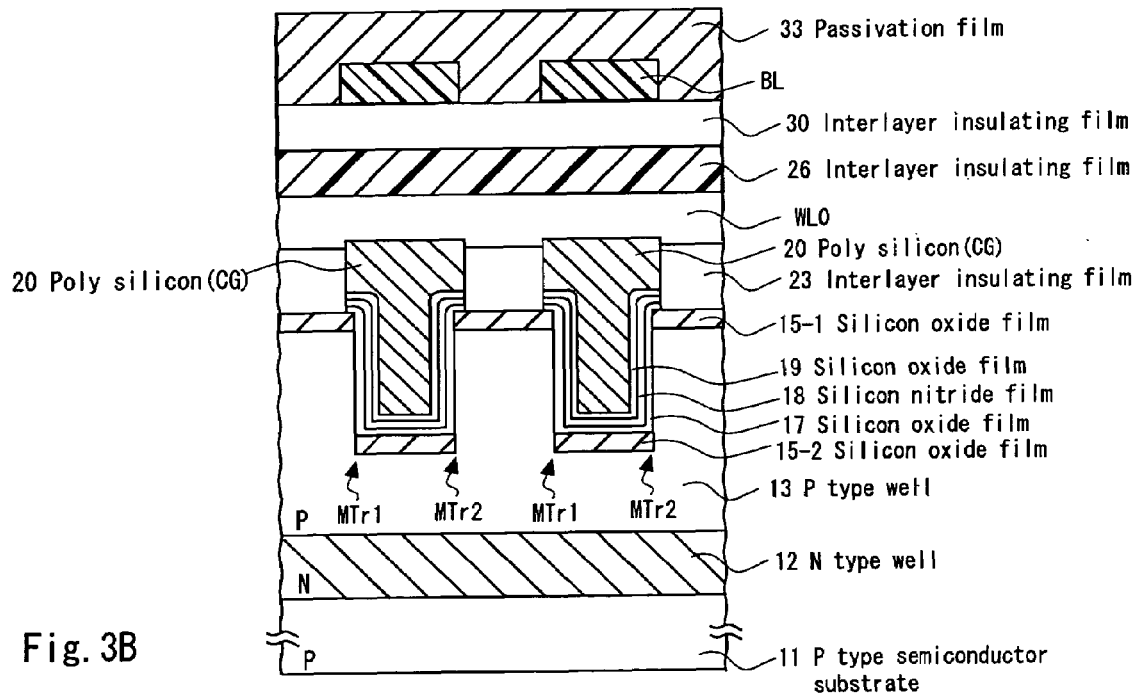
FIG. 3B is a diagram showing a cross section of the A–A' line.
Figure 4A:
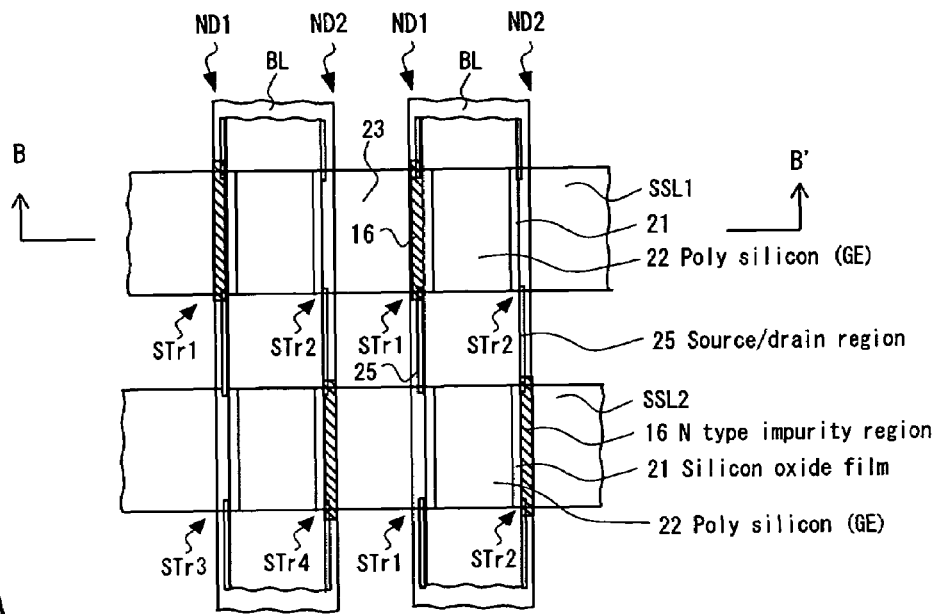
FIG. 4A is a diagram showing the structure of the selective gate transistor portion in FIG. 2.
Figure 4B:
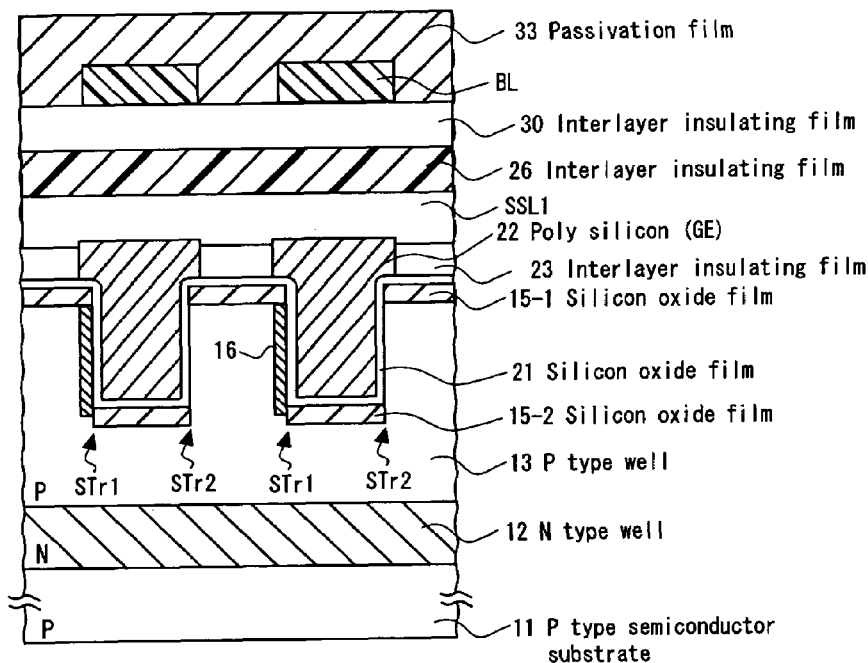
FIG. 4B is a diagram showing a cross section of the B–B' line.
Figure 5A:
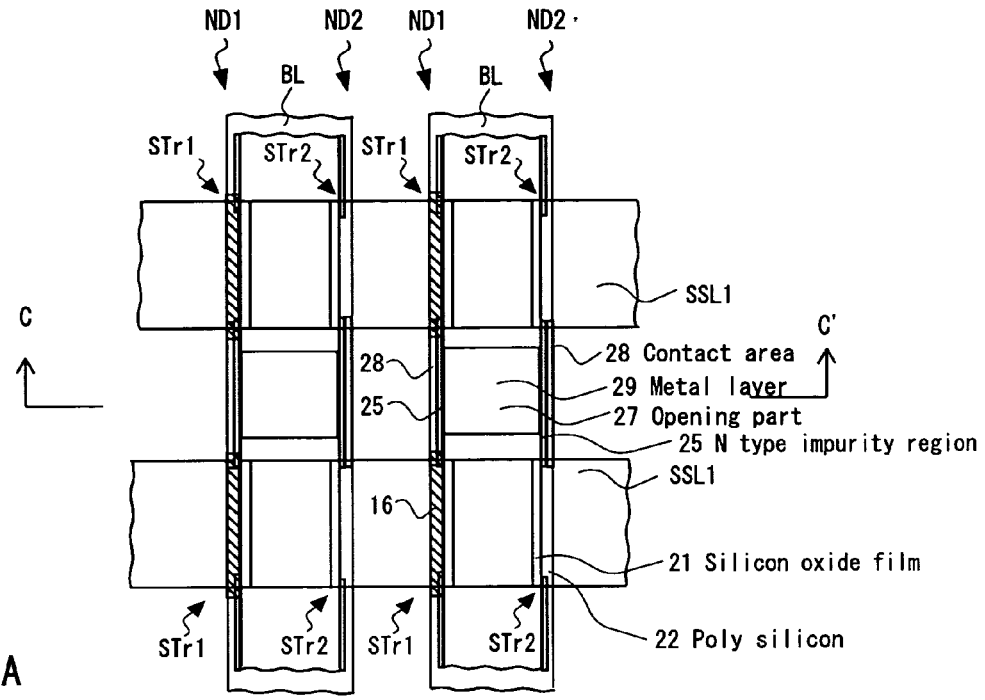
FIG. 5A is a diagram showing the structure of the bit line contact part in FIG. 2 in plane view.
Figure 5B:
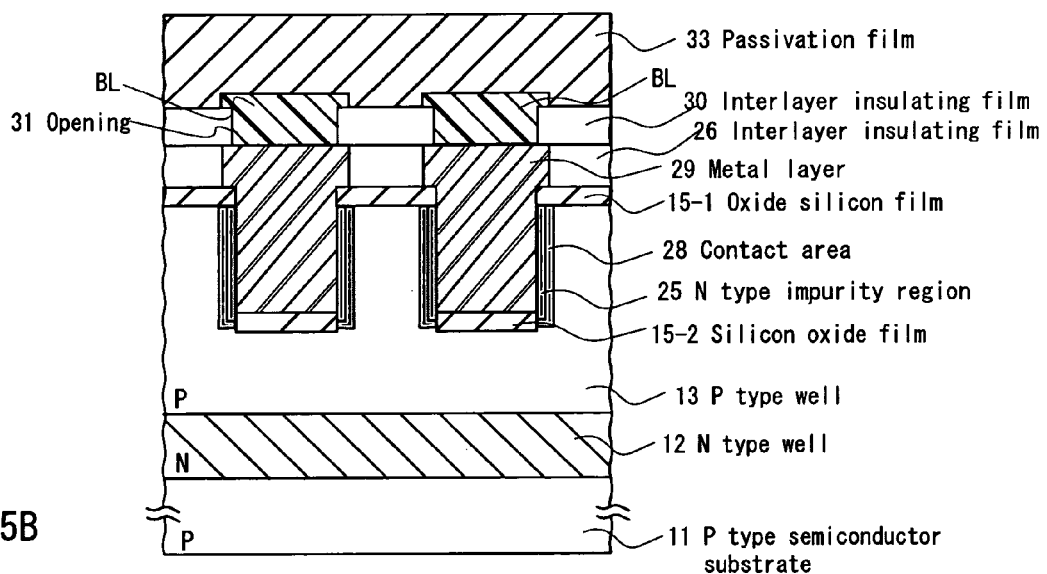
FIG. 5B is a diagram showing a cross section of the C–C' line.
Figure 6A:
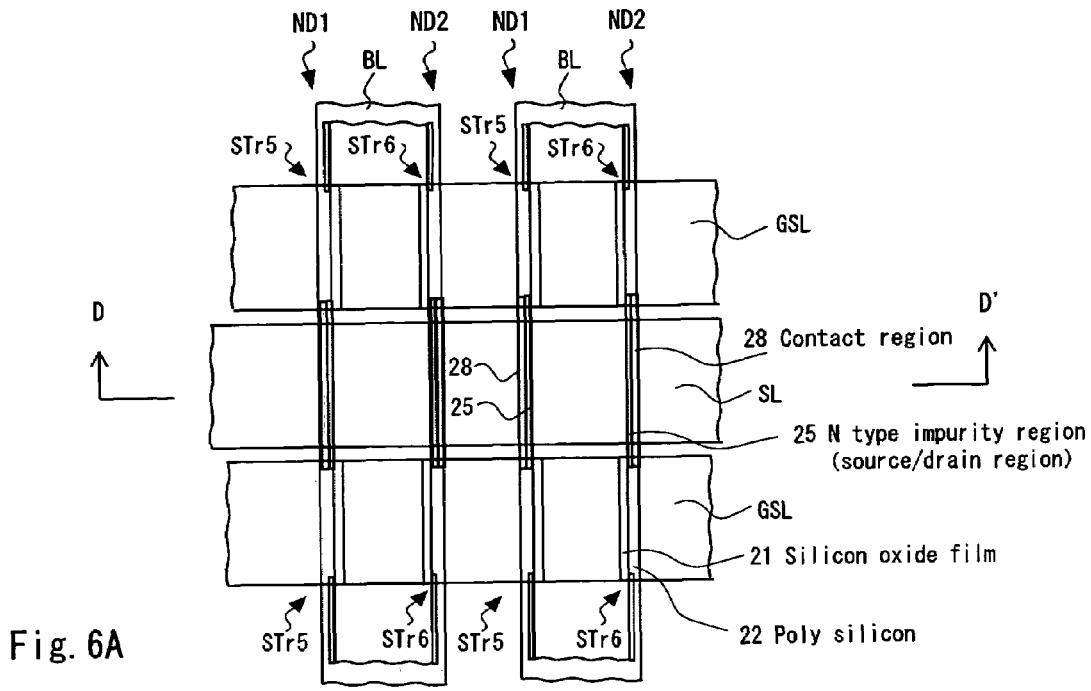
FIG. 6A is a diagram showing the structure of the source line contact part in FIG. 2 in plane view.
Figure 6B:
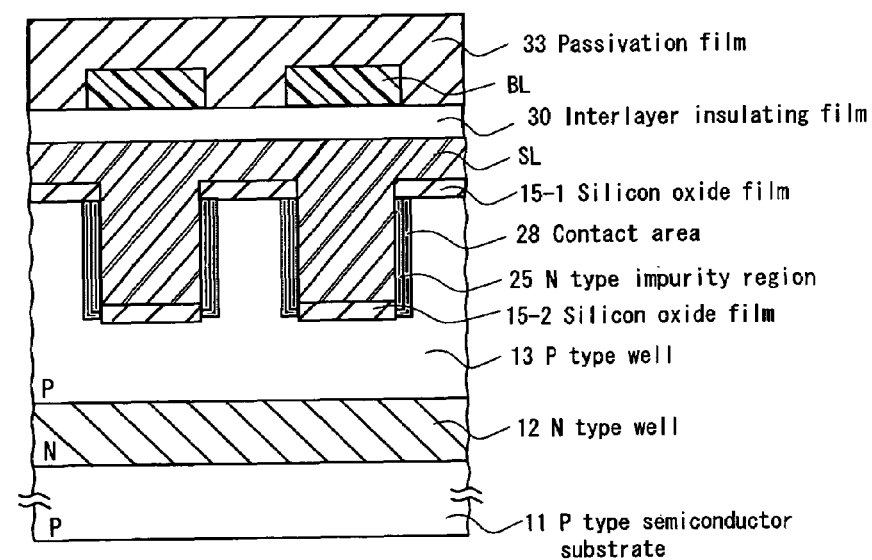
FIG. 6B is a diagram showing a cross section of the D–D' line.
Figure 7A:
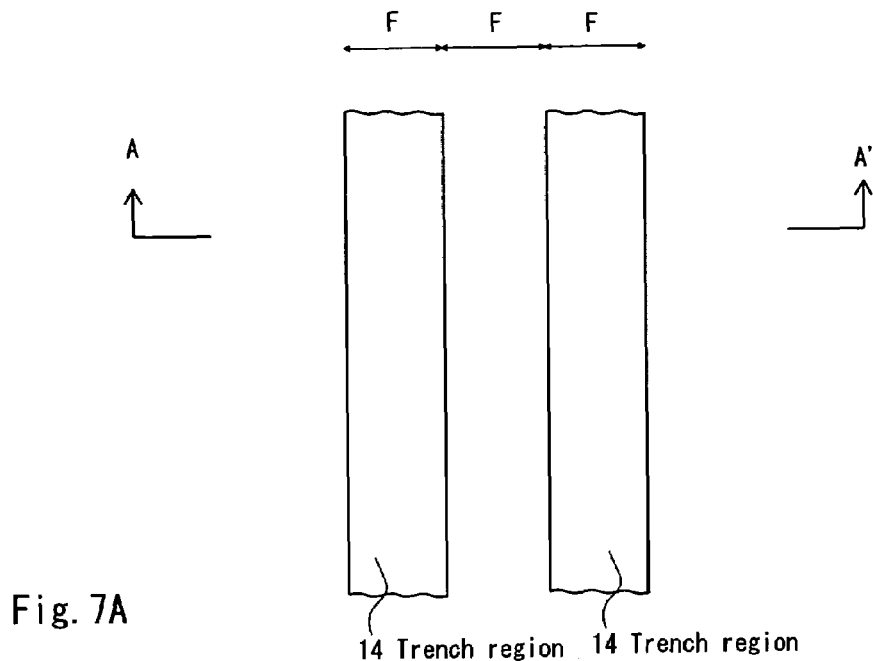
FIG. 7A is a diagram showing the manufacturing process of the memory cell transistor portion in FIG. 2.
Figure 7B:
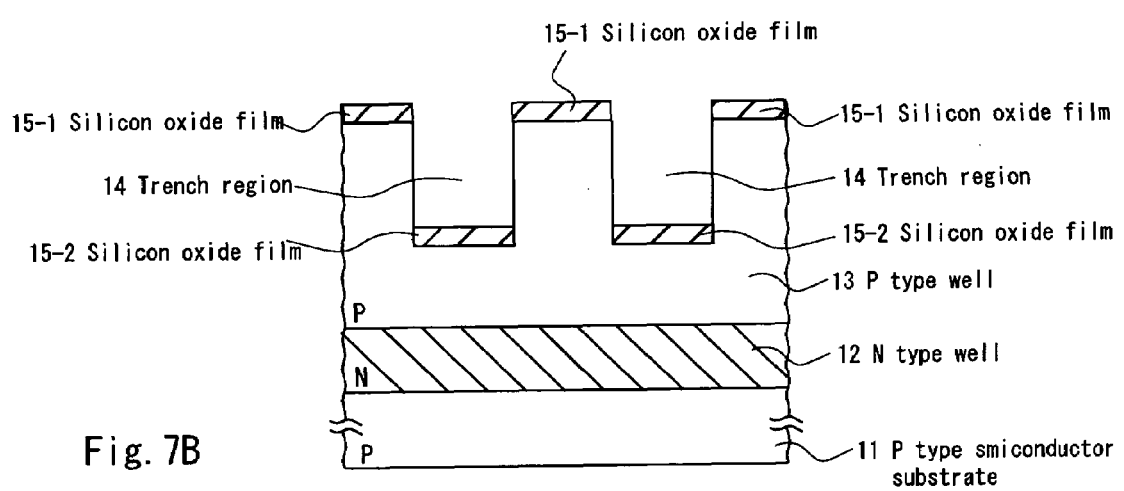
FIG. 7B is a diagram showing a cross section of the A–A' line.

FIG. 2 is a diagram describing typically the upper surface of the NAND type memory cell array concerning this embodiment. In FIG. 2, for the convenience of explanation, a part of opaque constituent factor is shown as transparent in order to explain a lower constituent factor. FIG. 3A is a diagram showing typically the upper surface of the word line portion in FIG. 2, and FIG. 3B is a cross sectional view of the A–A' line. FIG. 4A is a diagram showing typically the upper surface of the selected word line portion in FIG. 2, and FIG. 4B is a cross sectional view of the B–B' line. FIG. 5A is a diagram showing typically the upper surface of the contact part of the bit line in FIG. 2, and FIG. 5B is a cross sectional view of the C–C' line. FIG. 6A is a diagram showing typically the upper surface of the contact part of the common source line SL in FIG. 2, and FIG. 6B is a cross sectional view of the D–D' line.

As shown in FIG. 2 to FIG. 6, the NAND type memory cell units ND1 and ND2 are formed in the both sides of the side wall of one trench region 14, respectively. Especially, as shown in FIGS. 2, 3 and 4, a memory cell transistor MTr1 of this NAND type memory cell unit ND1 and a memory cell transistor MTr2 of NAND type memory cell unit ND2 are formed facing each other in one trench region 14. A selective gate transistor STr1 of the NAND type memory cell unit ND1 and a selective gate transistor STr2 of the NAND type memory cell unit ND2 are formed facing each other in one trench region 14. A selective gate transistor STr3 of NAND type memory cell unit ND1 and a selective gate transistor STr4 of NAND type memory cell unit ND2 are formed facing each other in one trench region 14. A selective gate transistor STr5 of the NAND type memory cell unit ND1 and a selective gate transistor STr6 of the NAND type memory cell unit ND2 are formed facing each other in one trench region 14.

Two memory cell transistors MTr1 and MTr2 facing each other respectively have a silicon oxide film 17 formed in the side wall of trench region 14 formed in P type well 13, and a silicon nitride film 18 and a silicon oxide film 19. In addition, two memory cell transistors MTr1 and MTr2 facing each other have one common control gate (CG). In this embodiment, a control gate (CG) is formed of poly silicon 20 in which impurities are doped. In the nonvolatile semiconductor memory device of this embodiment, even if high resistance material like poly silicon is used for a control gate (CG) 20, it does not cause any problem if the word line WL linked to the control gate (CG) 20 uses the low resistance materials of a metal (including aluminum (Al), copper (Cu), tungsten silicide (WSi)), and the control gate (CG) and the word line WL can be formed separately. In order to make smaller contact resistance with the control gate (CG) 20 and the word line WL, it is preferable that the upper part of the control gate (CG) 20 is doped with impurities to make low resistance.

As explained above, in this embodiment, two memory cell transistors MTr1 and MTr2 facing each other is constituted of P type well, the silicon oxide film 17, the silicon nitride film 18, the silicon oxide film 19 and the poly silicon 20, and they have what is called "SONOS" structure where the electric charge accumulation layer is formed of the lamination structure of the silicon oxide film 17, the silicon nitride film 18 and the oxide silicon film 19. In the memory cell transistors MTr1 and MTr2 of this embodiment, an electric charge is held at the SiN trap which is dispersed and distributed into the silicon nitride film 18.

The control gate (CG) 20 formed of this poly silicon is formed by extending perpendicularly in the depth direction of the trench region 14 and by extending in the horizontal direction of the trench region 14. The control gate (CG) 20 is electrically connected with word lines WL0 to WL15 (in FIG. 3B, it is the word line WL0) which form continuously. In order to make smaller contact resistance between the control gate (CG) 20 and the word lines WL0 to WL15 (in case of this FIG. 3, it is the word line WL0), it is preferable that the upper part of control gate (CG) 20 is doped with impurities to become low resistance. It is also acceptable that the control gate (CG) 20 and the word lines WL0 to WL15 are electrically connected via another film (for example, poly silicon which impurities are doped) placed between the control gate (CG) 20 and the word lines WL0 to WL15.

As shown in FIG. 2 and FIG. 4, the selective gate transistor STr1 of the NAND type memory cell unit ND1 and the selective gate transistor STr2 of the NAND type memory cell unit ND2 are formed in the form which faces each other in one trench region 14. Two selective gate transistors STr1 and STr2 facing each other has the silicon oxide film 17 formed in the side wall and the common gate electrode (GE), respectively. In this embodiment, this common gate electrode (GE) is formed of poly silicon 22. Since the selective transistor gate STr1 is a depression type MOS transistor, N type impurity region 16 is formed in the P type well 13 of the sidewall of trench region 14, i.e., the region where a channel is formed.

The gate electrode (GE) formed of this poly silicon 22 is formed by extending perpendicularly in the depth direction of the trench region 14 and by extending in the horizontal direction of the trench region 14. In addition, the common gate electrode (GE) is electrically connected with the selective gate line SSL1 which are formed continuously. In the nonvolatile semiconductor memory device of this embodiment, even if high resistance material like poly silicon is used for the gate electrode (GE) 22, it does not cause a problem if the low resistance materials of a metal (such as aluminum (Al), copper (Cu), tungsten silicide (WSi), etc.) is used for the selective gate line SSL1 connecting to the gate electrode (GE) 22, and the gate electrode (GE) 22 and the selective gate line SSL1 can be formed separately. In order to make smaller contact resistance between the gate electrode (GE) 22 and the selective gate line SSL1, it is preferable that the upper part of the gate electrode (GE) 22 is doped with impurities to become low resistance.

In this embodiment, as the same as the above, the gate electrode (GE) 22 of the selective gate transistors STr3 and STr4 is electrically connected to the selective gate line SSL2, and the gate electrode (GE) 22 of the selective gate transistors STr5 and STr6 is electrically connected to the selective gate line GSL.

As shown in FIG. 2 and FIG. 5, the selective gate transistors STr1 and STr2 is respectively connected with one metal layer 29 in the shape of plug through a contact region 28, and this metal layer 29 in the shape of this plug is connected to the bit line BL.

As same as selective gate transistors STr1 and STr2, as shown in FIGS. 2 and 4, the selective gate transistor STr3 of the NAND type memory cell unit ND1 and the selective gate transistor STr4 of the NAND type memory cell unit ND2 are formed to face each other in one trench region 14. Regarding the selective gate transistors STr3 and STr4, since the selective gate transistor STr4 is a depression type MOS transistor, N type impurity region 16 is formed in the region where a channel is formed. Except for the above point, the structure of the selective gate transistor STr3 and STr4 is as same as selective gate transistor STr1 and STr2 mentioned above.

As same as the selective gate transistor Str1, STr2, Str3 and Str4, as shown in FIG. 2 and FIG. 6, the selective gate transistor STr5 of the NAND type memory cell unit ND1 and the selective gate transistor STr6 of the NAND type memory cell unit ND2 are formed to face each other in one trench region 14. The structure of the selective gate transistors STr5 and STr6 is as same as an enhancement type selective gate transistors STr2 and STr3 of an enhancement type mentioned above.

As shown in FIGS. 2 and 6, the selective gate transistors STr5 and STr6 are respectively connected to the contact region 28 through the common source line SL formed continuously.

Next, the manufacturing process of the nonvolatile semiconductor memory device concerning this embodiment is explained, referring to FIG. 7 to FIG. 34. FIGS. 7 to 10, FIGS. 11 to 14, FIGS. 15 to 18, FIGS. 19 to 22, FIGS. 23 to 26, FIGS. 27 to 30 and FIG. 31 to 34 are diagrams which divide the steps of the manufacturing process of the nonvolatile semiconductor memory device of this embodiment into four portions for explanation, respectively. These divided diagrams by four correspond to the portion indicated in FIGS. 3 to 6 mentioned above, respectively. Namely, FIGS. 7, 11, 15, 19, 23, 27 and 31 correspond to the portion indicated in FIG. 3, and FIGS. 8, 12, 16, 20, 24, 28 and 32 correspond to the portion indicated in FIG. 4, and FIGS. 9, 13, 17, 21, 25, 29 and 33 correspond to the portion indicated in FIG. 5, and FIGS. 10, 14, 18, 22, 26, 30 and 34 correspond to the portion indicated in FIG. 6.

As shown in FIG. 7 to FIG. 10, first, the memory cell N type well 12 is formed on a semiconductor substrate 11 which is a P type silicon substrate. Then, the memory cell P type well 13 is formed within this memory cell N type well 12. Next, on the surface of this memory cell P type well 13, a silicon oxide film 15-1 is formed by a thickness of 30 nm. This silicon oxide film 15-1 is formed by CVD (Chemical Vapor Deposition) method, for example. Then, a trench region 14 is formed in the memory cell P type well 13. This trench region 14 is formed by patterning photo-resist and carrying out RIE (Reactive Ion Etching), for example. For this reason, if a design rule is set to F, the width of the trench region 14 is 1F, and the interval of the trench region 14 also becomes 1F. Also in this embodiment, the depth of the trench region 14 is 160 nm.

Next, a silicon oxide film 15-2 is formed at the bottom of the trench region 14 by a thickness of 30 nm. In this embodiment, while leaving photo-resist used when forming the trench region 14, and after depositing a silicon oxide film with the CVD method and exfoliating this photo-resist, the silicon oxide film 15-2 is formed at the bottom of the trench region 14. However, the silicon oxide film 15-1 and the silicon oxide film 15-2 may be formed at the same process. In this case, the process to form the silicon oxide film 15-1 as mentioned above is omitted, and after the photo-resist which the trench region 14 is formed is removed, by depositing a silicon oxide film with the CVD method, the silicon oxide film 15-1 and the silicon oxide film 15-2 are formed simultaneously.

Figure 8A:
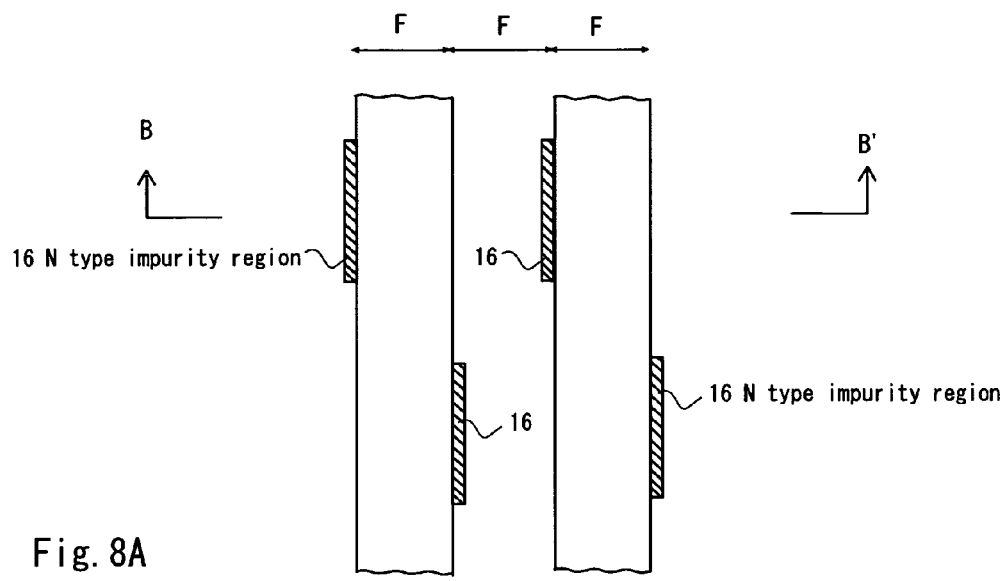
FIG. 8A is a diagram showing the manufacturing process of the selective gate transistor portion in FIG. 2 in plane view.
Figure 8B:
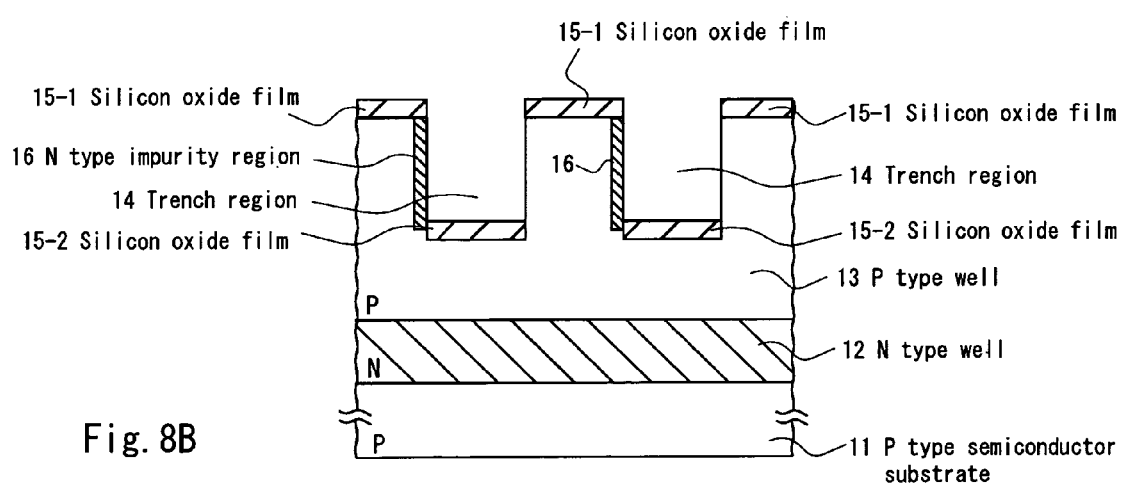
FIG. 8B is a diagram showing a cross section of the B–B' line.
Figure 9A:
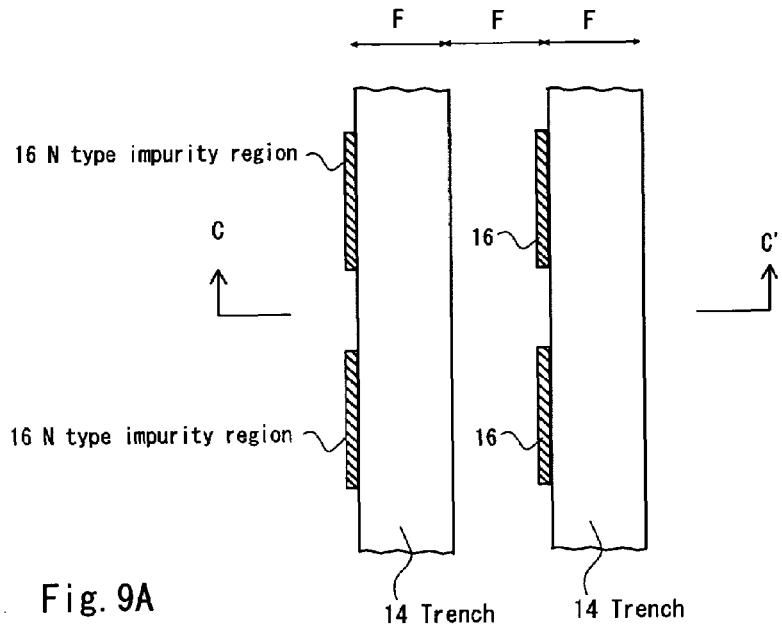
FIG. 9A is a diagram showing the manufacturing process of the bit line contact part in FIG. 2.
Figure 9B:
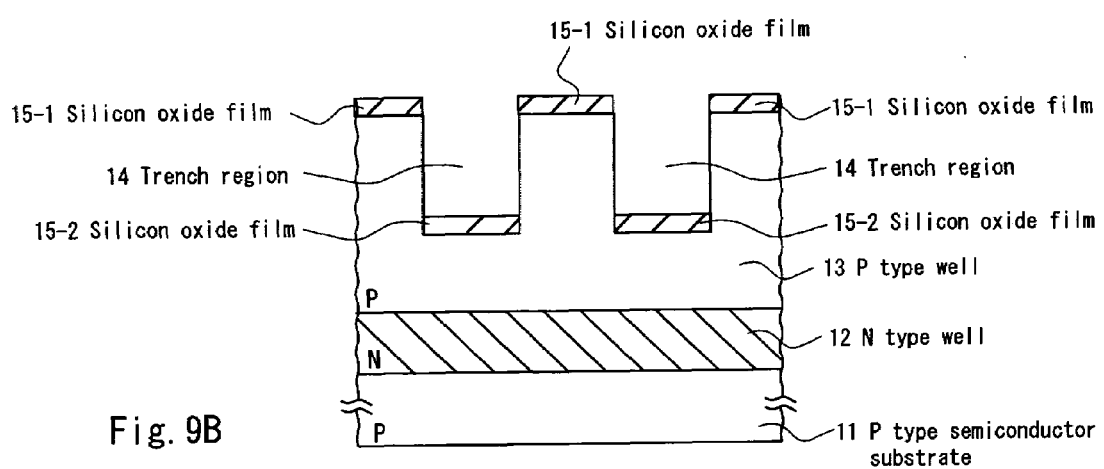
FIG. 9B is a diagram showing a cross section of the C–C' line.
Figure 10A:
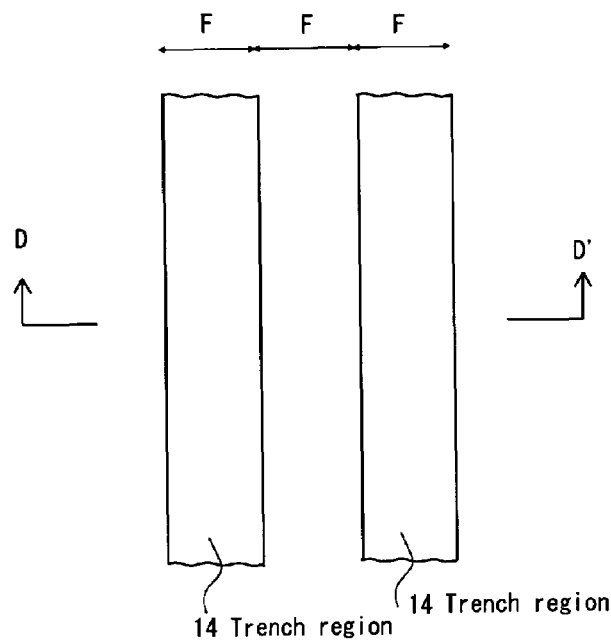
FIG. 10A is a diagram showing the manufacturing process of the source line contact part in FIG. 2 in plane view.
Figure 10B:
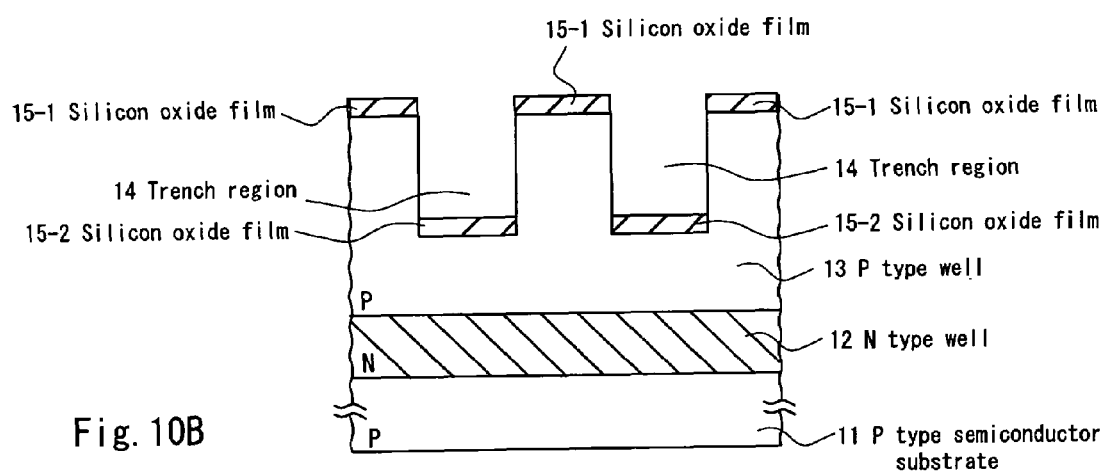
FIG. 10B is a diagram showing a cross section of the D–D' line.

Next, as shown in FIGS. 8 and 9, ion implantation of the phosphorus (P) and arsenic (As) is carried out selectively in the channel formation region of the selective gate transistors STr1 and STr4, and an N type impurity region 16 is formed. In this embodiment, the photo-resist is applied extensively before carrying out the ion implantation, and the photo-resist opening is formed in the gate region area of the selective gate transistors STr1 and STr4. Then, through this photo-resist opening, by performing the ion implantation aslant at the inclination of +7 degrees of perpendicular directions against the P type semiconductor substrate 11, the ion implantation can be selectively performed only on one side of the side wall of the trench region 14. Similarly, through the photo-resist opening, by performing the ion implantation aslant at the inclination of −7 of perpendicular direction against the semiconductor substrate 11, the ion implantation can be selectively performed to the other side of the side wall of the trench region 14. By forming the N type impurity region 16 as mentioned above, threshold voltage of the selective gate transistors STr1 and STr4 can be made negative, and depression mode can be realized. For information, this N type impurity region 16 may be formed by the ion implantation or thermal diffusion before forming the trench region.

Next, as shown in FIGS. 11 to 14, a silicon oxide film 17 is formed to cover the whole surface of the side wall of the trench region 14 by a thickness of 2.5 nm. Then, as shown in FIGS. 11 to 14, a silicon nitride film 18 is formed over the silicon oxide film 17 by a thickness of 5.5 nm. Next, as shown in FIGS. 11 to 14, a silicon oxide film 19 is formed over the silicon nitride film 18 by a thickness of 4.0 nm. These silicon oxide films 17, silicon nitride film 18 and silicon oxide film 19 can be formed with the CVD method or the thermal oxidation method, for example. Thus, the silicon oxide film 17, the silicon nitride film 18 and the silicon oxide film 19 are formed in order in the trench region 14 formed in the P type well.

Next, as shown in FIG. 15 to FIG. 18, a poly silicon 20 in which impurities are doped is extensively deposited by a thickness of 16 nm. This poly silicon 20 will be a control gate (CG) of the memory transistors MTr1 and MTr2. By doping the upper part of this poly silicon 20 or depositing the poly silicon doped with impurities, contact resistance with a metal layer connected electrically with the poly silicon 20 (a word line WL) can be made smaller.

Next, as shown in FIG. 19 to FIG. 22, the poly silicon 20 is patterned and dissociated to the direction of the bit line BL, and the control gate (CG) of the memory transistors MTr1 and MTr2 is formed. Here, the silicon oxide film 17, the silicon nitride film 18, the silicon oxide film 19 and the poly silicon 20 are removed except for the portion used as the control gate (CG) of the memory transistors MTr1 and MTr2. Specifically, on the upper part of the silicon oxide film 15-1 of the memory transistor region, the photo-resist having a slit in the bit line BL direction is formed, and RIE is performed using this photo-resist as a mask. By this, the control gate (CG) of the memory transistors MTr1 and MTr2 is formed.

Next, as shown in FIG. 19 to FIG. 22, the silicon oxide film 21 is formed extensively by a thickness of 2.5 nm. This silicon oxide film 21 is formed with the CVD method, for example. This silicon oxide film is formed to cover the side wall of the trench regions 14 other than a memory transistor region. In addition, this silicon oxide film 21 may be formed by a thermal oxidation method.

Next, as shown in FIG. 23 to FIG. 26, the poly silicon 22 in which impurities are doped is extensively deposited by a thickness of 35 nm. This poly silicon 22 becomes a gate electrode (GE) of the selective gate transistors STr1 to STr6. By doping impurities in the upper part of this poly silicon 22, or depositing the poly silicon in which impurities are doped, contact resistance with metal layer connected electrically with the poly silicon 22 (the selective gate line SSL1, SSL2 and GSL) later may be made smaller.

Next, as shown in FIG. 27 to FIG. 30, the poly silicon 22 is patterned and dissociated to the direction of the bit line BL, and the gate electrode (GE) of the selective gate transistors STr1 to STr6 is formed. Here, the poly silicon 22 and the silicon oxide film 21 are removed other than the portion used as the gate electrode (GE) of the selective gate transistors STr1 to STr6. Specifically, the photo-resist which has a slit in the bit line BL direction is formed on the upper portion of the silicon oxide film 15-1 of a selective gate transistor region, and RIE is performed using this photo-resist as a mask. By this process, the gate electrodes (GE) of the selective gate transistors STr1 to STr6 are formed. Instead of this poly silicon 22, metal, such as tungsten, may be deposited to form the gate electrodes (GE) of the selective gate transistors STr1 to STr6.

Next, as shown in FIG. 27 to FIG. 30, an interlayer insulation film 23 is embedded between the poly silicon 20s and between the poly silicon 22s by a thickness of 30 nm on the whole. Then, a metal layer is deposited, and the word lines WL0 to WL15 and the selective gate line SSL1, SSL2 and GSL are formed by patterning. The metal layer may be planarized by CMP (Chemical Mechanical Polishing) before this patterning. As the metal layer, tungsten silicide (WSi), aluminum (Al), copper (Cu) and others are used, and if it is not a metal, the poly silicon in which impurities are doped may be used. Specifically, when patterning the metal layer, the photo-resist which has a slit in the word line WL0 to WL15 direction is formed. This photo-resist is used as a mask and the metal layer is etched by RIE so that the word lines WL0 to WL15 and the selective gate line SSL1, SSL2 and GSL are formed. Further, using this photo-resist as a mask, the interlayer insulation film 23, the silicon oxide film 19, the silicon nitride film 18 and the silicon oxide film 17 are etched by RIE in order. By this, these layers are separated in the word line WL0 to WL15 direction, and as shown especially in FIG. 27, between the P type well 13 and the control gates (CG) made of the poly silicon 20, memory transistors MTr1 and MTr2 are formed, laminating the silicon oxide film 17, the silicon nitride film 18 and the silicon oxide film 19 in order. Moreover, as especially shown in FIG. 28, between the gate electrode (GE) formed of the N type impurity region 16 and the poly silicon 22, selective gate transistors STr1 to STr6 having the silicon oxide film 21 are formed.

Next, as shown in FIG. 31 to FIG. 34, a source/drain region 25 of the memory cell transistors MTr1 and MTr2 and the selective gate transistors STr1 to STr6 are formed in the side wall of the trench region 14 of the P type well 13. Specifically, the photo-resist is applied extensively, and a photo-resist opening is formed in the side wall of the memory transistors MTr1 and MTr2 and the selective gate transistors STr1 to STr6. Continuously, this photo-resist, the word lines WL0 to WL15 and the selective gate line SSL1, SSL2 and GSL are used as a mask, and by performing ion implantation aslant at the inclination to +7 degrees to perpendicular directions of the semiconductor substrate 11, the source/drain region 25 is formed at left side part of the trench region 14 in the figure. Next, by performing ion implantation aslant at the inclination of −7 degrees of perpendicular direction to the semiconductor substrate 11, the source/drain region 25 is formed at the right side part of the trench region 14 in the figure. In these processes, the N type impurities including, for example, arsenic (As) and phosphorus (P) are doped by the ion implantation.

Figure 33A:
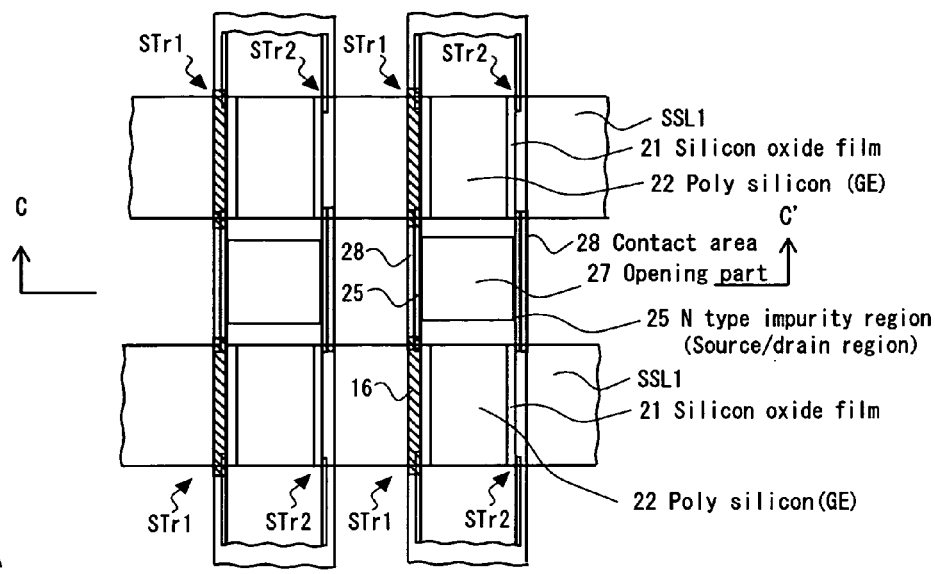
FIG. 33A is a diagram showing in plane view the manufacturing process of the bit line contact part in FIG. 2.
Figure 33B:
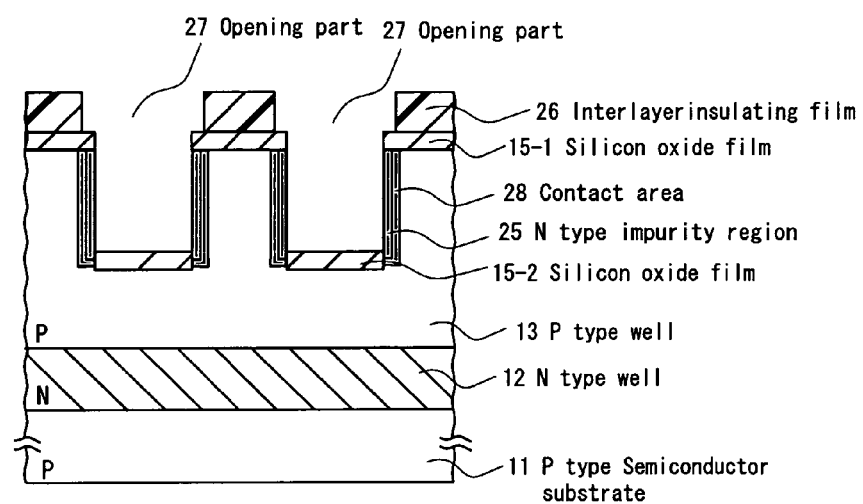
FIG. 33B is a diagram showing a cross section of the C–C' line.
Figure 34A:
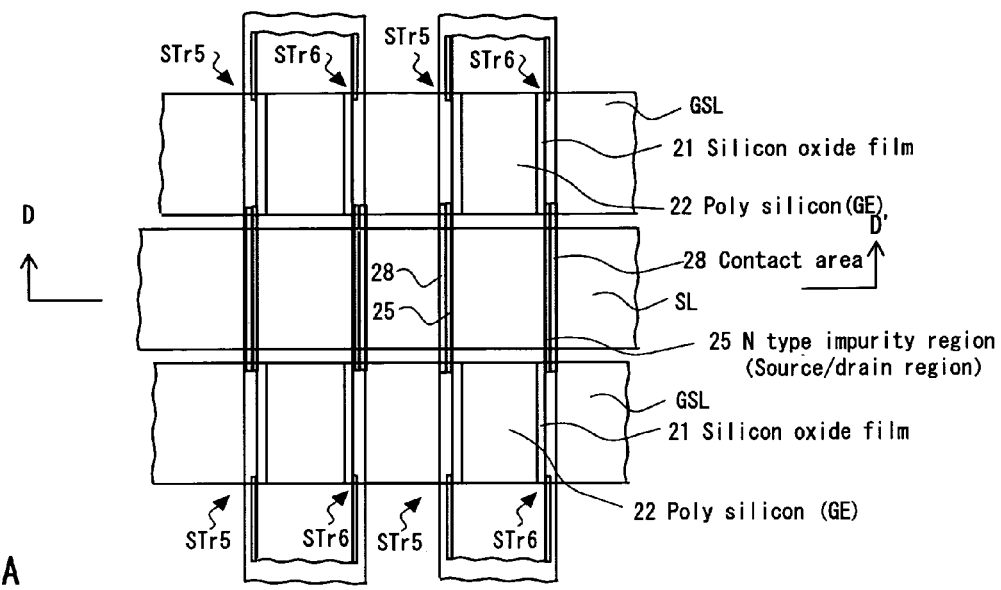
FIG. 34A is a diagram showing in plane view the manufacturing process of the source line contact part in FIG. 2.
Figure 34B:
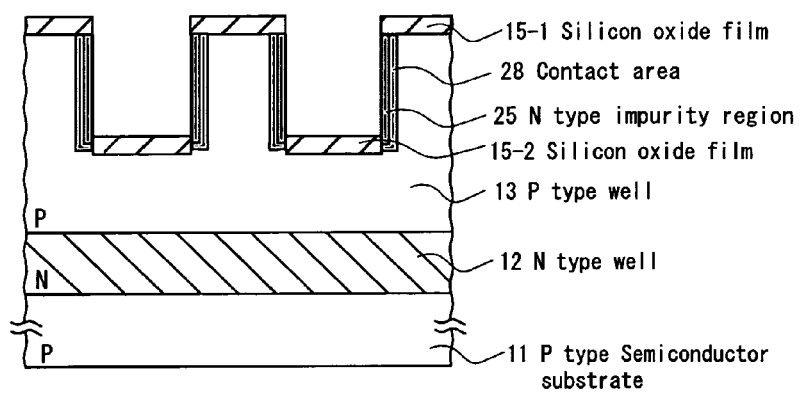
FIG. 34B is a diagram showing a cross section of the D–D' line.

Next, as shown in FIG. 31 to FIG. 34, after depositing an interlayer insulation film 26 by a thickness of 200 nm extensively, an opening 27 is formed in the interlayer insulation film 26 in the contact region of the bit line BL and the source line SL. As shown in FIG. 33 and FIG. 34, in order to make the contact region 28 of the bit line BL and the common source line SL low-resistance, through the opening 27, the N type impurities of arsenic (As) and phosphorus (P) are re-diffused in the both sides of wall part of the trench region 14.

Next, FIG. 3 to FIG. 6 are referred. By depositing and etching the metal layer by a thickness of 80 nm (for example, Cu), the metal layer is embedded in the shape of a plug at the opening 27 formed in the contact region area of the bit line BL and the source line SL, and a metal layer 29 shown in FIG. 5 is formed, and a common source line SL shown in FIG. 6 is formed by this same metal layer. As this metal layer, tungsten (W) may be used, for example. Then, an interlayer insulation film 30 is deposited extensively, and an opening 31 is formed in this interlayer insulating film 30. This opening 31 is formed on the contact region 28 of the bit line, and the contact region of the source line (not shown).

Next, a bit line BL and a source line SL (not shown) is formed by forming and patterning a metal layer over this interlayer insulation film 30. The source line, although not illustrated, is formed in every plural column, for example, every 64 columns and parallel to the bit line BL. Finally, the nonvolatile semiconductor memory device can be obtained by covering a protective film 33 extensively.

Next, regarding the operation of the nonvolatile semiconductor memory device concerning this embodiment, we will explain it by dividing into erasing operation, read-out operation and write-in operation. Since in the nonvolatile semiconductor memory device of this embodiment, one bit line BL are used in common in two NAND type memory cell units ND1 and ND2, it is necessary to choose either of NAND type memory cell unit ND1 or ND2 by using the selective gate transistors STr1 to STr4 at the time of reading and writing.

(Erasing Operation)

Since the nonvolatile semiconductor memory device of this embodiment has a NAND type memory cell array, erasing operation is performed per block. One block is constituted of the memory cell transistors MTr1 and MTr2 which the word lines WL0 to WL15 are connected in common. That is, erasing operation is carried out all together to the memory cell transistors MTr1 and MTr2 of a plurality of NAND type memory cell units within one block.

In erasing operation, as shown in FIG. 35, the word lines WL0 to WL15 of a selected block are made into grounding potential. At this time, the word lines WL0 to WL15 of a non-selected block are made into a floating state. Next, the erasing pulse of 21V, 3 ms is impressed to the P type well 13 (bulk). As a result, in the selected block, erasing voltage 21V is impressed between bulk and the word lines WL0 to WL15, and the electron stored in the silicon nitride film 18 of the memory transistors MTr1 and MTr2 pass through the P type well 13 side by Fowler-Nordheim (FN) tunnel current. For this reason, the threshold voltage of the memory cell transistors MTr1 and MTr2 become about −3V.

Since excessive erasing does not pose a problem in a NAND type nonvolatile semiconductor memory device, the memory cell transistors MTr1 and MTr2 are erased deeply by about −3V by erasing pulse one time. On the other hand, the non-selected block is not influenced by this erasing pulse by capacity coupling of the word lines WL0 to WL15 in the floating state and the P type well 13 to which the erasing voltage of 21V is impressed. Although there are various junction capacities and wiring capacity in the word lines WL0 to WL15 in the floating state, the capacity between the word lines WL0 to WL15 and the P type well 13 is dominantly large against the whole capacity. For this reason, it can prevent FN tunnel current from flowing into a non-selected block. In erasing verification, the threshold voltage of all the memory cell transistors MTr1 and MTr2 in the selected block is determined whether it becomes less than −1V.

(Read-Out Operation)

Read-out operation is carried out by page unit. 1 page means the range connected to one word line WL0 to WL15 in one block. For this reason, in read-out operation, the cell data of the memory transistor chosen among the memory cell transistors MTr1 and MTr2 of 1-page unit is simultaneously transmitted to the latch circuitry of a page buffer, and is read continuously.

For information, operation of EPROM which the selective gate transistors STr1 to STr4 are provided in the bit line BL side is mentioned in "A High Density EPROM Cell and Array", R Stewart et al., in Symp. of VLSI Circuits Dig. Tech. Papers, pp. 89–90 and June 1987.

Here, we explain an example which chooses the NAND type memory cell unit ND1 side. The bit line BL is set to 0V first, and the selective gate line SSL1 is set to 0V, and the selective gate line SSL2 is set to 4.5V, and the selective gate line GSL is set to 4.5V. Thereby, the selective gate transistor STr3 in FIG. 1 becomes an ON state and the selective gate transistor STr2 becomes an OFF state. For this reason, the NAND type memory cell unit of ND1 side is selected while the NAND type memory cell unit of ND2 side is not selected. On the other hand, when selecting the NAND type memory cell unit of ND2 side, the selective gate line SSL1 may set to 4.5V, the selective gate line SSL2 may set to 0V.

Next, WLi which is the selected word line in the selected block is set to 0V, and the non-selected word lines WL0 to WL15 (except for WLi) are set to 4.5V which is path voltage. Threshold voltage after writing the memory cell transistor MTr1 (MTr2) in this embodiment (after electric charge accumulation) is about +2V, and thereby the non-selected memory cell transistor MTr1 of NAND type memory cell unit ND1 works as a path transistor. On the other hand, the memory cell transistor MTr1 selected by impressing 0V flows only when after erasing (electric charge is not accumulated), and it does not flow after writing (after electric charge is accumulated). For this reason, in case of after erasing (electric charge is not accumulated), the bit line BL forms the path grounded to the common source line SL via the selected memory cell transistor MTr1. On the other hand, in case of after writing (after electric charge accumulation), the bit line BL does not ground, and a path in an open state is formed.

In this embodiment, the state after erasing in the memory cell transistor MTr1 (MTr2) (electric charge is not accumulated) is set as "1", and a state after writing (after electric charge accumulation) is set as "0". However, the relation between this "1" and "0" can be switched.

Then, load current of 2 μA is impressed to the bit line BL. As for the bit line BL which the NAND type memory cell unit ND1 after erasing (electric charge is not accumulated) is read, since load current flows down to the common source line SL, the electrical potential of this bit line BL becomes as low level as about 0.7V. On the other hand, as for the bit line BL which the NAND type memory cell unit ND1 after writing (after electric charge accumulation) is read, since load current does not flow down to the common source line SL, the electrical potential of this bit line BL becomes as high level as about 1.8V. The potential of this bit line BL is sensed and held in a latch circuit. Although the example of read-out operation at the time of selecting the NAND type memory cell unit of ND1 side is explained here, the same applies to the read-out operation at the time of choosing the NAND type memory cell unit of ND2 side.

(Write-In Operation)

In write-in operation, at first, writing data is loaded in a page buffer continuously. "0" is cell data performing write in, and it means that the memory cell transistors MTr1 and MTr2 accumulate an electric charge. "1" is cell data to prohibit write-in, and it means that the memory cell transistors MTr1 and MTr2 do not accumulate an electric charge. Write-in operation is repeated until the cell data of all the "0" are written in.

Figure 36:
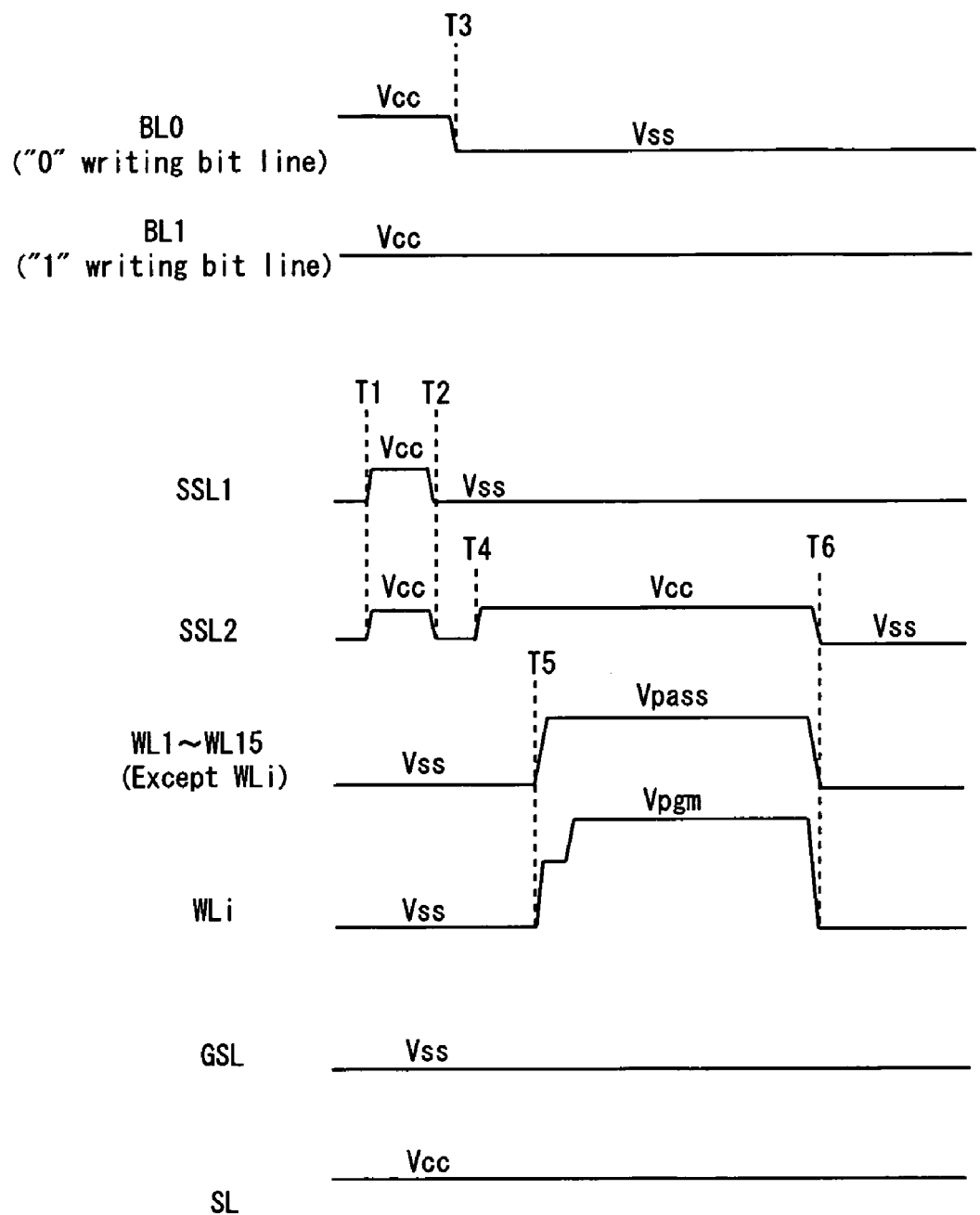
FIG. 36 is a timing chart which shows the voltage relation of the actual write-in period in write-in operation of the nonvolatile semiconductor memory device concerning the embodiment of this invention.

This write-in operation is largely classified into a write-in period and a verification period. First, operation of the write-in period is explained based on FIG. 36. FIG. 36 is a timing chart which shows the voltage relation of each signal wire in the write-in period of this write-in operation.

Here, we explain an example which the NAND type memory cell unit ND1 is chosen. As shown in FIG. 36, first, at time T1, the selected gate lines SSL1 and SSL2 are set to Vcc (=3.5V), and the bit line BL0 which writes in "0" and the bit line BL1 which writes in "1" are set to Vcc (=3.5V). Thereby, the selective gate transistors STr1 to STr4 becomes the ON state, and the channel region of all the NAND type memory cell units ND1 and ND2 is charged at reserve voltage.

Next, at time T2, the selected gate lines SSL1 and SSL2 are set to Vss (=0V), and the selective gate transistors STr2 and STr3 are set to an OFF state. Then, at time T3, the bit line BL0 which performs "0" write-in is set to Vss (=0V). Next, the selective gate line SSL2 is set to Vcc (=3.5V) at time T4. Thereby, the selective gate transistor STr3 becomes an ON state, and because the selective gate transistor ST1 is a depression type, only NAND type memory cell unit ND1 is chosen.

Next, the selective word line WLi is set to Vpgm (=18V) at time T5, and the non-selected word lines WL0 to WL15 (except for WLi) are set to Vpass (=10V). Thereby, the channel formation region of the memory cell transistor MTr1 which should write in "0" is grounded on the voltage of the bit line BL0 (Vss), and an electric charge is accumulated in the memory cell transistor MTr1. On the other hand, the channel formation region of the memory cell transistor MTr1 which should write in "1" becomes floating high by the voltage (Vcc) of bit line BL1, and an electric charge is not accumulated in the memory cell transistor MTr1. That is, an erasing state is maintained. The channel formation region of the memory cell transistor MTr2 of the non-selected NAND type memory cell unit ND2 also becomes a floating high, and the existing state is maintained.

The state of this time T5 is continued till time T6. And at this time T6, the selective gate line SSL2 becomes Vss (=0V), and the word lines WL0 to WL15 are set to Vss (=V).

Among the operation mentioned above, time T1 to time T3 are (1) bit line setup time, and it is about 8 μsec. In addition, time T4 to time T6 are (2) actual write-in time, and it is about 20 μsec.

Next, the verification period after writing is explained. This write-in verification period is constituted of word line electric discharge time and actual verification time. The word line electric discharge time is the time for discharging the high potential of the selected word line WLi and preparing for the input of the following low verification potential, and it is about 4 μsec. The actual verification time is the time to check whether the threshold voltage of the memory cell transistor MTr1 or MTr2 which carried out writing is written more than the desired value, or in other words, whether the electric charge is accumulated in the silicon nitride film 18.

In the verification period after this writing, as for the memory cell transistor MTr1 or MTr2 which writing is fully performed, i.e., the memory cell transistor MTr1 or MTr2 which the electric charge is accumulated in the silicon nitride film 18, it is necessary to prevent excessive writing. For this reason, regarding the memory cell transistor MTr1 or MTr2 which writing is fully performed, the data which the latch circuitry of the cell data in a page buffer holds is changed into "1" from "0." Thereby, in case that the memory cell transistor MTr1 or MTr2 which writing is not fully done performs writing again, the threshold voltage of the memory cell transistor MTr1 or MTr2 which is already sufficient value is prevented from going up further.

Although the bias conditions at the time of verification operation is almost equivalent to read-out operation mentioned above, differences lays in that the cell data is held in the latch circuitry of a page buffer and 0.7V is impressed to the selected word line WLi. Under these conditions, when threshold voltage of the written-in memory cell transistor MTr1 or MTr2 exceeds 0.7V, that is, when fully written in, the data of the latch circuitry of a page buffer is changed to "1" from "0." Regarding the latch circuitry where "1" is loaded as cell data for writing, since only the data of latch circuitry changes to "1" from "0" in verification operation, it is not influenced.

As for the write-in operation which is consisted of the write-in period mentioned above and the verification period, it is repeated until all the data of the latch circuitry of a page buffer becomes "1", or until it reaches at the maximum write-in time of 10 cycles.

Figure 37:
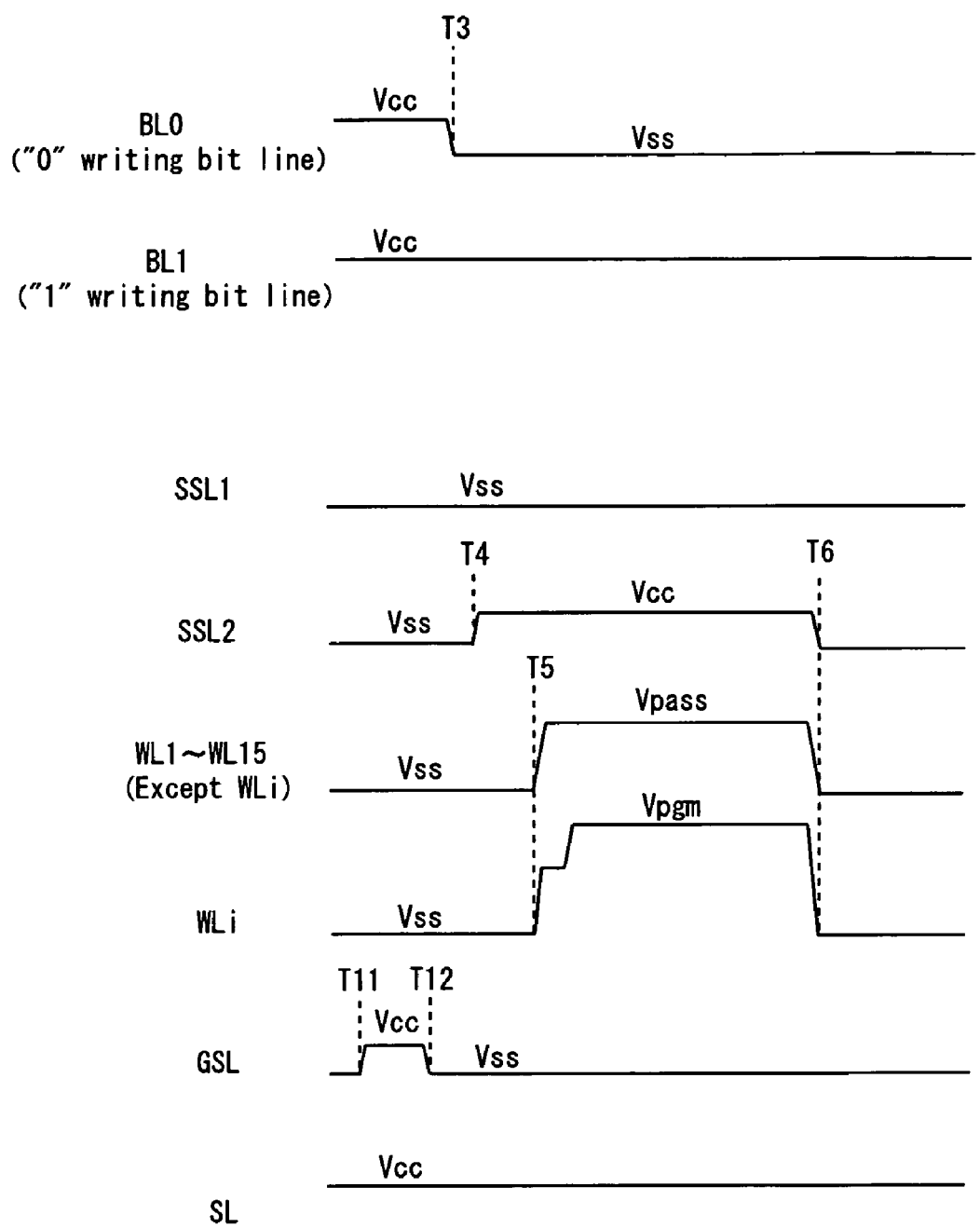
FIG. 37 is a timing chart which shows the voltage relation of the actual write-in period in write-in operation of the nonvolatile semiconductor memory device concerning the embodiment of this invention.

Although in write-in operation of FIG. 36 mentioned above, reserve voltage is charged from the bit line BL side in to the channel formation region of the NAND type memory cell unit ND1 or ND2, as shown in FIG. 37, reserve voltage may be charged from the common source line of SL side. In this case, during time T11 to T12, the selected gate line GSL becomes Vcc (=3.5V), and the selected gate transistors STr5 and STr6 becomes an ON state respectively. Since the selected gate lines SSL1 and SSL2 maintain Vss (=0V) in the meantime, the selective gate transistors STr1 to STr4 become an OFF state. For this reason, reserve voltage is supplied and charged from the common source line SL to the channel formation region of the memory cell transistor MTr1 or MTr2.

Next, the bias conditions of the write-prohibited voltage supplied to the channel of the selected cell in write-in operation are explained. As mentioned above, suppose that the NAND type memory cell unit ND1 in FIG. 1 is selected, the selective gate transistors STr1 and STr3 by the side of bit line BL become switch-on state while the selective gate transistor STr5 by the side of the source line SL becomes switch-off state, and the bit line BL0 having the memory cell transistor MTr1 which writes in data becomes 0V, and the bit line BL1 having the memory cell transistor MTr1 which writing of data is prohibited becomes Vcc (=3.5V).

Since the bit line BL0 having the memory cell transistor MTr1 which writes in data becomes 0V, the channel of the NAND type memory cell unit ND1 becomes ground potential. Since the bit line BL1 having the memory cell transistor MTr1 which writing of data is prohibited becomes Vcc (=3.5V), the channel of the NAND type memory cell unit ND1 is charged in reserve. When writes-in voltage Vpgm is inputted to the selected word line WLi and path voltage Vpass (=10V) is inputted into the non-selected word lines WL0 to WL15 (except for WLi), by the word lines WL0 to WL15, the silicon oxide film/silicon nitride film/silicon oxide film, the channel, the P type well and combination of the in-series capacity through each of them, the channel capacity is increased automatically. Thus, the channel potential of write-protected NAND type memory cell unit ND1 in the selected block is determined by the capacity coupling of the word line and the channel. Therefore, in order to make write-prohibited potential high enough, it becomes important to fully perform initial charge of the channel and to enlarge the capacity coupling ratio between the channels of the word lines WL0 to WL15.

Coupling ratio B between the word lines WL0 to WL15 is computed as follows.

$$B = Cox/(Cox+Cj)$$

Here, Cox is the total of the gate capacity between the word lines WL0 to WL15 and the channel, and Cj is the total of junction capacity of source and drain of the memory cell transistor MTr1. The channel capacity of the NAND type memory cell unit ND1 is the sum total of total of these gate capacities Cox and total of junction capacity Cj. Furthermore, since other capacities such as the overlap capacity of the source in the selective gate transistor STr1, STr3 and STr5, or capacity of the bit line BL, the source line SL and drain, and others are very small compared with total channel capacity, they are ignored here.

As explained above, according to the nonvolatile semiconductor memory device of this embodiment, two memory transistors and the selective gate transistor are formed in the trench region formed in the semiconductor substrate in three dimensions, and the NAND type memory cell units ND1 and ND2 can be formed in one bit line pitch 2F, and minimization of the size of the nonvolatile semiconductor memory device can be realized. According to the nonvolatile semiconductor memory device of this embodiment, since it does not have a floating gate like the conventional nonvolatile semiconductor memory device, not only that minimization of the size of the nonvolatile semiconductor memory device can be realized, but also that an aspect ratio of the control gate (CG) can be made small without being influenced by coupling between the floating gates, which has been problems conventionally. In addition, the nonvolatile semiconductor memory device of this embodiment is applicable to the conventional CMOS process, and a highly efficient nonvolatile memory can be realized by a simpler process than the process required in the conventional nonvolatile semiconductor memory device. Since the memory transistor do not have the floating gate in the nonvolatile semiconductor memories of this embodiment, "Stress-Induced Leakage Current" (SILC) which is the main cause of degrading the nonvolatile semiconductor memory cell can be restrained, and Drain-Turn-On can be also controlled.

Embodiment 1

In this embodiment, another example of the nonvolatile semiconductor memory device of the present invention is explained. In the nonvolatile semiconductor memory device of this embodiment, the transistor having SONOS structure is adopted not only in a memory transistor but also in a selective gate transistor. The same numerals are attached to the same constituent factor of the nonvolatile semiconductor memory device of this invention explained in the above-mentioned embodiment, and there are cases that their explanation is omitted.

Figure 38:
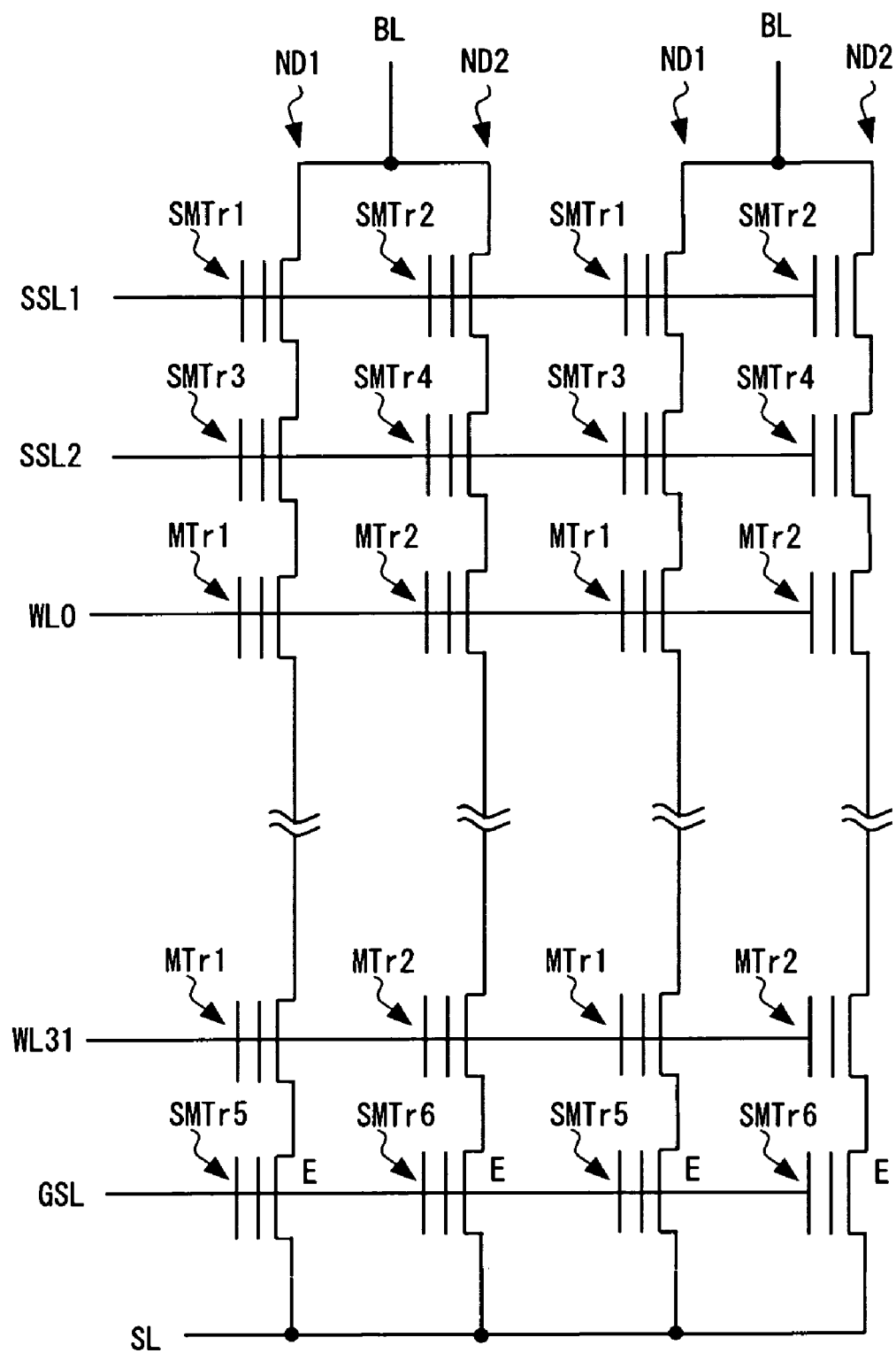
FIG. 38 is a diagram showing the equivalent circuit of the nonvolatile semiconductor memory device concerning one embodiment of this invention.

FIG. 38 is referred to. The equivalent circuit of the nonvolatile semiconductor memory device concerning this embodiment is shown in FIG. 38. Based on FIG. 38, the connection relation of the memory cell array of the nonvolatile semiconductor memory device concerning this embodiment is explained as follows.

As shown in FIG. 38, in the nonvolatile semiconductor memory device concerning this embodiment, two NAND type memory cell units ND1 and ND2 are formed on one bit line BL. The NAND type memory cell unit ND1 is constituted by connecting in in-series the selective gate memory transistors SMTr1 and SMTr3, 32 units of the memory cell transistor MTr1 and the selective gate memory transistor SMTr5. As the same as the above, the NAND type memory cell unit ND2 is constituted by connecting in-series the selective gate memory transistors STr2 and STr4, 32 units of the memory cell transistors MTr1 and the selective gate memory transistor SMTr6. Among the selective gate memory transistors, N type impurities are doped into the channel formation region of the selective gate memory transistor SMTr1 connected to the NAND type memory cell unit ND1.

Thus, in the nonvolatile semiconductor memory device concerning this embodiment, not only the memory cell transistors but also the selective gate transistors are constituted of the memory transistors. In this embodiment, the number of the memory cell transistors MTr1 which constitute the memory cell transistor unit ND1 and the number of the memory cell transistors MTr2 which constitute NAND type memory cell unit ND2 are set as 32 units, respectively, however, it is also good to set as 16 units or 64 units and so on, and it is not limited to them.

The drain side of the selective gate memory transistors SMTr1 and SMTr2 is connected to the bit line BL in common. The source sides of the selective gate memory transistors SMTr5 and SMTr6 are connected to the common source line SL.

The gate electrode of the selective gate memory transistors SMTr1 and SMTr2 of every NAND type memory cell unit ND1 and ND2 is connected in common, and connected with the selective gate line SSL1. The gate electrodes of the selective gate memory transistors SMTr3 and SMTr4 of every NAND type memory cell unit ND1 and ND2 are connected in common, and connected with the selective gate line SSL2. The control gates (CG) of the memory cell transistors MTr1 and MTr2 in every NAND type memory cell unit ND1 and ND2 are connected in common, respectively, and it connects with a corresponding word lines WL0 to WL31, respectively. The gate electrodes of the selective gate memory transistors SMTr5 and SMTr6 of each NAND type memory cell unit ND1 and ND2 are connected in common, and connected to the selective gate line GSL.

The switch part at bit line side in this embodiment is constituted of the selective gate memory transistor SMTr1, SMTr2, SMTr3 and SMTr4, and one of the NAND type memory cell units of one set of two-piece of the NAND type memory cell ND1 and ND2 is chosen by this switch part at bit line side. In addition, the switch part at source line side in this embodiment is constituted by the selective gate memory transistors SMTr5 and SMTr6.

In the nonvolatile semiconductor memory device of this embodiment, the NAND type memory cell units ND1 and ND2 as shown in FIG. 38 are arranged in plural in the shape of arrays to constitute one memory cell array.

Next, based on FIGS. 39 to FIG. 43, the structure of the NAND type memory cell array of the nonvolatile semiconductor memory device concerning this embodiment is explained.

Figure 39:
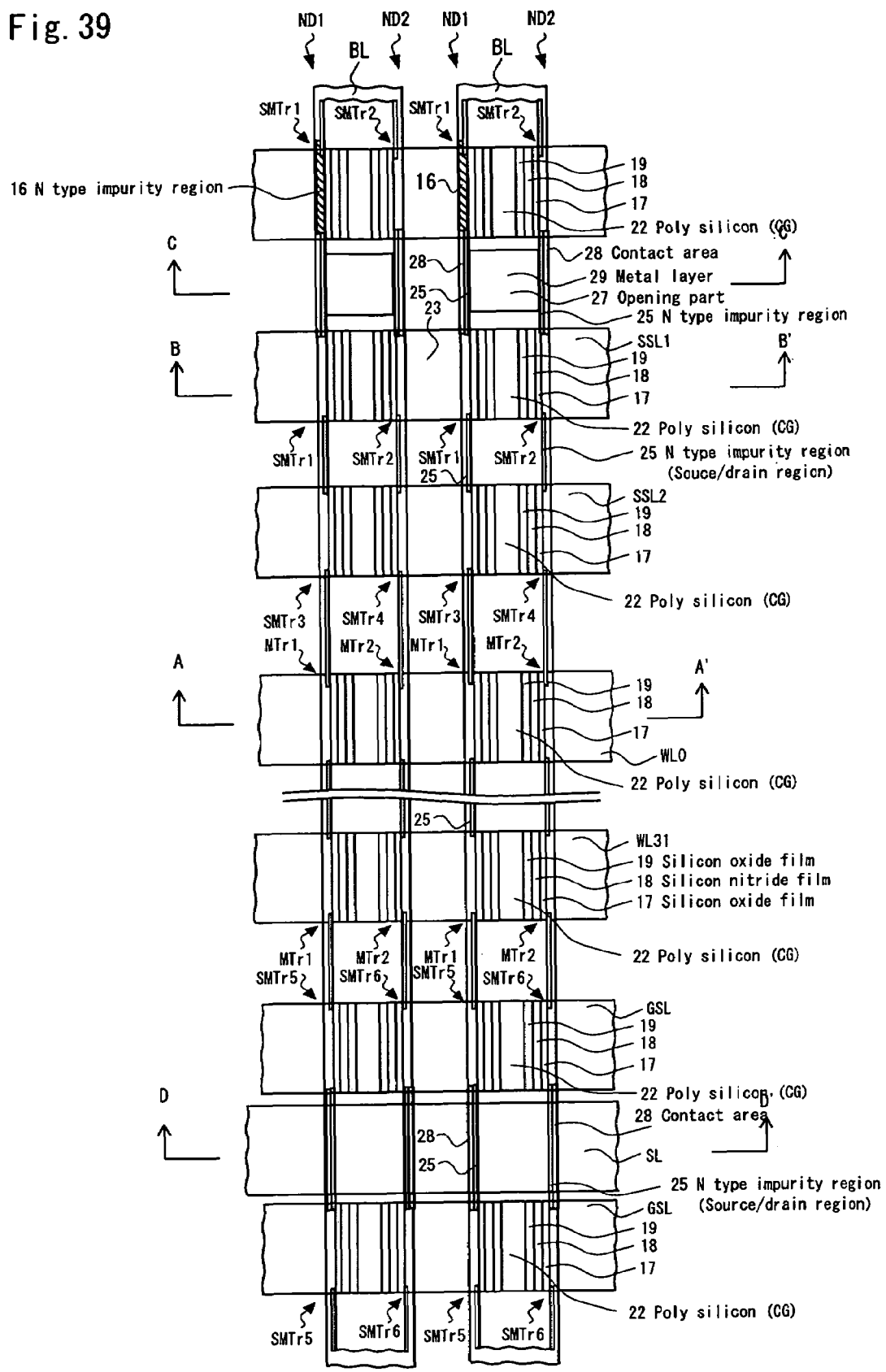
FIG. 39 is a diagram showing in plane view the structure of the memory cell unit of the nonvolatile semiconductor memory device concerning one embodiment of this invention.
Figure 40A:
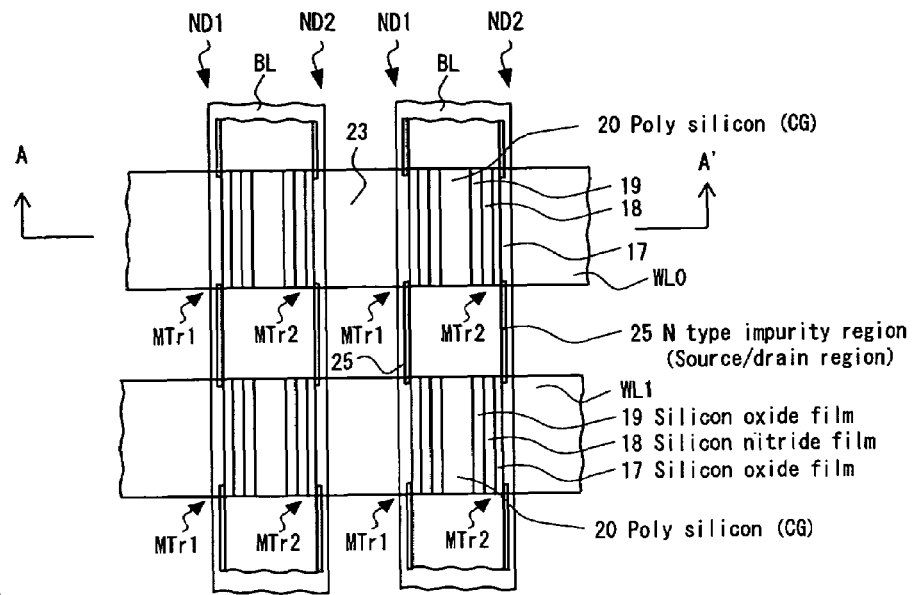
FIG. 40A is a diagram showing in plane view the structure of the memory cell transistor portion in FIG. 39.
Figure 40B:
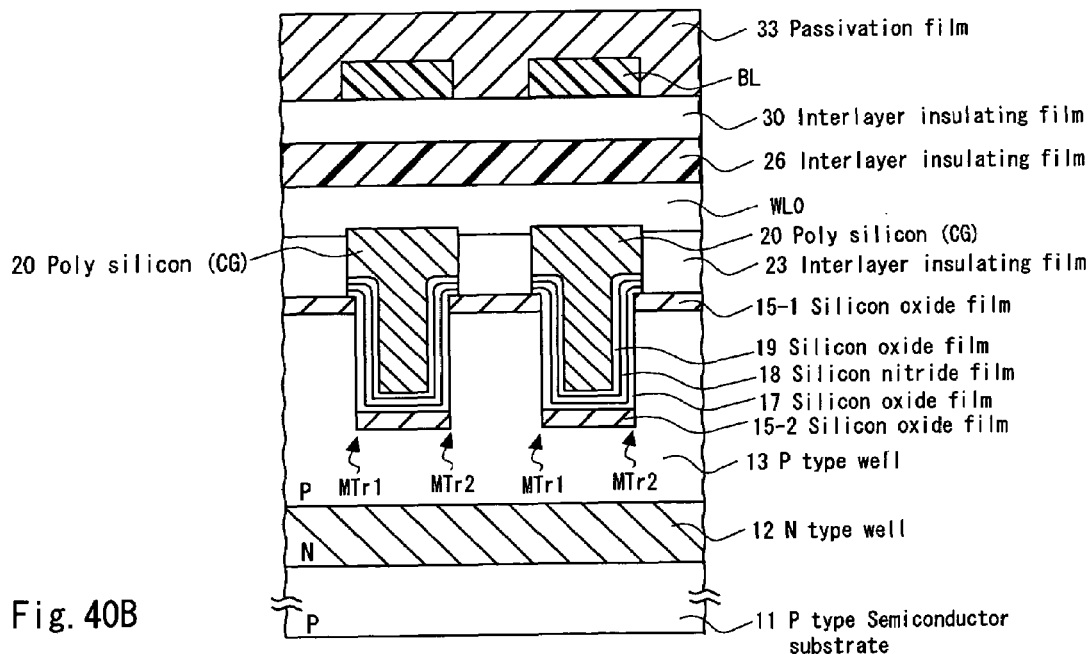
FIG. 40B is a diagram showing a cross section of the A–A' line.
Figure 41A:
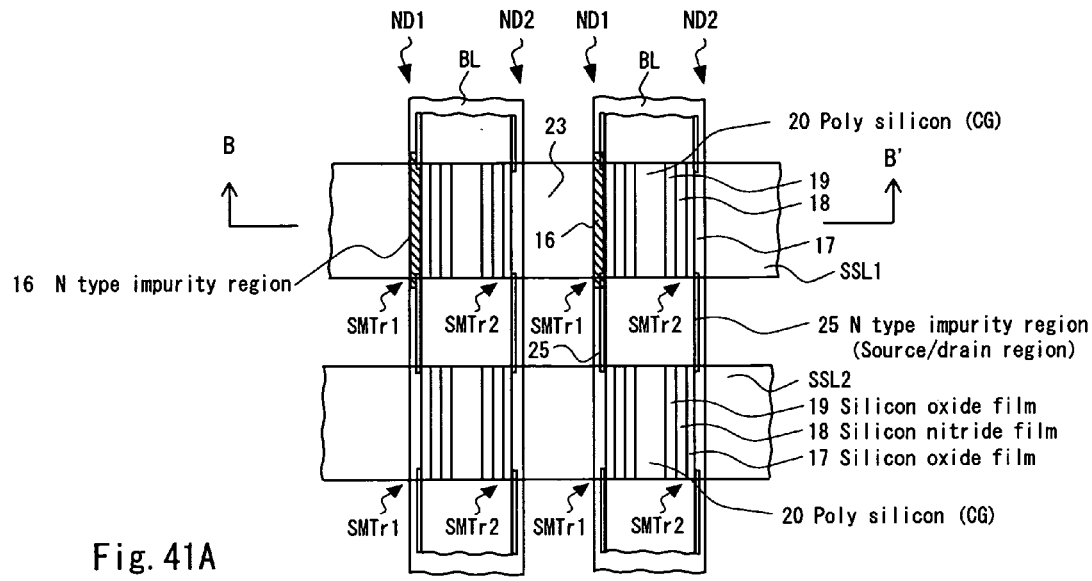
FIG. 41A is a diagram showing in plane view the structure of the selective gate transistor portion in FIG. 39.
Figure 41B:
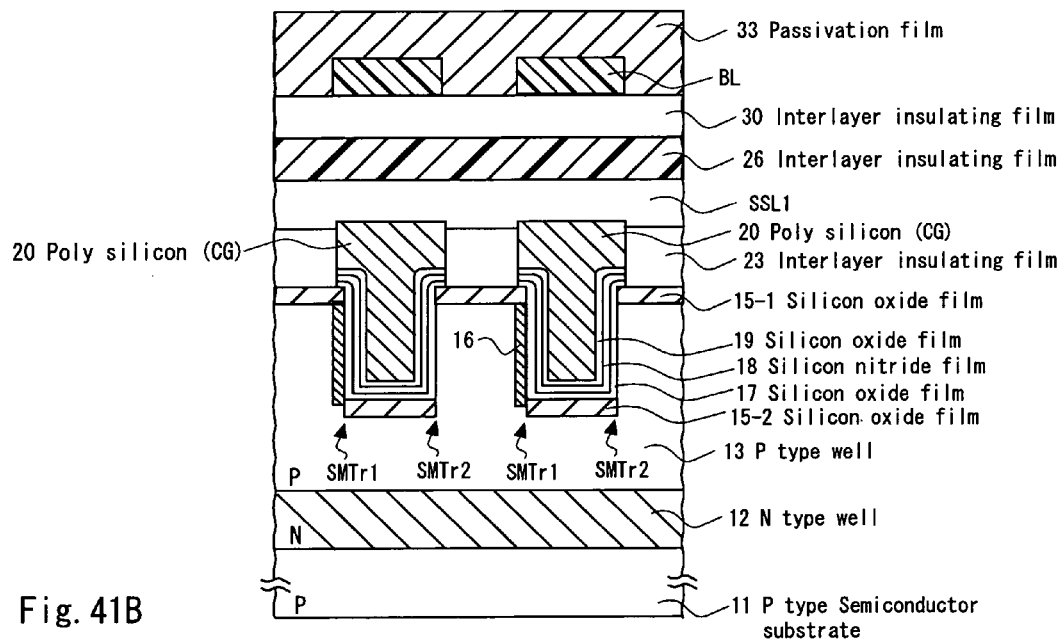
FIG. 41B is a diagram showing a cross section of the B–B' line.
Figure 42A:
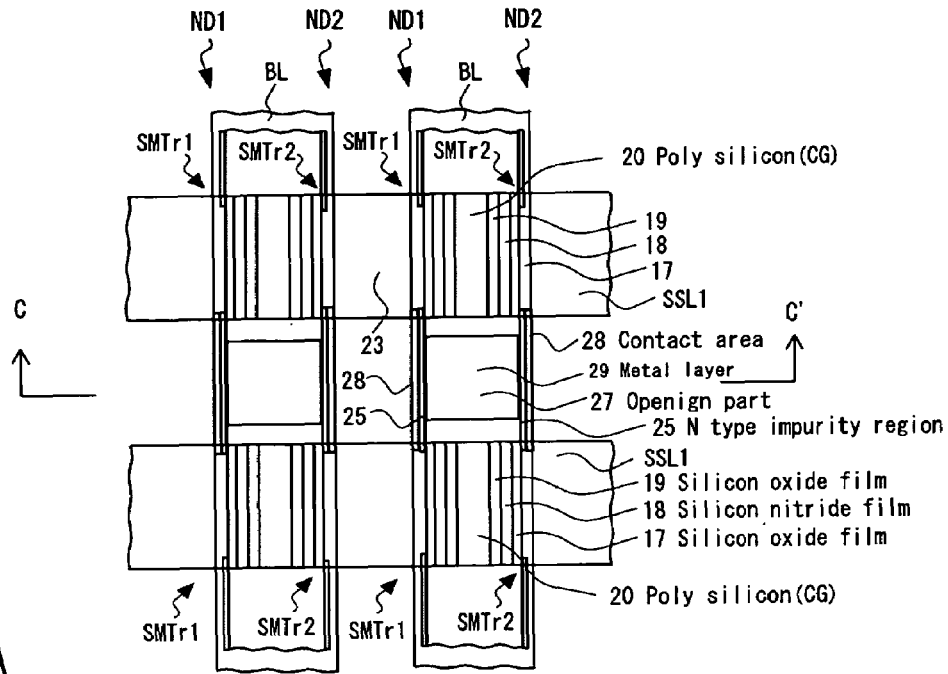
FIG. 42A is a diagram showing in plane view the structure of the bit line contact part in FIG. 39.
Figure 42B:
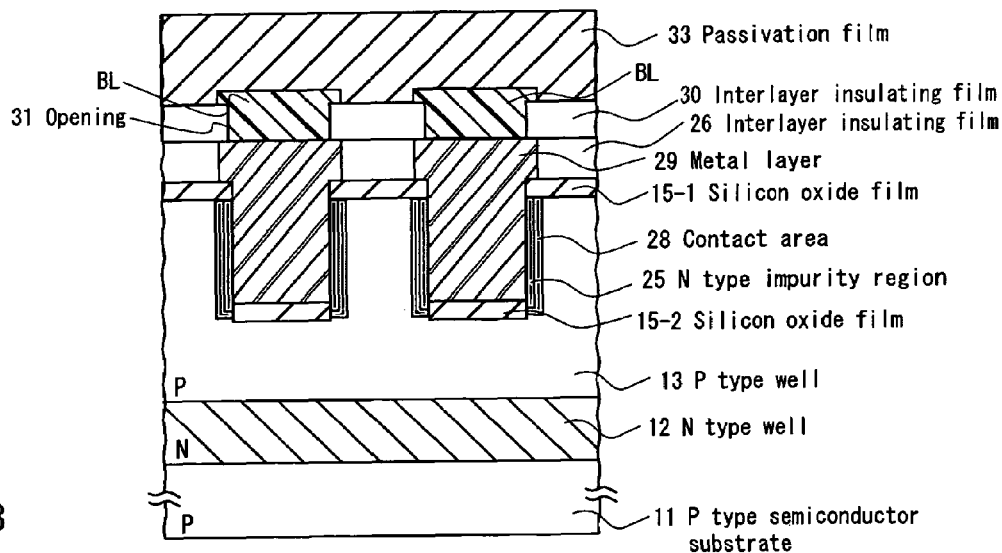
FIG. 42B is a diagram showing a cross section of the C–C' line.
Figure 43A:
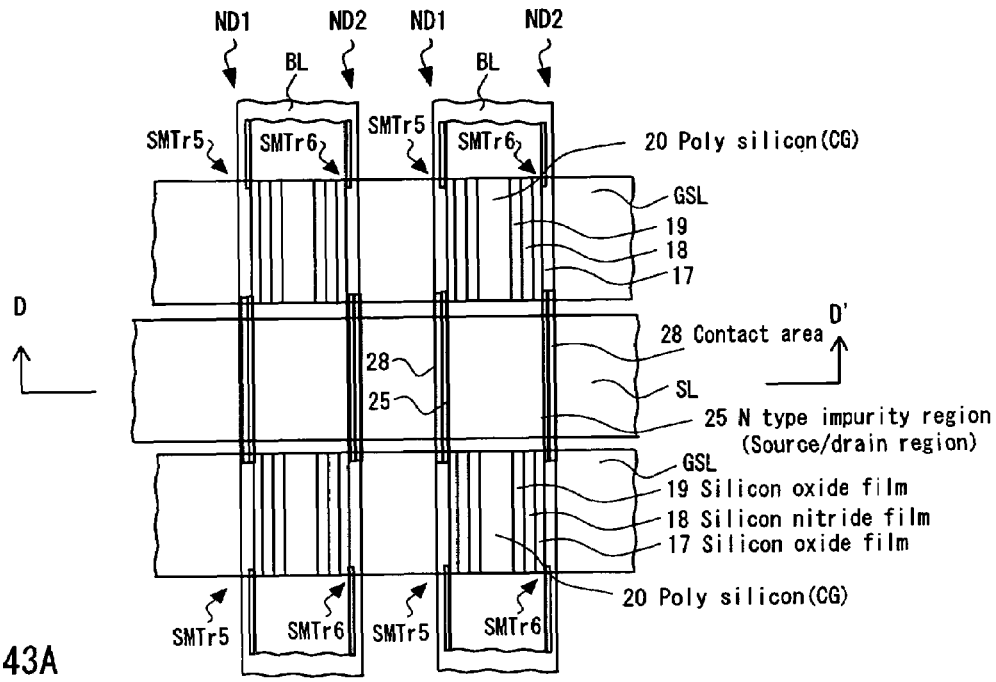
FIG. 43A is a diagram showing in plane view the structure of the source line contact part in FIG. 39.
Figure 43B:
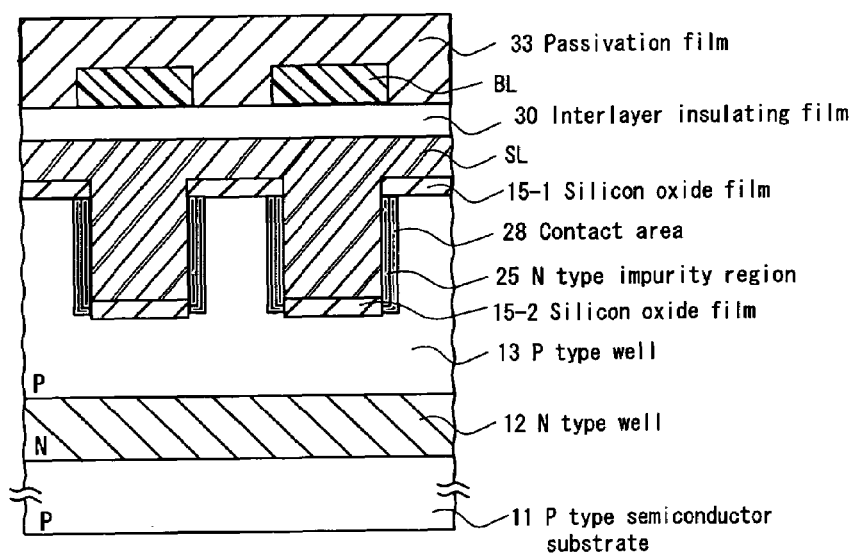
FIG. 43B is a diagram showing a cross section of the D–D' line.

FIG. 39 is a diagram which expressed typically the upper surface of the NAND type memory cell array concerning this embodiment. Like FIG. 2, in FIG. 39, for convenience of explanation, a part of the opaque constituent factor is made transparent to be shown in order to explain a lower constituent factor. FIG. 40A is a diagram showing typically the upper surface of the word line portion in FIG. 39, and FIG. 40B is a sectional view of the A–A' line. FIG. 41A is a diagram showing typically the upper surface of the selective word line portion in FIG. 39, and FIG. 41B is a sectional view of the B–B' line. FIG. 42A is a diagram showing typically the upper surface of the bit line contact part in FIG. 39, and FIG. 42B is a sectional view of the C–C' line. FIG. 43A is a diagram showing typically the upper surface of the common source line SL contact portion in FIG. 39, and FIG. 43B is a sectional view of the D–D' line.

As shown in FIG. 39 to FIG. 43, the NAND type memory cell units ND1 and ND2 are formed in the both sides of the side wall of one trench region 14, respectively. As shown especially in FIG. 39, FIG. 40 and FIG. 41, the memory cell transistor MTr1 of this NAND type memory cell unit ND1 and the memory cell transistor MTr2 of the NAND type memory cell unit ND2 are formed in the form which faces each other in one trench region 14. The selective gate memory transistor SMTr1 of the NAND type memory cell unit ND1 and the selective gate memory transistor SMTr2 of the NAND type memory cell unit ND2 are formed in the form which faces each other in one trench region 14. The selective gate memory transistor SMTr3 of the NAND type memory cell unit ND1 and the selective gate memory transistor SMTr4 of the NAND type memory cell unit ND2 are formed in the form which faces each other in one trench region 14. The selective gate memory transistor SMTr5 of the NAND type memory cell unit ND1 and the selective gate memory transistor SMTr6 of the NAND type memory cell unit ND2 are formed in the form which faces each other in one trench region 14. N type impurities are doped into the channel formation region of the selective gate memory transistor SMTr1 connected to the NAND type memory cell unit ND1 among the selective gate memory transistors, and N type impurity region 16 is formed. As same as the manufacture of the nonvolatile semiconductor memory device of the above-mentioned preferred embodiment, this N type impurity region 16 can be formed by carrying out the slanting ion implantation of the impurities after forming the trench region 14, or it may be formed by ion implantation or thermal diffusion before forming the trench region 14.

The memory cell transistors MTr1 and MTr2 facing each other and the selective gate memory transistors SMTr1 to SMTr6 have the silicon oxide film 17 formed in the side wall of the trench region 14 formed in the P type well 13, the silicon nitride film 18 and the silicon oxide film 19 respectively. The memory cell transistors MTr1 and MTr2, the gate memory transistors SMTr1 and SMTr2, the gate memory transistors SMTr3 and SMTr4, and the gate memory transistors SMTr5 and SMTr6 have one common control gate (CG), respectively. In this embodiment, a control gate (CG) is formed with the poly silicon 20. In the nonvolatile semiconductor memory device of this embodiment, even if high resistance material like poly silicon is used for the control gate (CG) 20, it does not cause any problem if the low resistance material of a metal including aluminum (Al), copper (Cu), tungsten silicide (WSi) is used for the word line WL, the selective gate line SSL1, SSL2 and GSL linked to the control gate (CG) 20. And the control gate, the word line WL, the selective gate line SSL1, SSL2 and GSL can be formed separately. In order to make small contact resistance between the control gate (CG) 20 and the word line WL and the selective gate line SSL1, SSL2, and GSL, it is good to make the upper part of the control gate (CG) 20 doped with impurities to become low-resistance.

As explained above, in this embodiment, two memory cell transistors MTr1 and MTr2 formed to face each other are constituted of the P type well, the silicon oxide film 17, the silicon nitride film 18, the silicon oxide film 19 and the poly silicon 20, respectively, and they have the "SONOS" structure where the electric charge accumulation layer is formed of the lamination structure of the silicon oxide film 17, the silicon nitride film 18 and the silicon oxide film 19. In the memory cell transistors MTr1 and MTr2 of this embodiment, an electric charge is held at the SiN trap which is dispersed and distributed into the silicon nitride film 18.

Regarding other composition and manufacturing processes, since it is the same as that of the nonvolatile semiconductor memory device of this invention explained in the above-mentioned embodiment and FIG. 1 to FIG. 34, explanation is omitted here.

Next, FIG. 44 is referred for explaining operation of the nonvolatile semiconductor memory device concerning this embodiment. In the nonvolatile semiconductor memory device of this embodiment, at the time of performing write-in operation, first, all of the memory cell transistors MTr1 and MTr2 and the selective gate memory transistors SMTr1 to SMTr6 are changed into an erasing state. Once all of the memory cell transistors MTr1 and MTr2 and the selective gate memory transistors SMTr1 to SMTr6 are changed into an erasing state, those threshold voltage becomes a negative value, respectively, and the threshold of all the memory transistors except the selective gate memory transistor SMTr1 becomes about −3V, and threshold of the selective gate memory transistor SMTr1 which N type impurity region is formed in a channel formation region becomes about 5V. Thus, only the threshold of the selective gate memory transistor SMTr1 becomes smaller than other memory transistors.

In the nonvolatile semiconductor memory device of this embodiment, it is not necessary to perform verification operation per bit after writing data.

Thus, when a selective gate transistors (SMTr1 to SMTr6) are also constituted of a memory transistors, predetermined data writing must be performed beforehand to the selective gate transistors. The method is performed as follows. That is, sufficient quantity of impurities are beforehand injected into the portion correspond to SMTr1 so that the threshold is lowered.

First, 0V is impressed to the bit line BL and the source line SL. When the high voltage is impressed to the GSL line, SMTr5 and SMTr6 become E type simultaneously. As mentioned above, verification operation is required for adjustment of threshold.

Then, write-in operation is simultaneously performed to the selective gate transistor SMTr1 and SMTr2. Its method is carried out by impressing 0V to the bit line and impressing the fixed high voltage to the SSL1. Although threshold of SMTr1 and SMTr2 goes up simultaneously, since there is a large difference in threshold in the state of default, even if SMTr2 becomes E type, SMTr1 remains D type.

Subsequently, while 0V is impressed to the bit line BL, GSL and SSL1, respectively, a high-voltage pulse is impressed to SSL2. Then the channel region of SMTr4 becomes a high voltage by capacity coupling with SSL2 line, and therefore, the writing to the cell of SMTr4 is prohibited. On the other hand, since the channel region of SMTr3 is set to the 0V which is as same as the bit line BL, writing is performed in SMTr3. As a result, SMTr3 becomes E type, and SMTr4 remains D type. Thus, the selective gate transistor with the same threshold as shown in FIG. 1 can be obtained.

If block erasing operation is performed, all of these data will be eliminated, and since all of the selective gate transistors (SMTr1 to SMTr6) become D type (SMTr1 becomes deeper D type) it is necessary to repeat the above-mentioned operation before writing to the subject block.

As explained above, according to the nonvolatile semiconductor memory device of this embodiment, two memory transistors and the selective gate transistor are formed in the trench region formed in the semiconductor substrate in three dimensions, and the NAND type memory cell units ND1 and ND2 can be formed in one bit line pitch 2F, and minimization of the size of the nonvolatile semiconductor memory device can be realized. According to the nonvolatile semiconductor memory device of this embodiment, since it does not have the floating gate which is used for the conventional nonvolatile semiconductor memory device, not only that minimization of the size of the nonvolatile semiconductor memory device can be realized, but also that an aspect ratio of the control gate (CG) can be made small without being influenced by coupling between the floating gates, which has been problems conventionally. In the nonvolatile semiconductor memory device of this embodiment, the conventional CMOS process are applicable, and a highly efficient nonvolatile memory can be realized in a process simpler than the process required in the conventional nonvolatile semiconductor memory device. Moreover, in the nonvolatile semiconductor memory device of this embodiment, since the memory transistor does not have the floating gate, the stress induced leak current (SILC) which is the main cause of degrading the nonvolatile semiconductor memory cell can be controlled, and Drain-Turn-On can be controlled. Further, in the nonvolatile semiconductor memory device of this embodiment, by using a memory transistor not only for the memory cell transistor but also for a selective gate transistor, the memory cell transistor and the selective gate transistor can be manufactured in the same process, and verification operation per bit can be omitted after writing of data.

Embodiment 2

In this embodiment, another example of the nonvolatile semiconductor memory device of this invention is explained. In the nonvolatile semiconductor memory device of this embodiment, the nonvolatile semiconductor memory device of this invention explained in the above-mentioned embodiment and in FIG. 1 to FIG. 37 has what is called "MONOS (Metal-Oxide-Nitride-Oxide-Silicon)" structure which the control gate (CG) of the memory transistor is metal. The same numerals are attached to the same constituent factor as the nonvolatile semiconductor memory device of this invention explained in the above-mentioned embodiment 1, and there are cases that their explanation is omitted.

In the present embodiment, since the equivalent circuit of the nonvolatile semiconductor memory device of this embodiment is the same as that of the nonvolatile semiconductor memory device of this invention shown in FIG. 1 of the above-mentioned embodiment, explanation is omitted here. As shown in FIG. 1, the nonvolatile semiconductor memory device in this embodiment has the NAND type memory cell unit ND1 and NAND type memory cell unit ND2. As shown in FIG. 1, the nonvolatile semiconductor memory device of this embodiment constitutes one memory cell array (NAND type memory cell array) which a plurality of NAND type memory cell unit ND1 and ND2 are arranged in the shape of arrays. In this embodiment, the number of the memory cell transistor MTr1 which constitute the NAND type memory cell unit ND1 and the number of the memory cell transistor MTr2 which constitute the NAND type memory cell unit ND2 are set as 16 units, respectively, as shown in FIG. 38, however, it is not necessarily limited to this. For example, the number of the memory cell transistor MTr1 which constitute the NAND type memory cell unit ND1 and the memory cell transistor MTr2 which constitutes the NAND type memory cell unit ND2 can be 32 units or 64 units and others, respectively.

Figure 45:
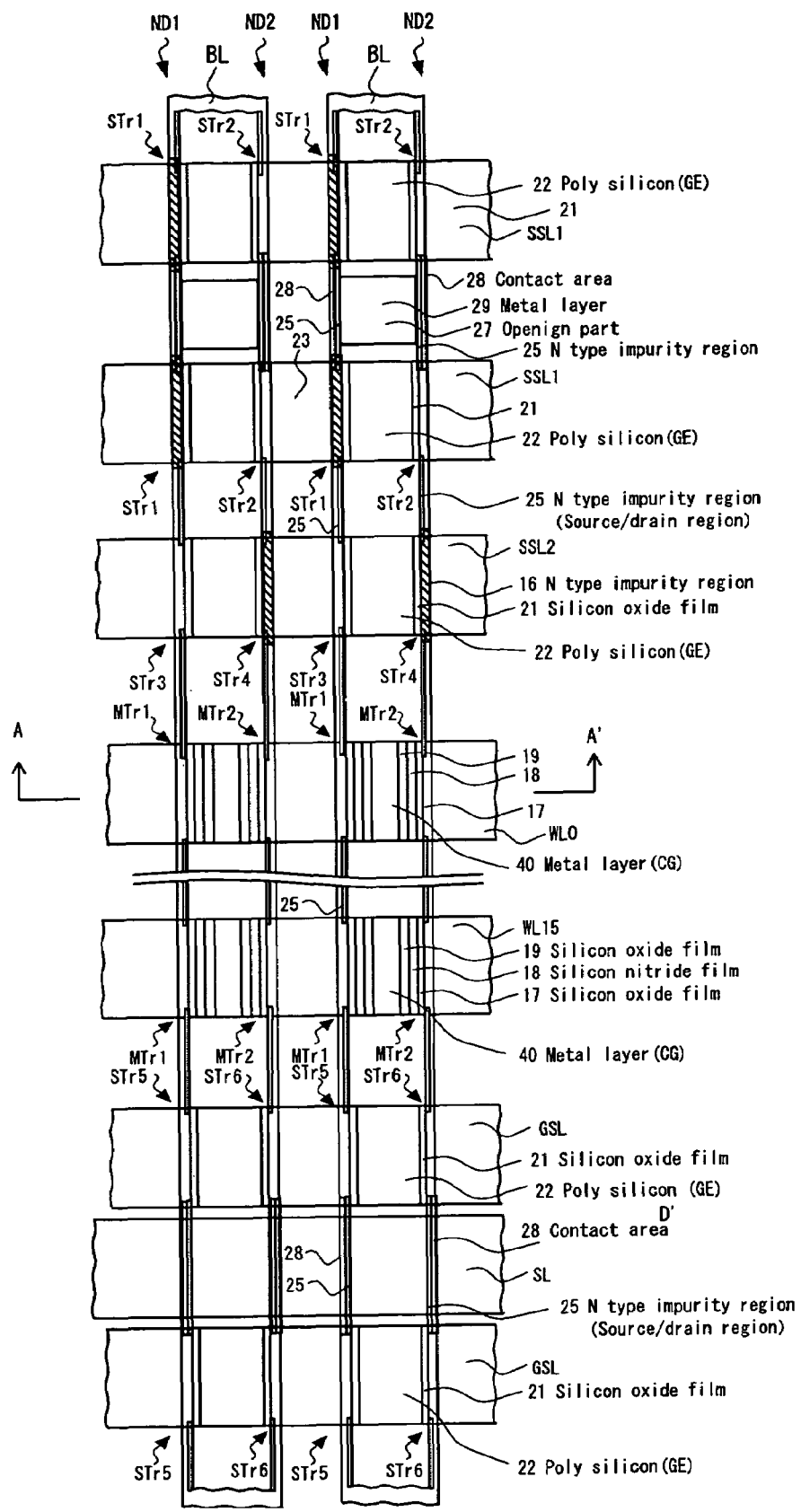
FIG. 45 is a diagram showing in plane view the structure of the memory cell unit of the nonvolatile semiconductor memory device concerning one embodiment of this invention.
Figure 46A:
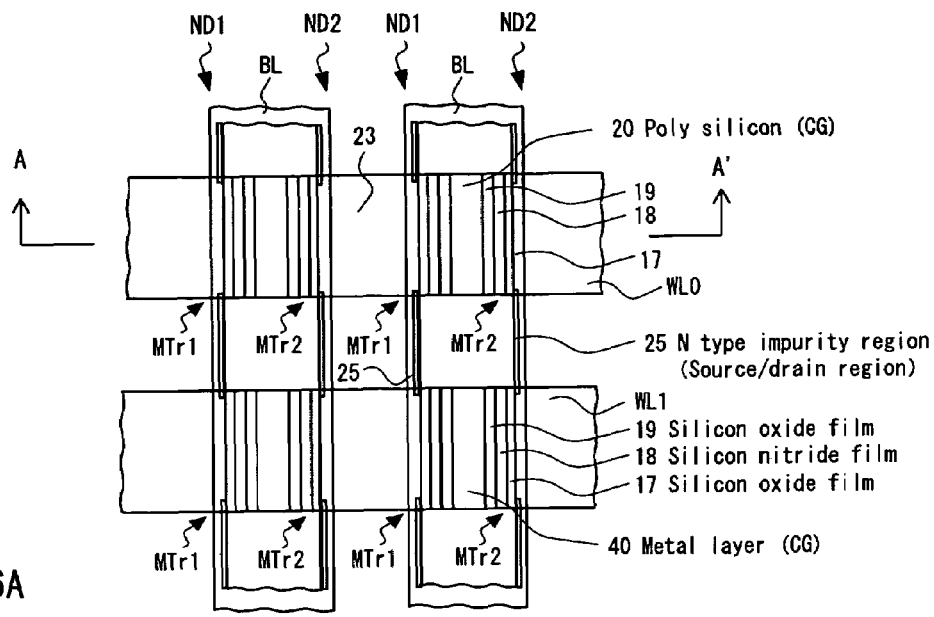
FIG. 46A is a diagram showing in plane view the structure of the memory cell transistor portion in FIG. 45.

Next, based on FIGS. 45 and 46, the structure of the NAND type memory cell array of the nonvolatile semiconductor memory device concerning this embodiment is explained.

Figure 46B:
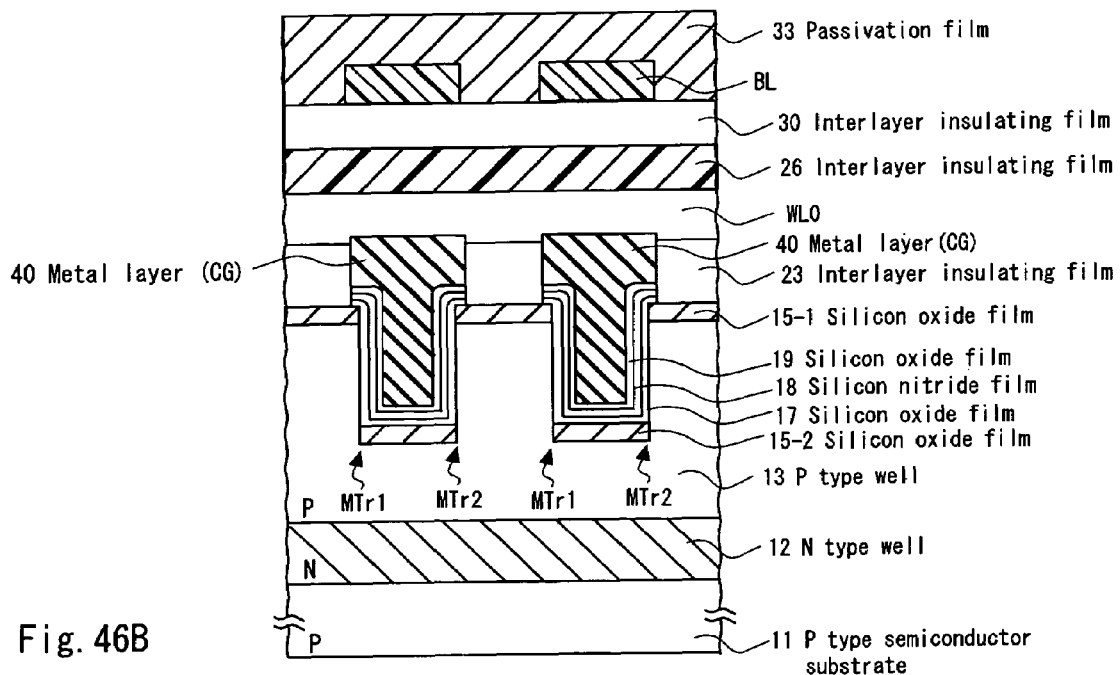
FIG. 46B is a diagram showing a cross section of the A–A' line.

FIG. 45 is a diagram which expresses typically the upper surface of the NAND type memory cell array concerning this embodiment. In FIG. 45, for convenience of explanation, parts of the opaque constituent elements are made transparent to be shown in order to explain a lower constituent factor. FIG. 46(*a*) is a diagram showing typically the upper surface of the word line portion in the nonvolatile semiconductor memory device of this embodiment, and FIG. 46B is a sectional view of the A–A' line. Since the nonvolatile semiconductor memory device of this embodiment has the same structure as what was explained in an above-mentioned embodiment and FIGS. 1 to 37 regarding a portion other than the memory cell transistor MTr1 and MTr2, explanation is omitted here.

As shown in FIGS. 45 and 46, the NAND type memory cell units ND1 and ND2 are formed in the both sides of the side wall of one trench region 14, respectively, in the NAND type memory cell array of the nonvolatile semiconductor memory device of this embodiment.

As shown in FIGS. 45 and 46, in the nonvolatile semiconductor memory device of this embodiment, two memory cell transistors MTr1 and MTr2 formed to face each other have the silicon oxide film 17 which is formed in the side wall of the trench region 14 formed in the P type well 13, the silicon nitride film 18 and the silicon oxide film 19, respectively. Two memory cell transistors MTr1 and MTr2 which are formed to face each other have one common control gate (CG) 40 formed of a metal layer. In this embodiment, although tungsten (W) is used for the control gate (CG) 40, other metal (aluminum (Al), copper (Cu), etc.) may be used. In this embodiment, the control gate (CG) 40 formed of a metal layer contacts with the word line (WL0 to WL15) directly, the control gate (CG) 40 may connect electrically with the word lines WL0 to WL15 via another film (for example, poly silicon which impurities are doped) located between the control gate (CG) 40 made of a metal layer and the word line (WL0 to WL15).

Accordingly, in this embodiment, two memory cell transistors MTr1 and MTr2 formed to face each other respectively are constituted of the P type well, the silicon oxide film 17, the silicon nitride film 18, the silicon oxide film 19 and the metal layer 40, and they have the "MONOS" structure where the electric charge accumulation layer is formed of the lamination structure of the silicon oxide film 17, the silicon nitride film 18 and the silicon oxide film. In the memory cell transistors MTr1 and MTr2 of this embodiment, an electric charge is held at the SiN trap which is dispersed and distributed into the silicon nitride film 18.

Since the other composition is the same as that of the nonvolatile semiconductor memory device of this invention explained in the above-mentioned embodiment, explanation is omitted here.

According to the nonvolatile semiconductor memory device of this embodiment, two memory transistors and the selective gate transistor are formed in the trench region formed in the semiconductor substrate in three dimensions, and the NAND type memory cell units ND1 and ND2 can be formed in one bit line pitch 2F, and thereby minimization of the size of the nonvolatile semiconductor memory device can be realized. According to the nonvolatile semiconductor memory device of this embodiment, since it does not have the floating gate like the conventional nonvolatile semiconductor memory device, not only that minimization of the size of a nonvolatile semiconductor memory device can be realized, but also that an aspect ratio of the control gate (CG) can be made small without being influenced by coupling between the floating gates, which has been problems conventionally. In the nonvolatile semiconductor memory device of this embodiment, the conventional CMOS process is applicable, and a highly efficient nonvolatile memory can be realized in a process simpler than the process required in the conventional nonvolatile semiconductor memory device. Moreover, in the nonvolatile semiconductor memory device of this embodiment, since the memory transistor does not have the floating gate, the stress induced leak current (SILC) which is the main cause of degrading the nonvolatile semiconductor memory cell can be controlled, and Drain-Turn-On can be controlled.

Embodiment 3

Also in this embodiment, another example of the nonvolatile semiconductor memory device of this invention is explained. The nonvolatile semiconductor memory device of this embodiment has the MONOS structure, which the control gate (CG) of the memory transistor is metal, in the nonvolatile semiconductor memory device of this invention explained in the above-mentioned embodiment 1. The same numerals are attached to the same constituent factor as the nonvolatile semiconductor memory device of this invention explained in the above-mentioned embodiment 1 and FIG. 38 to FIG. 43, and there are cases that their explanation is omitted.

In the present embodiment, since the equivalent circuit of the nonvolatile semiconductor memory device of this embodiment is the same as that of the nonvolatile semiconductor memory device of this invention shown in FIG. 38 of the embodiment 1, explanation is omitted here. As shown in FIG. 38, the nonvolatile semiconductor memory device of this embodiment has the NAND type memory cell unit ND1 and the NAND type memory cell unit ND2. As shown in FIG. 38, the nonvolatile semiconductor memory device of this embodiment constitutes one memory cell array (NAND type memory cell array) which a plurality of the NAND type memory cell unit ND1 and ND2 are arranged in the shape of arrays. In this embodiment, the number of the memory cell transistor MTr1 which constitute the NAND type memory cell unit ND1 and the number of the memory cell transistor MTr2 which constitute the NAND type memory cell unit ND2 are set as 16 units, respectively, as shown in FIG. 38, however, it is not necessarily limited to this. For example, the number of the memory cell transistor MTr1 which constitutes the NAND type memory cell unit ND1 and the memory cell transistor MTr2 which constitutes the NAND type memory cell unit ND2 can be 32 units or 64 units and others, respectively.

Figure 47:
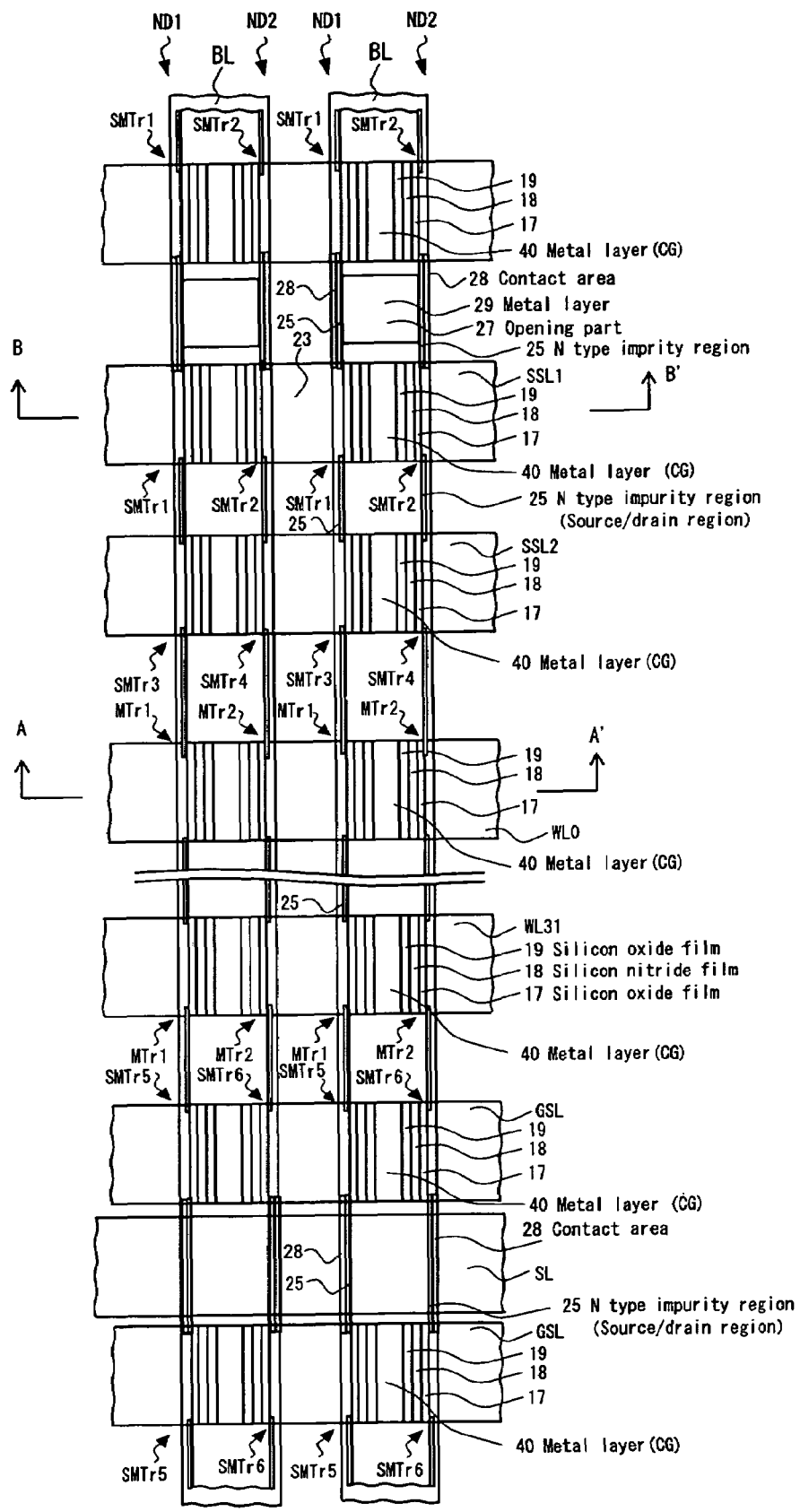
FIG. 47 is a diagram showing in plane view the structure of the memory cell unit of the nonvolatile semiconductor memory device concerning one embodiment of this invention.

Next, based on FIGS. 47 to 49, the structure of the NAND type memory cell array of the nonvolatile semiconductor memory device concerning this embodiment is explained.

Figure 48A:
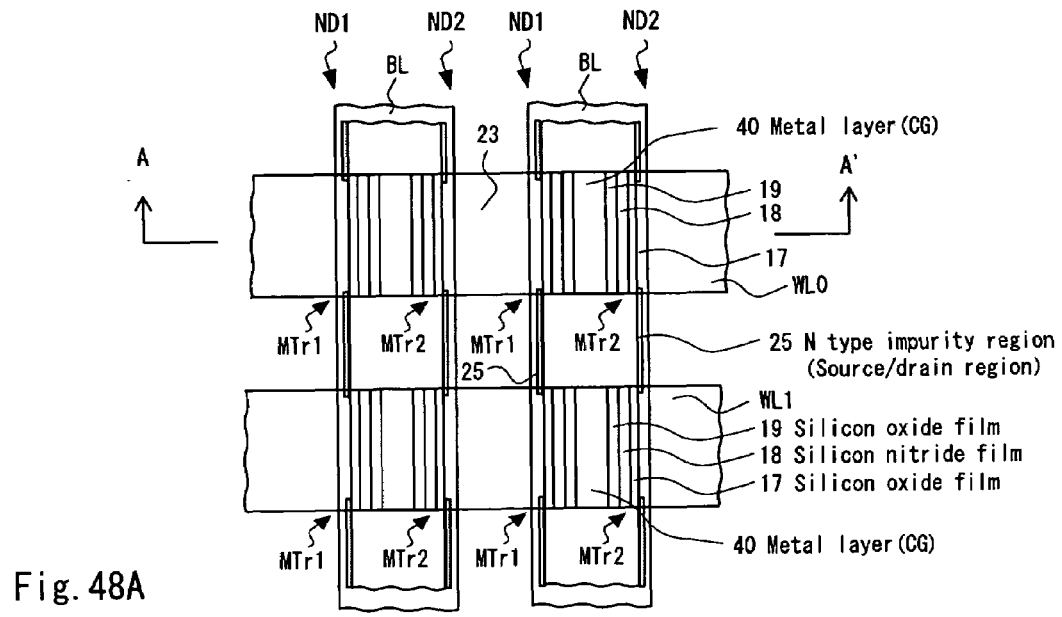
FIG. 48A is a diagram showing in plane view the structure of the memory cell transistor portion in FIG. 47.
Figure 48B:
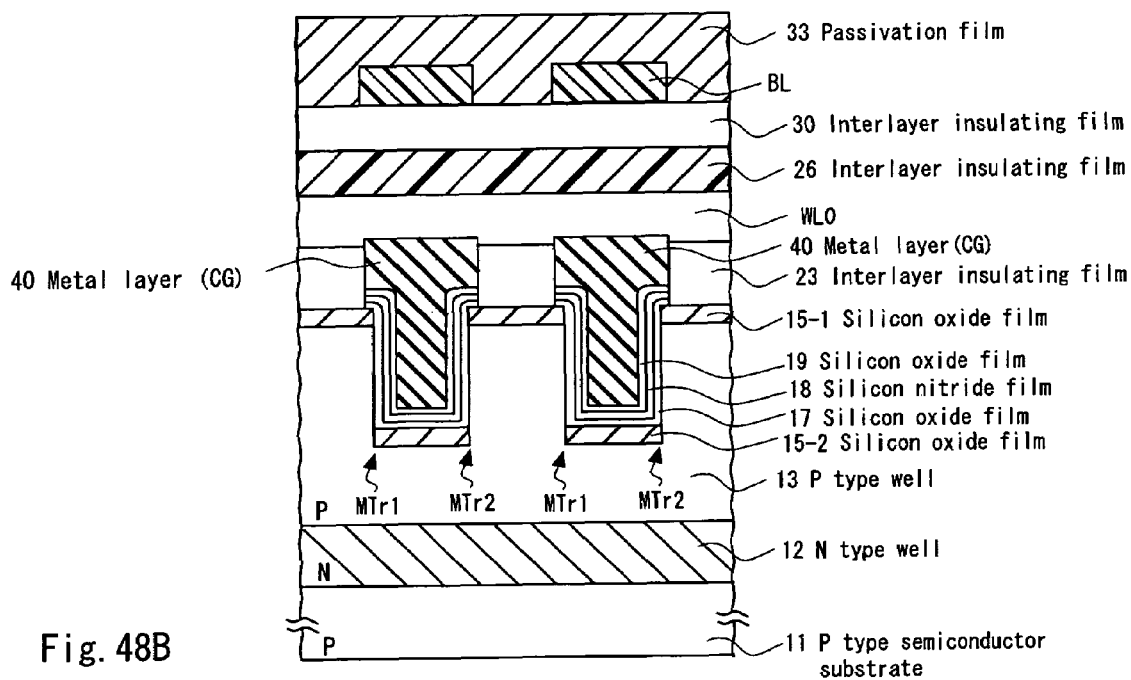
FIG. 48B is a diagram showing a cross section of the A–A' line.
Figure 49A:
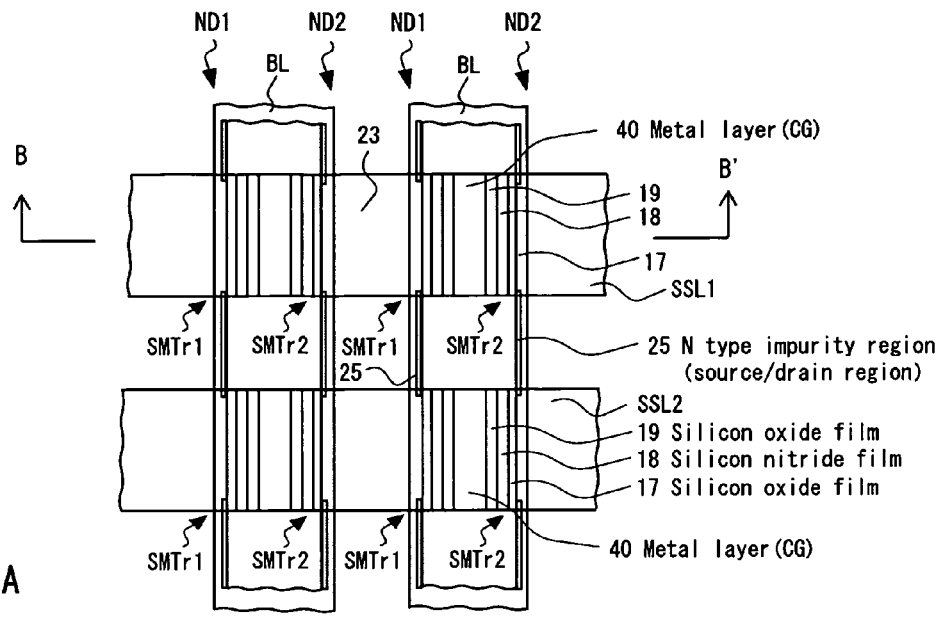
FIG. 49A is a diagram showing in plane view the structure of the selective gate transistor portion in FIG. 47.
Figure 49B:
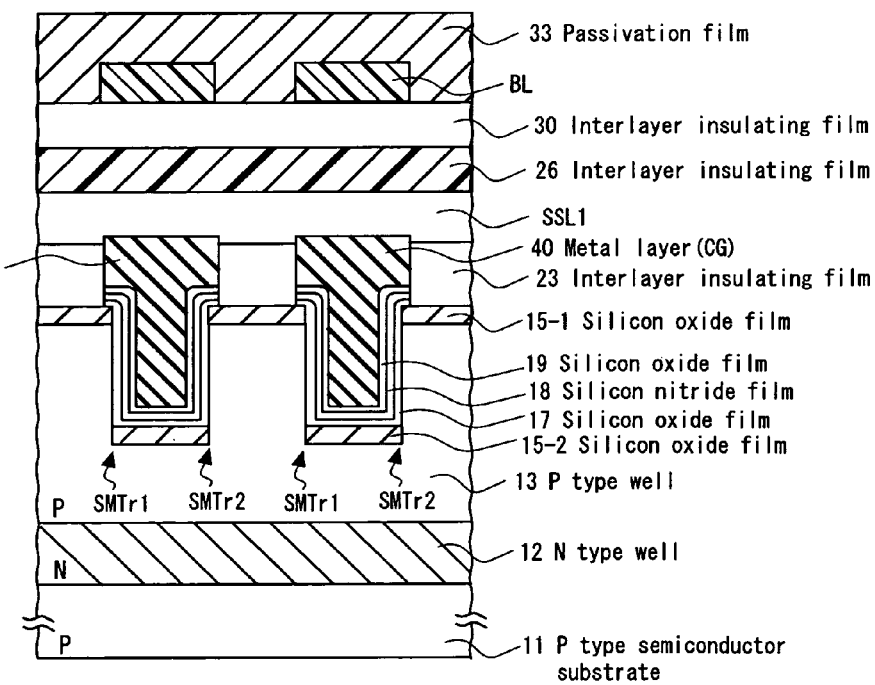
FIG. 49B is a diagram showing a cross section of the B–B' line.

FIG. 47 is a diagram showing typically the upper surface of the NAND type memory cell array concerning this embodiment. In FIG. 47, for convenience of explanation, a part of the opaque constituent factor is made transparent to be shown in order to explain a lower constituent factor. FIG. 48A is a diagram showing typically the upper surface of the word line portion in the nonvolatile semiconductor memory device of this embodiment, and FIG. 48B is a sectional view of the A–A' line. FIG. 49A is a diagram showing typically the upper surface of the selective word line portion in the nonvolatile semiconductor memory device of this embodiment, and FIG. 49B is a sectional view of the B–B' line. Since the other structure is the same as the structure explained in the embodiment 1 and FIGS. 38 to 43, explanation is omitted here.

As shown in FIGS. 47 to 49, in the NAND type memory cell array of the nonvolatile semiconductor memory device of this embodiment, the NAND type memory cell units ND1 and ND2 are respectively formed in the both sides of the side wall of one trench region 14 as same as that of the nonvolatile semiconductor memory device of this invention explained in the above-mentioned embodiment 1.

As shown in FIGS. 47 to 49, in the nonvolatile semiconductor memory device of this embodiment, not only the memory cell transistors (MTr1 and MTr2) but also the selective gate transistors (SMTr1 to SMTr6) are constituted of the memory transistor. Two memory cell transistors MTr1 and MTr2 formed to face each other have the silicon oxide film 17 formed in the side wall of the trench region 14 formed in the P type well 13, the silicon nitride film 18 and the silicon oxide film 19, respectively. These two memory cell transistors MTr1 and MTr2 formed to face each other and the selective gate memory transistors SMTr1 to SMTr6 has one common control gate (CG) 40 formed of a metal layer. Although tungsten (W) is used for the control gate (CG) 40 in this embodiment, other metal (aluminum (Al), copper (Cu), etc.) may be used. In this embodiment, although the control gate (CG) 40 which is formed of the metal layer 40 contacts with the word line (WL0 to WL15) or the selective gate line SSL1 and SSL2 directly, the control gate (CG) 40 may connect electrically with the word lines WL0 to WL15 or the selective gate line SSL1 and SSL2 via another film (for example, poly silicon which impurities are doped) located between the control gate (CG) 40 made of a metal layer and the word line (WL0 to WL15) or the selective gate line SSL1 and SSL2.

As explained above, in this embodiment, two memory cell transistors MTr1 and MTr2 which are formed to face each other and the selective gate memory transistors SMTr1 to SMTr6 respectively are constituted of the P type well, the silicon oxide film 17, the silicon nitride film 18, the silicon oxide film 19 and the metal layer 40, and they have the "MONOS" structure where the electric charge accumulation layer is formed of the lamination structure of the silicon oxide film 17, the silicon nitride film 18 and the silicon oxide film 19. In the memory cell transistors MTr1 and MTr2 of this embodiment, an electric charge is held at the SiN trap which is dispersed and distributed into the silicon nitride film 18.

Since the other composition is the same as that of the nonvolatile semiconductor memory device of this invention explained in the above-mentioned embodiment 1, explanation is omitted here.

According to the nonvolatile semiconductor memory device of this embodiment, two memory transistors and the selective gate transistor are formed in the trench region formed in the semiconductor substrate in three dimensions, and the NAND type memory cell units ND1 and ND2 can be formed in one bit line pitch 2F, and thereby minimization of the size of the nonvolatile semiconductor memory device can be realized. According to the nonvolatile semiconductor memory device of this embodiment, since it does not have the floating gate like the conventional nonvolatile semiconductor memory device, not only that minimization of the size of a nonvolatile semiconductor memory device can be realized, but also that an aspect ratio of the control gate (CG) can be made small without being influenced by coupling between the floating gates, which has been problems conventionally. In the nonvolatile semiconductor memory device of this embodiment, the conventional CMOS process is applicable, and a highly efficient nonvolatile memory can be realized in a process simpler than the process required in the conventional nonvolatile semiconductor memory device. Moreover, in the nonvolatile semiconductor memory device of this embodiment, since the memory transistor does not have the floating gate, the stress induced leak current (SILC) which is the main cause of degrading the nonvolatile semiconductor memory device cell can be controlled, and Drain-Turn-On can be controlled.

Embodiment 4

In this embodiment, another example of the nonvolatile semiconductor memory device of this invention is explained. The nonvolatile semiconductor memory device of this embodiment uses an insulating layer including metal, silicon and other conductive substances of the nano crystal instead of the silicon nitride film 18 of the memory transistors MTr1 and MTr2 in the nonvolatile semiconductor memory device of this invention explained in the above-mentioned embodiment and FIGS. 1 to 37. In addition, the same numerals are attached to the same constituent factor as the nonvolatile semiconductor memory device of this invention explained in the above-mentioned embodiment and FIG. 1 to FIG. 37, and there are cases that their explanation is omitted.

Figure 50A:
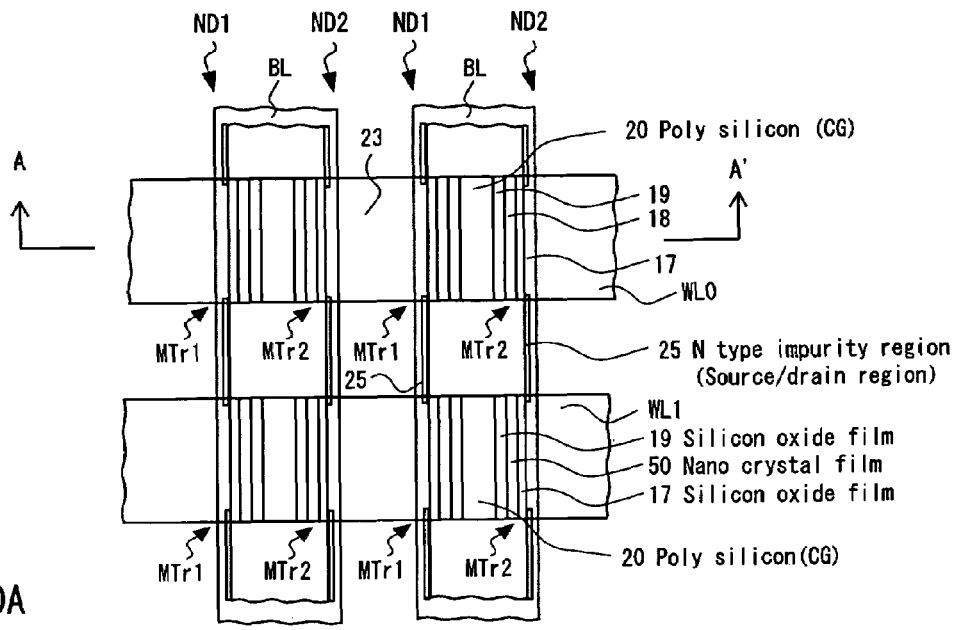
FIG. 50A is a diagram showing in plane view the structure of the memory cell transistor portion in the memory cell unit of the nonvolatile semiconductor memory device concerning one embodiment of this invention.
Figure 50B:
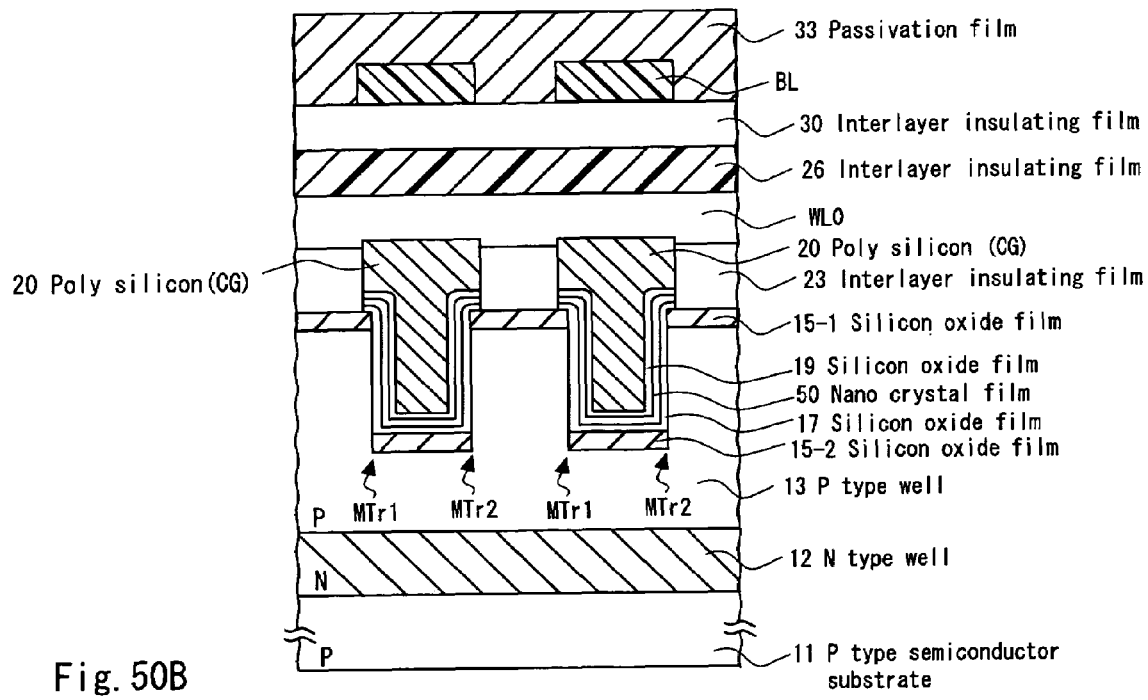
FIG. 50B is a diagram showing a cross section of the A–A' line.
Figure 51:
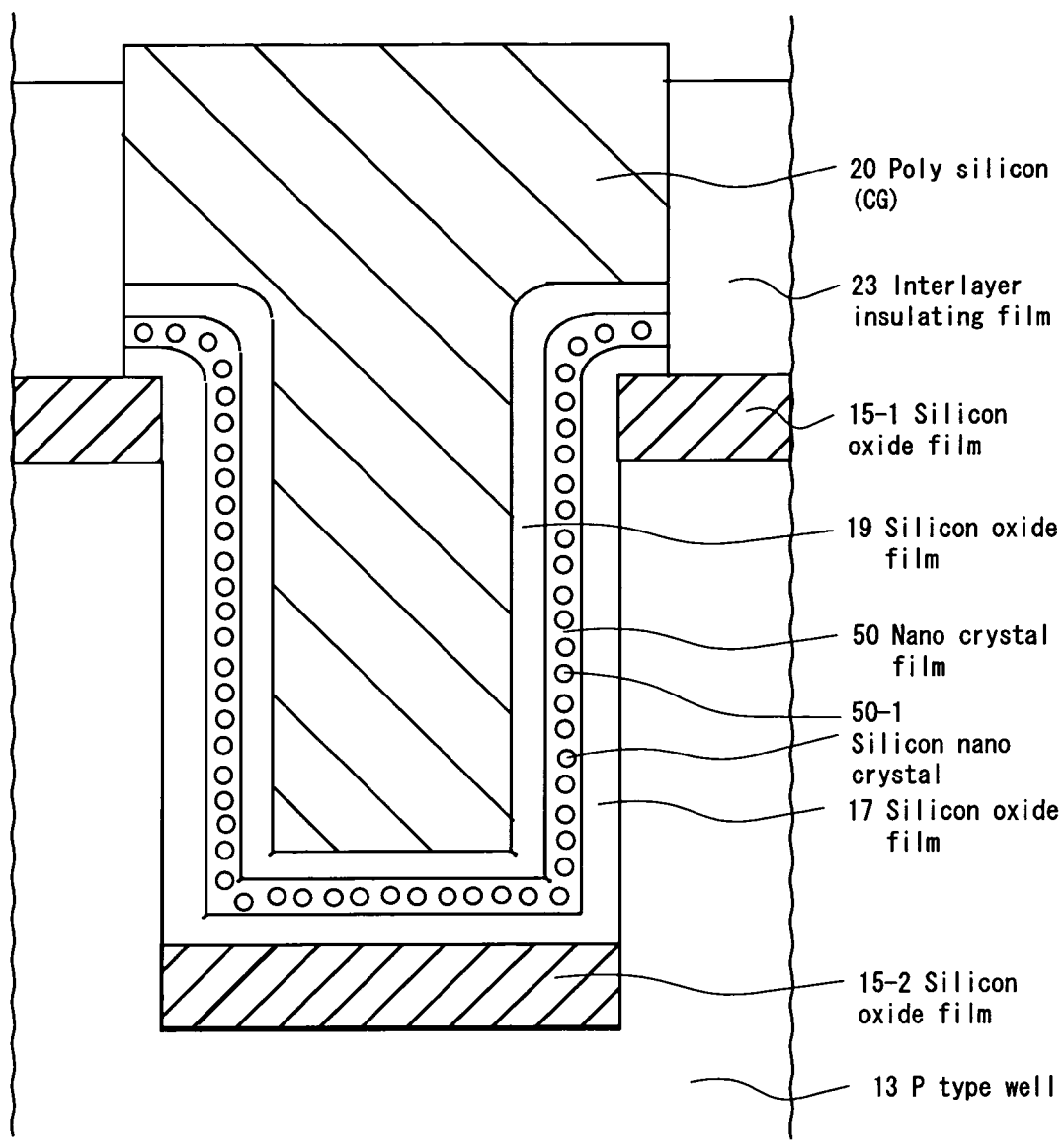
FIG. 51 is an enlarged diagram of the memory cell transistor portion in the memory cell unit of the nonvolatile semiconductor memory device concerning one embodiment of this invention.

FIGS. 50 and 51 are referred to. FIG. 50A is a diagram showing typically the upper surface of the word line portion in the nonvolatile semiconductor memory device of this embodiment, and FIG. 50B is a sectional view of the A–A' line. FIG. 51 is a diagram enlarging the portion of the memory cell transistors MTr1 and MTr2 in FIG. 50. As shown in FIGS. 50 and 51, in this embodiment, two memory cell transistors MTr1 and MTr2 which are formed against one trench is constituted of the P type well, the silicon oxide film 17, the nano crystal film 50, the silicon oxide film 19 and the poly silicon 20, respectively. In this embodiment, the silicon oxide film containing nano crystal 50-1 of silicon is used for the nano crystal film 50. In the memory cell transistors MTr1 and MTr2 of this embodiment, an electric charge is held at nano crystal which is dispersed and distributed into the nano crystal film 50-1.

In this embodiment, although the nano crystal film 50 formed of the silicon oxide film containing nano crystal of silicon 50-1 is used, a metal nano crystal consisting of cobalt (Co), tungsten (W), silver (Ag), gold (Au), platinum (Pt) and other metal or the nano crystal of other conductive substances may be used. Nano crystal is also called as a "metal nano dot" and a "nano crystal."

In this embodiment, although the memory cell transistor MTr1 and MTr2 adopt the three-layer structure of the silicon oxide film 17, the nano crystal film 50 and the silicon oxide film 19, these three layers may be formed continuously, and one layer structure of an insulating film such as an silicon oxide film containing silicon, metal, or other conductive substances of the nano crystal is also acceptable.

In case that a control gate (CG) is formed of metal including tungsten, a film like nitride tungsten (WNx) may be formed between the silicon oxide film 19 and the control gate.

The nano crystal film 50 of this embodiment may also be adopted for the selective gate transistor. That is, in the nonvolatile semiconductor memory device of this invention explained in Embodiment 1 and FIGS. 39 to 43, the silicon nitride film 18 may be replaced with the nano crystal film 50 of this embodiment.

According to the nonvolatile semiconductor memory device of this embodiment, two memory transistors and the selective gate transistor are formed in the trench region formed in the semiconductor substrate in three dimensions, and the NAND type memory cell units ND1 and ND2 can be formed in one bit line pitch 2F, and thereby minimization of the size of a nonvolatile semiconductor memory device can be realized. According to the nonvolatile semiconductor memory device of this embodiment, since it does not have the floating gate which is used for the conventional nonvolatile semiconductor memory device, not only that minimization of the size of the nonvolatile semiconductor memory device can be realized, but also that an aspect ratio of the control gate (CG) can be made small without being influenced by coupling between the floating gates, which has been problems conventionally. In addition, the nonvolatile semiconductor memory device of this embodiment is applicable to the conventional CMOS process, and a highly efficient nonvolatile memory can be realized by a simpler process than the process required in the conventional nonvolatile semiconductor memory device. Moreover, in the nonvolatile semiconductor memory device of this embodiment, since the memory transistor does not have the conventional floating gate, the stress induced leak current (SILC) which is the main cause of degrading the nonvolatile semiconductor memory cell can be controlled, and Drain-Turn-On can be controlled.

In common with the above embodiments and Embodiments 1 or 4, when a fuse and others in a peripheral circuit are manufactured with the nonvolatile semiconductor memory element, such fuse may be manufactured with the same structure as the above-mentioned NAND cell formed in the trench. The length of a slot is shorter than that of a NAND cell, and depending on the case, the cell of 1-bit MONOS structure may be formed within the slot with the width of 1-bit. Especially when the peripheral circuit is complicated and many fuses are needed, the structure described above contributes to minimize the area of the peripheral circuit.

Embodiment 5

Figure 52:
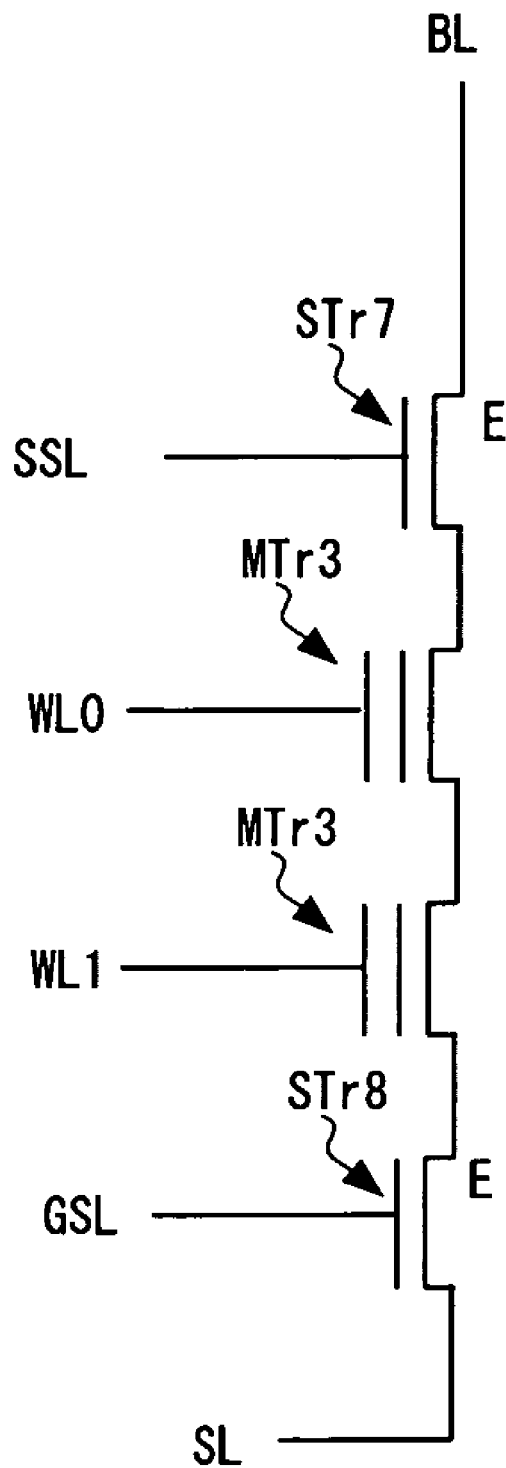
FIG. 52 is a diagram showing the equivalent circuit of the nonvolatile semiconductor memory device concerning one embodiment of this invention.

In this embodiment, another example of the nonvolatile semiconductor memory device of this invention is explained referring to FIG. 52 and FIG. 53.

FIG. 52 shows the equivalent circuit of the nonvolatile semiconductor memory device of this embodiment. The nonvolatile semiconductor memory device concerning this embodiment is constituted by connecting in-series the selective gate transistor STr7, two memory cell transistors MTr3 and the selective gate transistor STr8 against one bit line BL. The number of the memory cell transistors MTr3 connected to one bit line in this embodiment are two units, however, it is not necessarily limited to this.

Figure 53A:
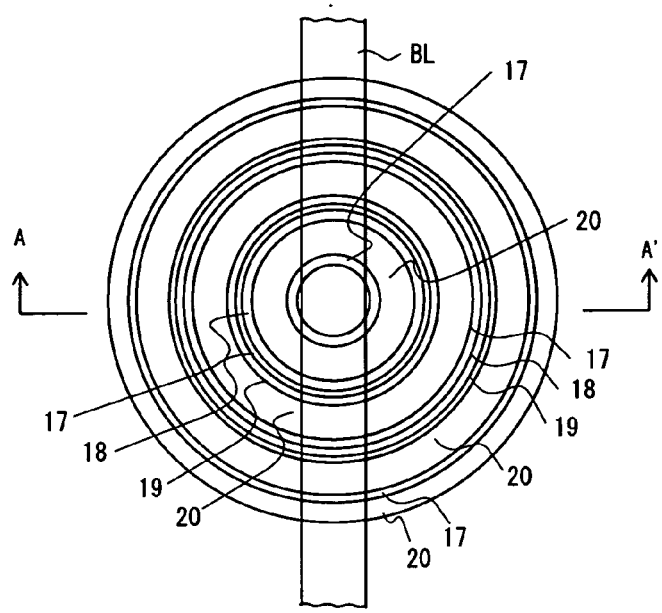
FIG. 53A is a diagram showing in plane view the structure of the memory cell transistor portion in the memory cell unit of the nonvolatile semiconductor memory device concerning one embodiment of this invention.
Figure 53B:
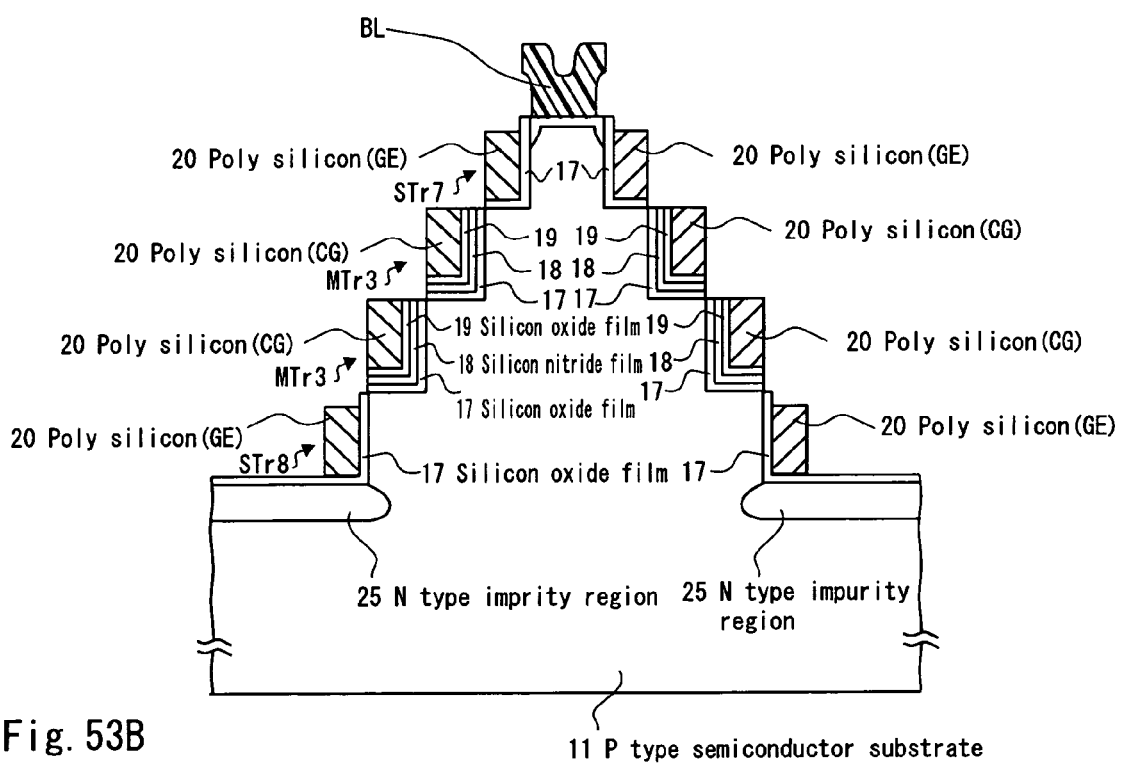
FIG. 53B is a diagram showing a cross section of the A–A' line.
Figure 54:
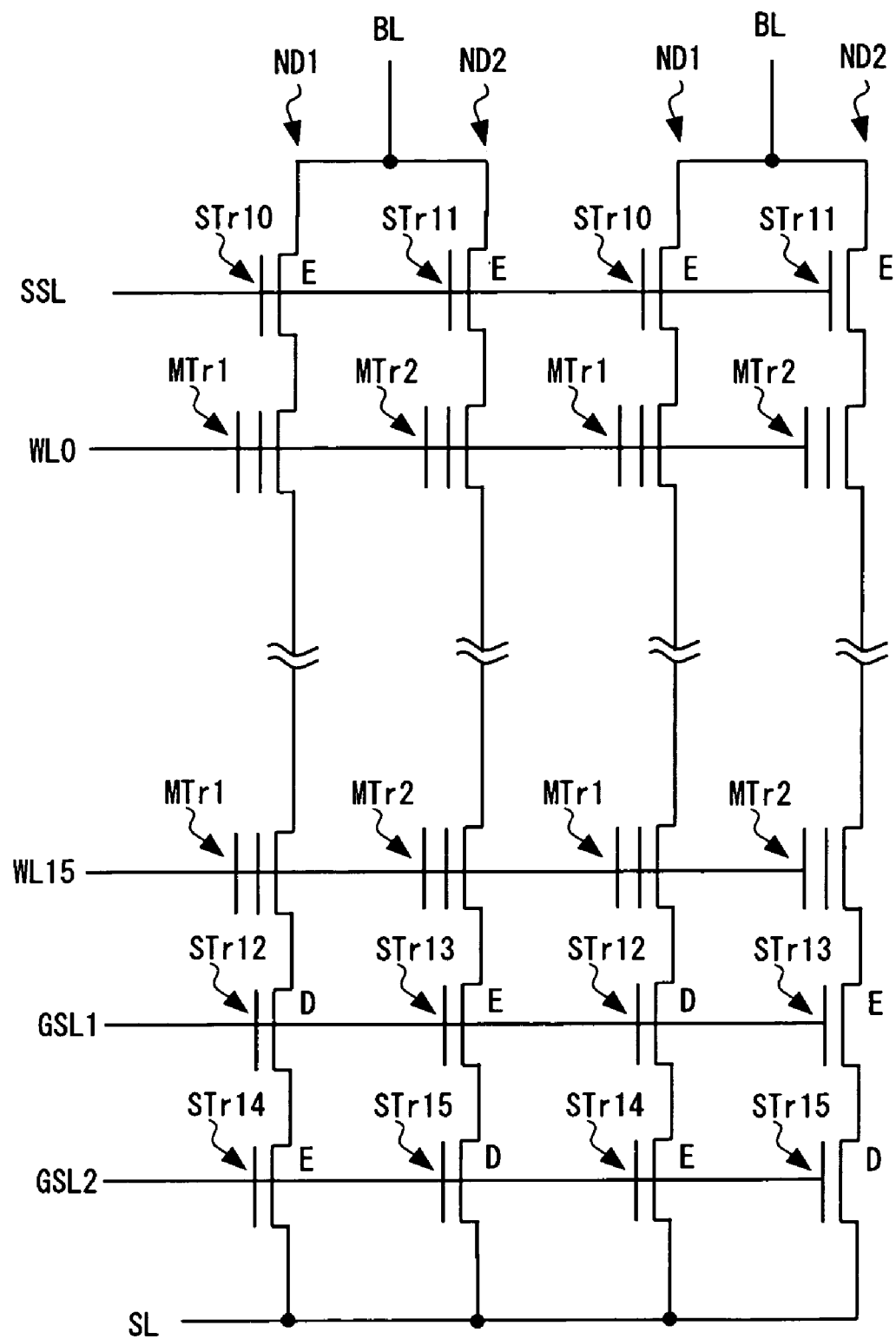
FIG. 54 is a diagram showing the equivalent circuit of the nonvolatile semiconductor memory device concerning one embodiment of this invention.
Figure 55:
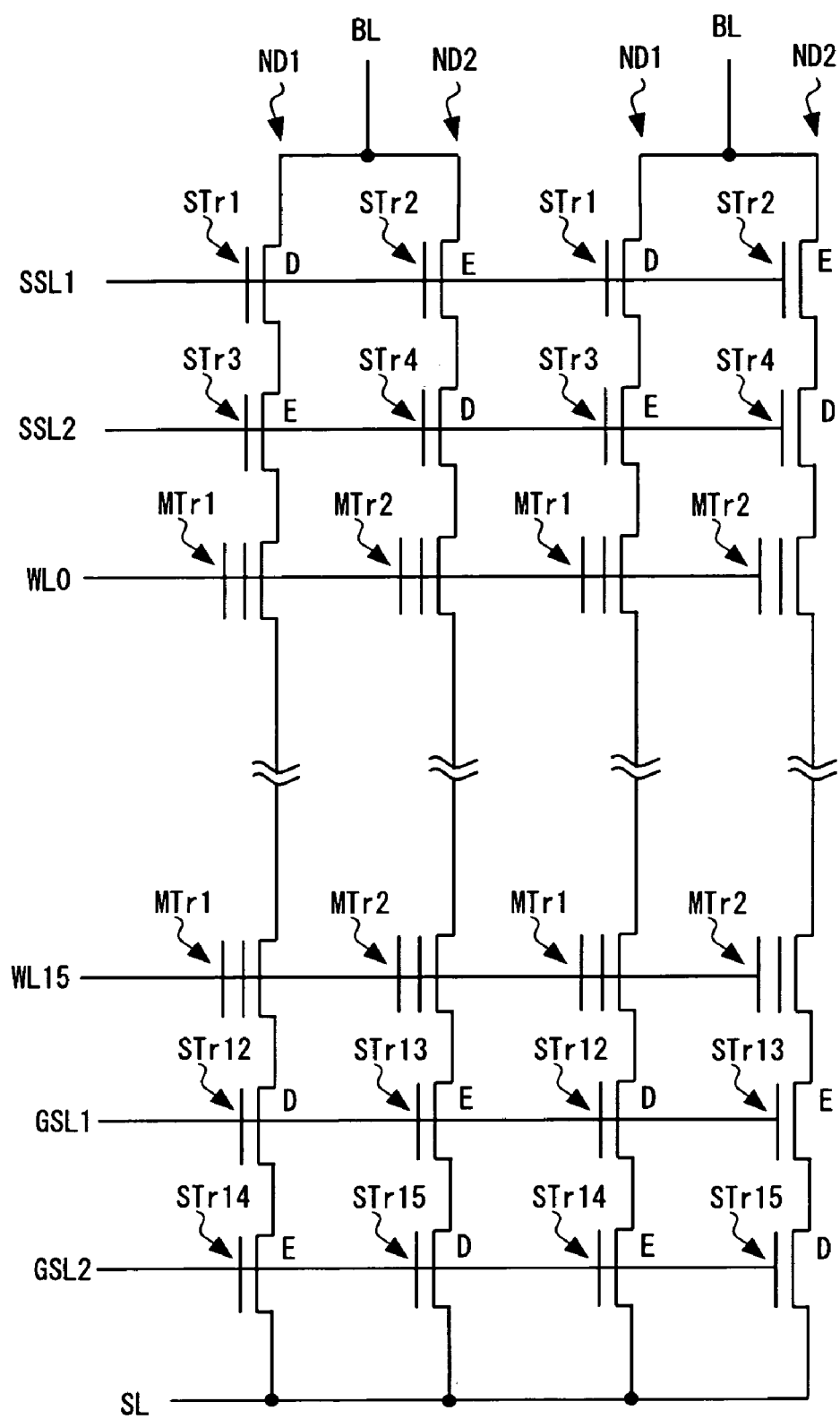
FIG. 55 is a diagram showing the equivalent circuit of the nonvolatile semiconductor memory device concerning one embodiment of this invention.

Next, FIG. 53 is referred to. FIG. 53A is a diagram showing typically the upper surface of the word line portion in the nonvolatile semiconductor memory device of this embodiment, and FIG. 53B is a sectional view of the A–A' line.

The nonvolatile semiconductor memory device of this embodiment is a nonvolatile semiconductor memory device of SGT (Surrounding Gate Transistor) type, which the silicon oxide film 17, the silicon nitride film 18, the silicon oxide film 19 and the poly silicon 20 are formed to surround pillar-shaped (columnar) silicon which a P-type semiconductor substrate (silicon substrate) is etched to form the shape of stairs. Also in the nonvolatile semiconductor memory device of this embodiment, the memory cell transistor MTr3 adopts the SONOS structure which the P-type silicon 11, the silicon oxide film 17, the silicon nitride film 18, the silicon oxide film 19 and the poly silicon 20 are laminated in order.

Poly silicon 20 of the nonvolatile semiconductor memory device of this embodiment may be replaced with metal including tungsten (W) so that MONOS structure may be adopted like Embodiment 1. In addition, the nano crystal film 50 explained in the above-mentioned embodiment 4 may be used instead of the silicon nitride film 18 of the nonvolatile semiconductor memory device of this embodiment.

According to the nonvolatile semiconductor memory device of this embodiment, since it does not have the floating gate which is used for the conventional nonvolatile semiconductor memory device, not only that minimization of the size of the nonvolatile semiconductor memory device can be realized, but also that an aspect ratio of the control gate (CG) can be made small without being influenced by coupling between the floating gates, which has been problems conventionally. In addition, the nonvolatile semiconductor memory device of this embodiment is applicable to the conventional CMOS process, and a highly efficient nonvolatile memory can be realized by a simpler process than the process required in the conventional nonvolatile semiconductor memory device. Moreover, in the nonvolatile semiconductor memory device of this embodiment, since the memory transistor does not have the conventional floating gate, the stress induced leak current (SILC) which is the main cause of degrading the nonvolatile semiconductor memory cell can be controlled, and Drain-Turn-On can be controlled.

Embodiment 6

Figure 11A:
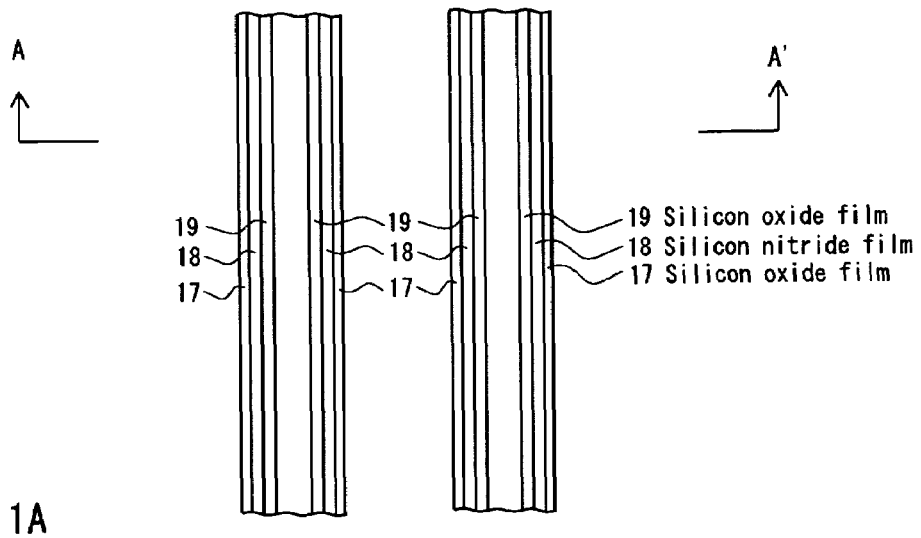
FIG. 11A is a diagram showing the manufacturing process of the memory cell transistor portion in FIG. 2 in plane view.
Figure 11B:
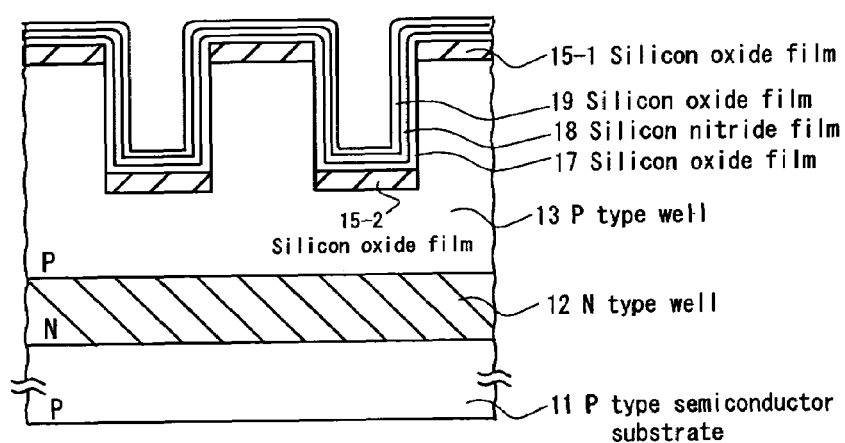
FIG. 11B is a diagram showing a cross section of the A–A' line.
Figure 12A:
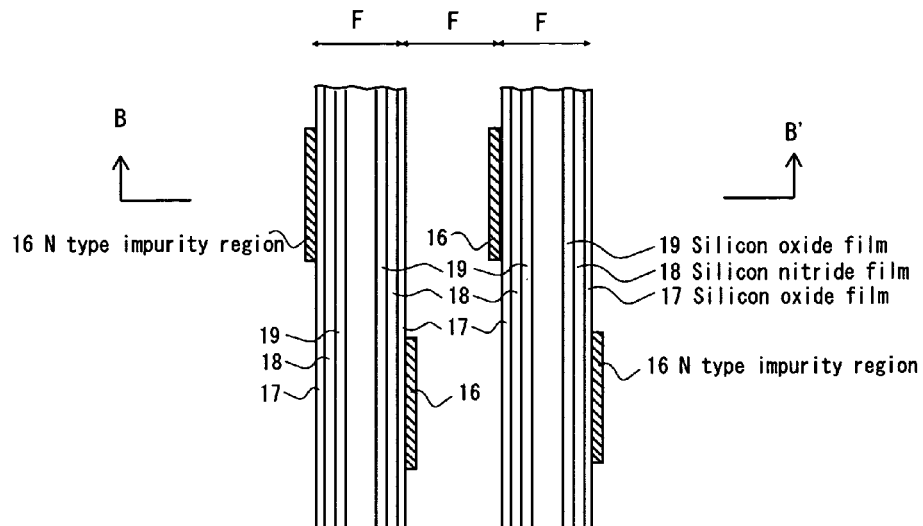
FIG. 12A is a diagram showing the manufacturing process of the selective gate transistor portion in FIG. 2 in plane view.
Figure 12B:
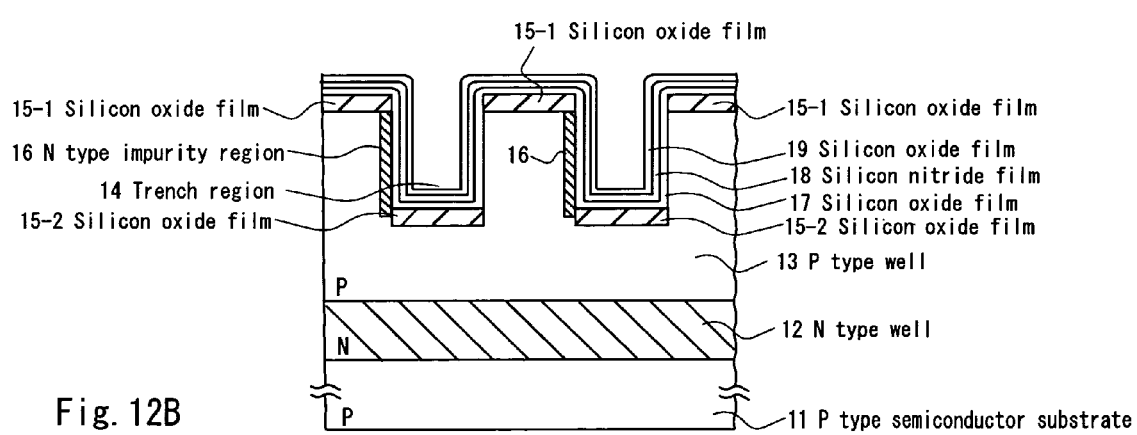
FIG. 12B is a diagram showing a cross section of the B–B' line.
Figure 13A:
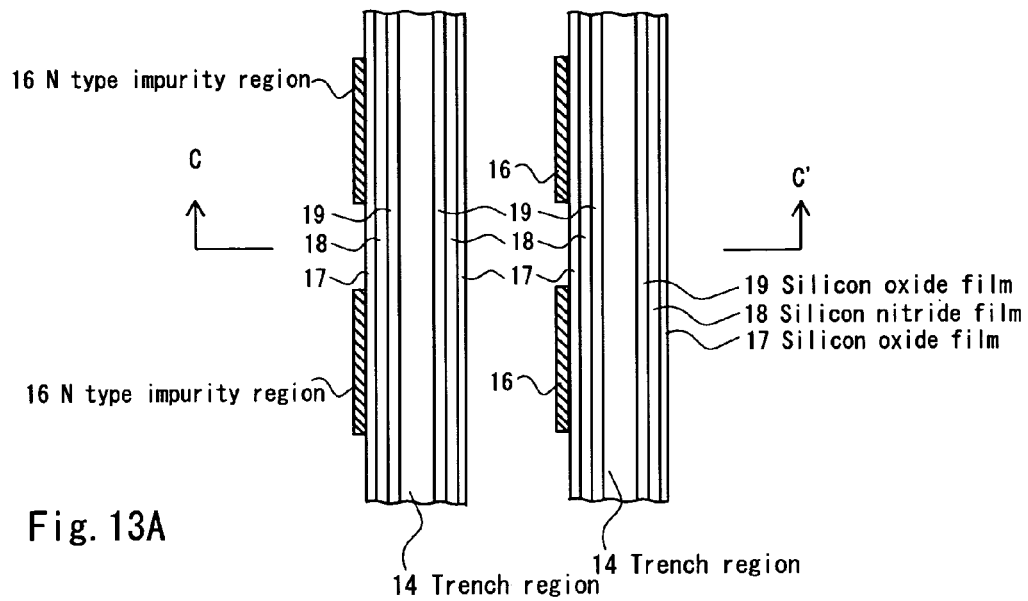
FIG. 13A is a diagram showing the manufacturing process of the bit line contact part in FIG. 2 in plane view.
Figure 13B:
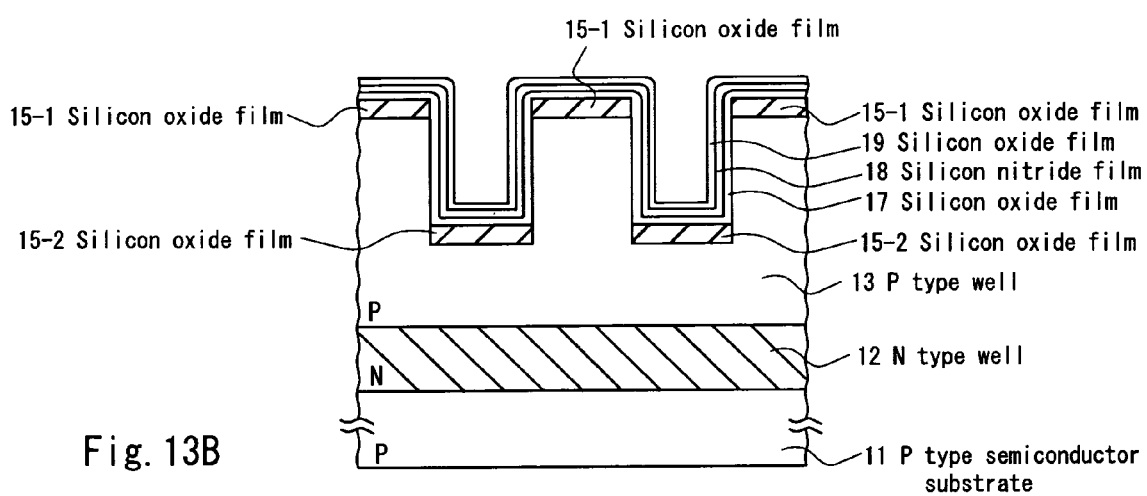
FIG. 13B is a diagram showing a cross section of the C–C' line.
Figure 14A:
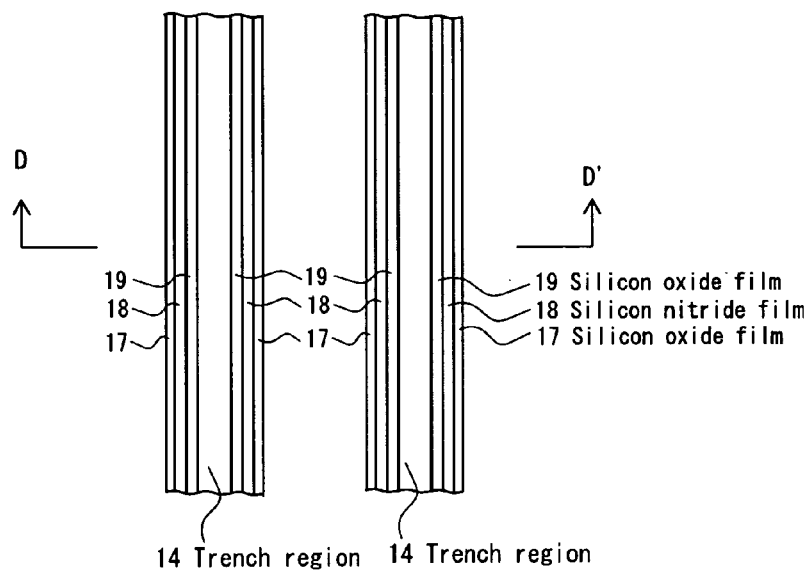
FIG. 14A is a diagram showing the manufacturing process of the source line contact part in FIG. 2 in plane view.
Figure 14B:
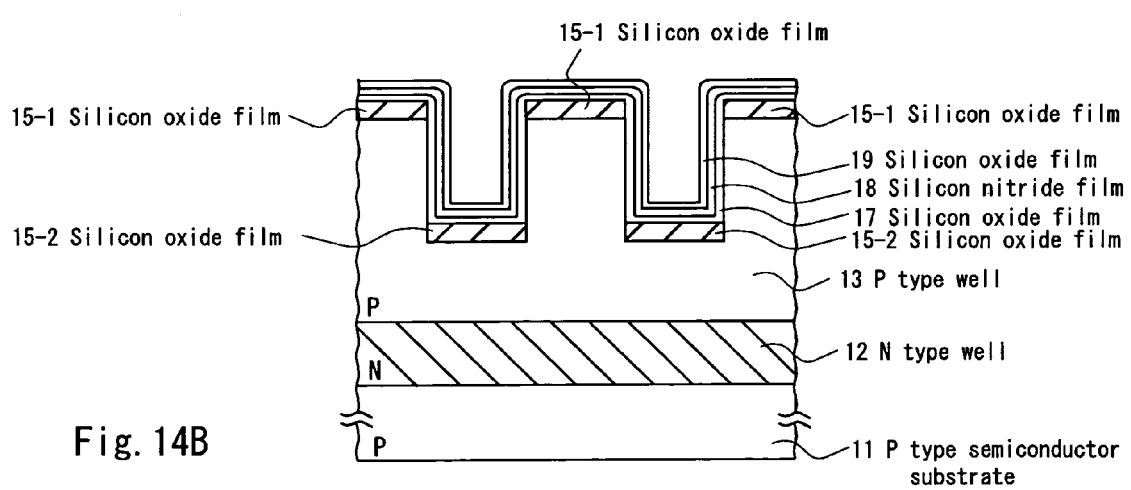
FIG. 14B is a diagram showing a cross section of the D–D' line.
Figure 15A:
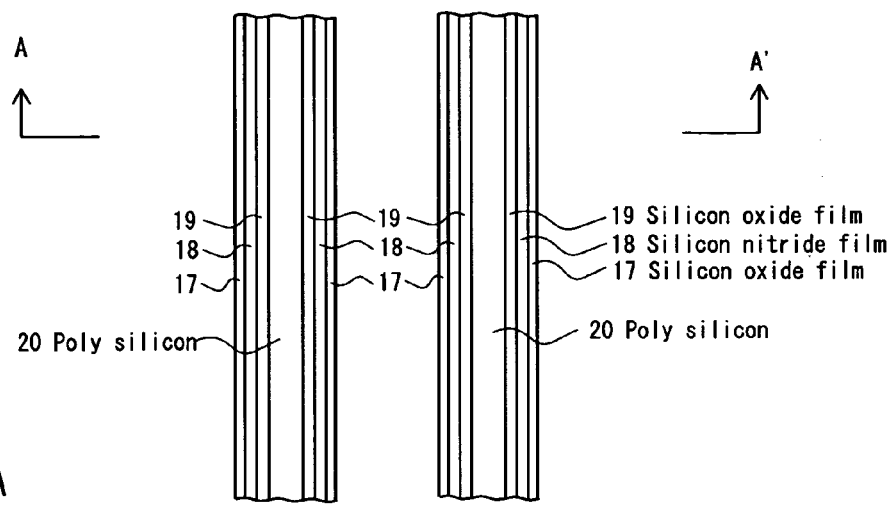
FIG. 15A is a diagram showing the manufacturing process of the memory cell transistor portion in FIG. 2 in plane view.
Figure 15B:
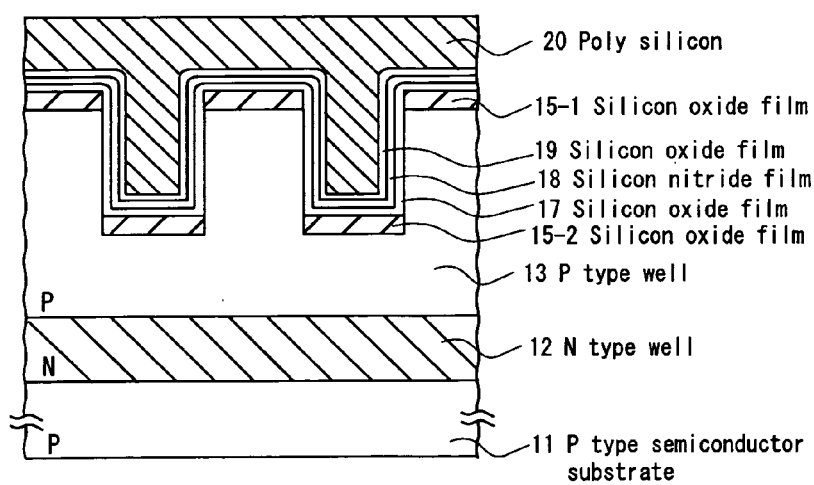
FIG. 15B is a diagram showing a cross section of the A–A' line.
Figure 16A:
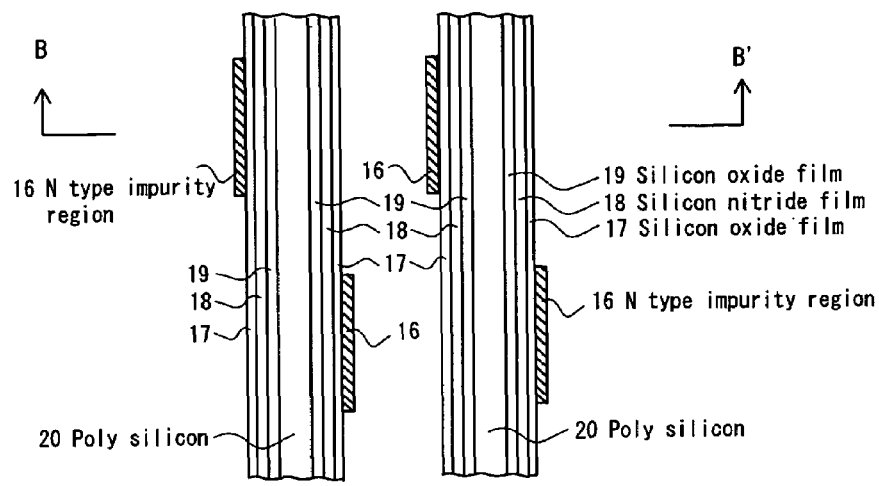
FIG. 16A is a diagram showing in plane view the manufacturing process of the selective gate transistor portion in FIG. 2.
Figure 16B:
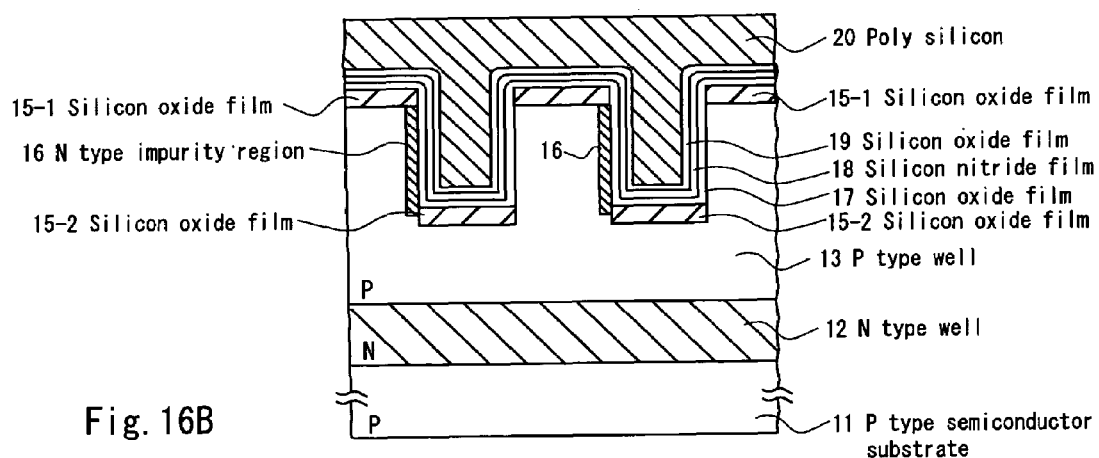
FIG. 16B is a diagram showing a cross section of the B–B' line.
Figure 17A:
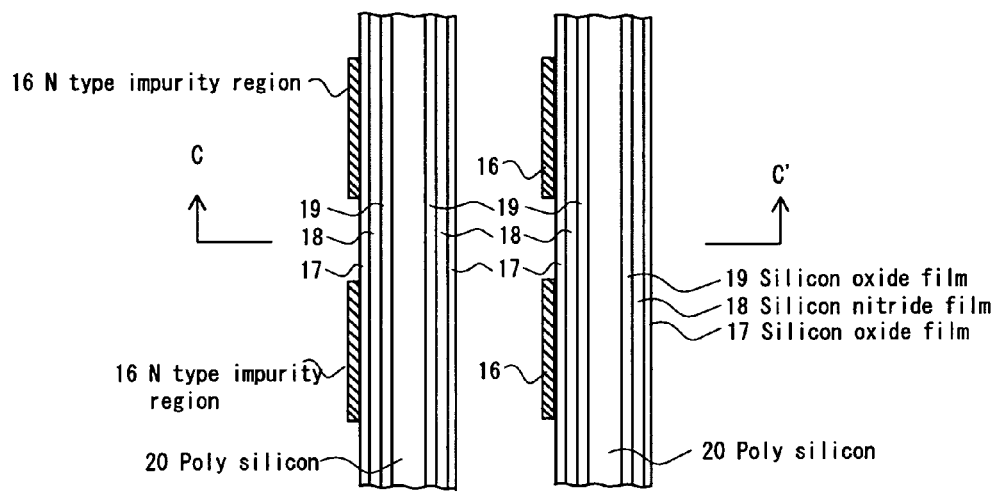
FIG. 17A is a diagram showing in plane view the manufacturing process of the bit line contact part in FIG. 2.
Figure 17B:
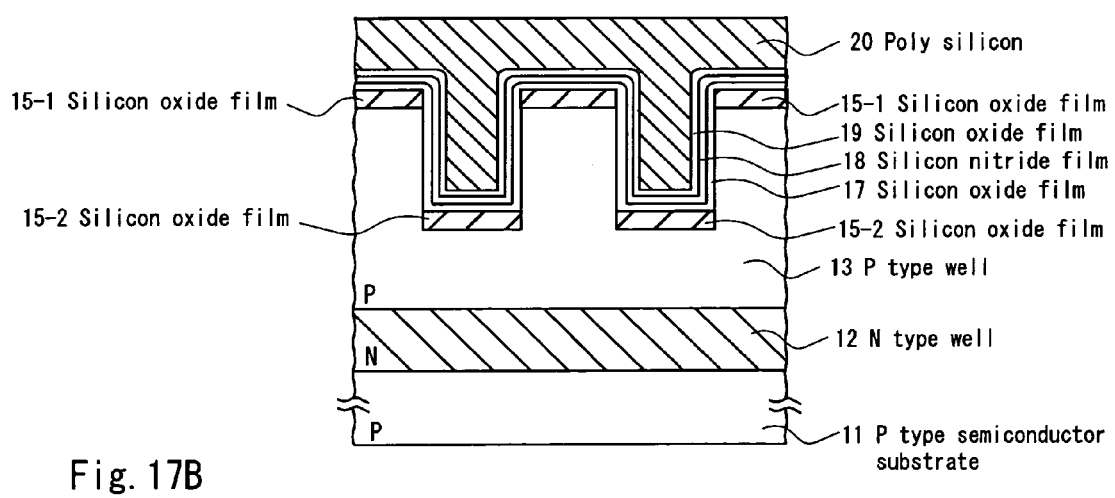
FIG. 17B is a diagram showing a cross section of the C–C' line.
Figure 18A:
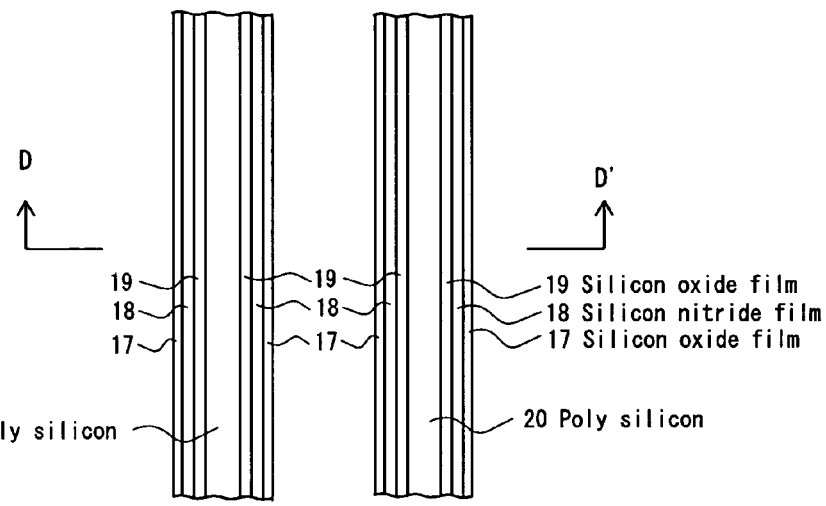
FIG. 18A is a diagram showing in plane view the manufacturing process of the source line contact part in FIG. 2.
Figure 18B:
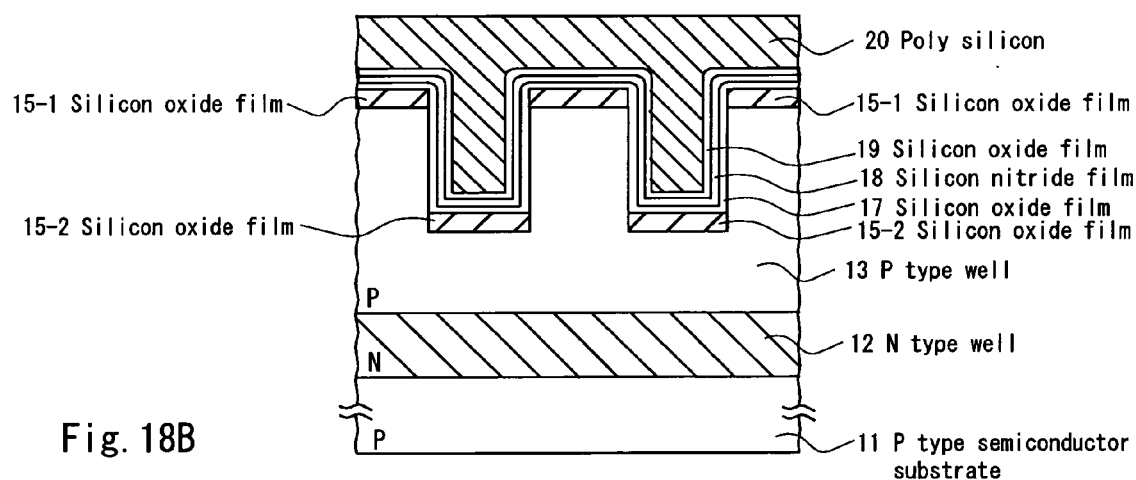
FIG. 18B is a diagram showing a cross section of the D–D' line.
Figure 19A:
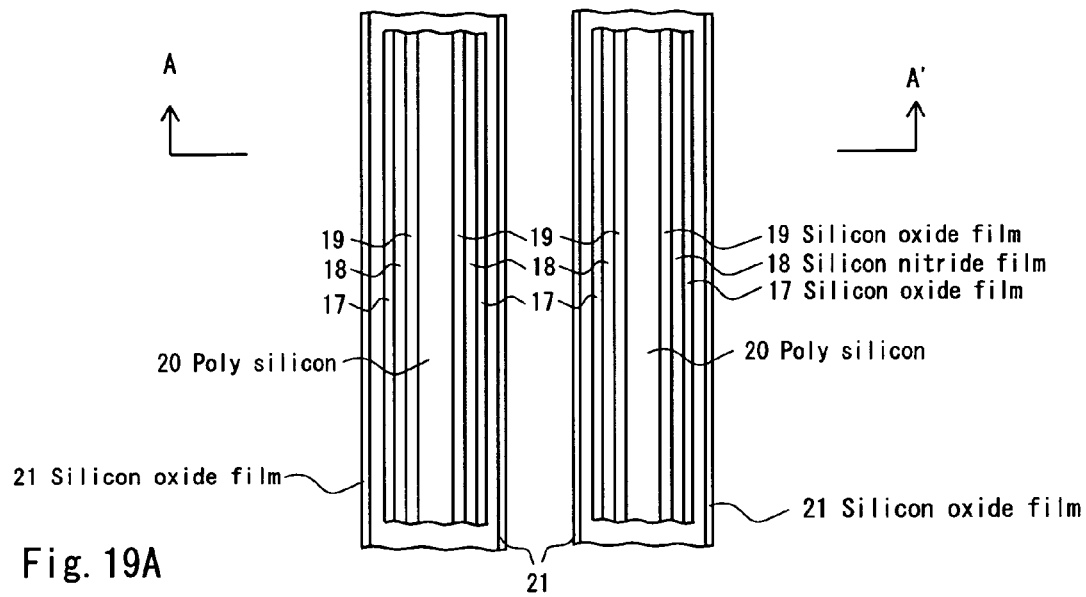
FIG. 19B is a diagram showing a cross section of the A–A' line.
Figure 19B:
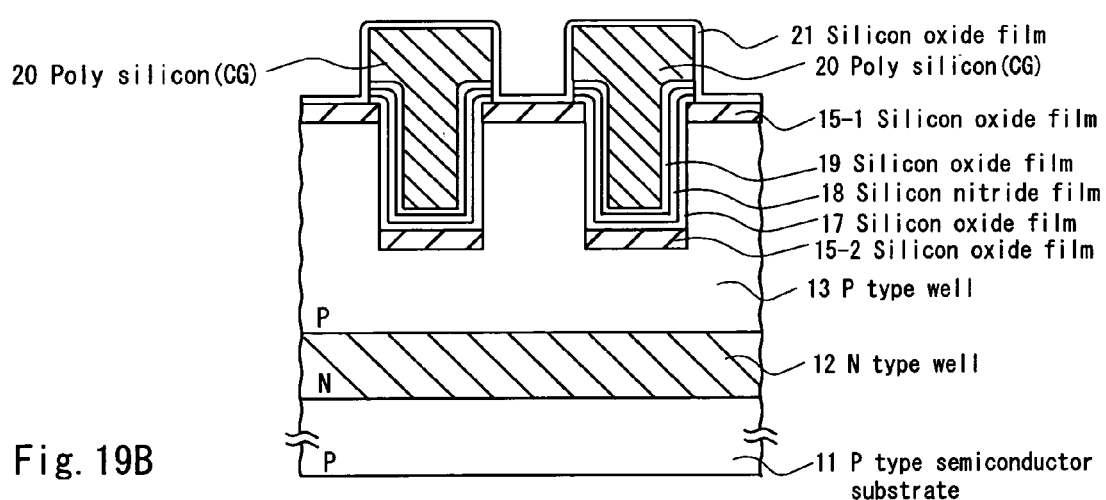
Figure 20A:
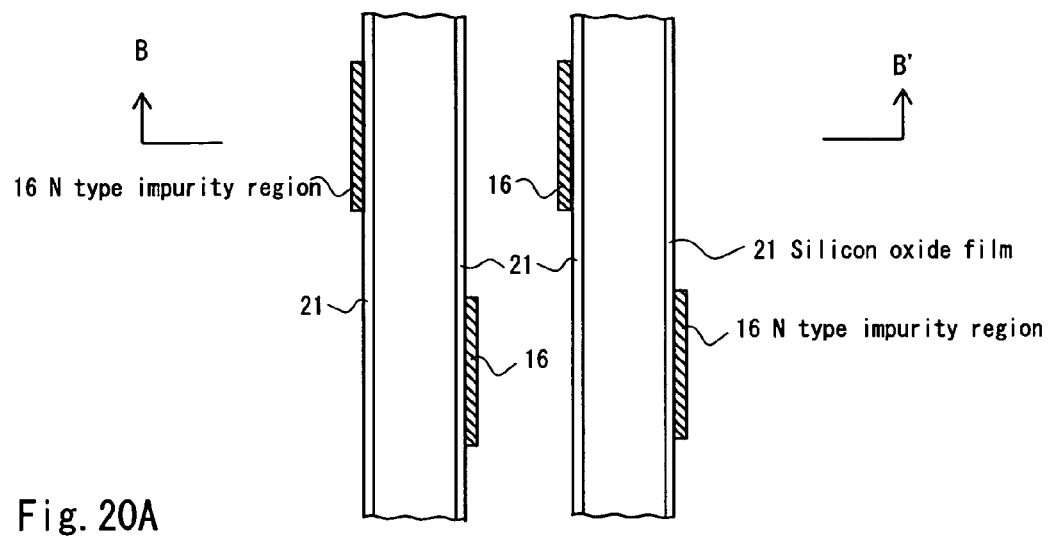
FIG. 20A is a diagram showing in plane view the manufacturing process of the selective gate transistor portion in FIG. 2.
Figure 20B:
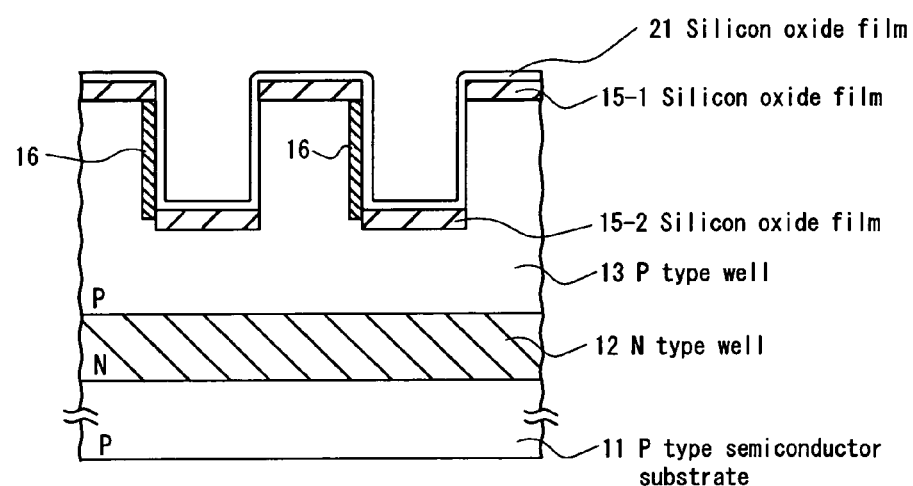
FIG. 20B is a diagram showing a cross section of the B–B' line.
Figure 21A:
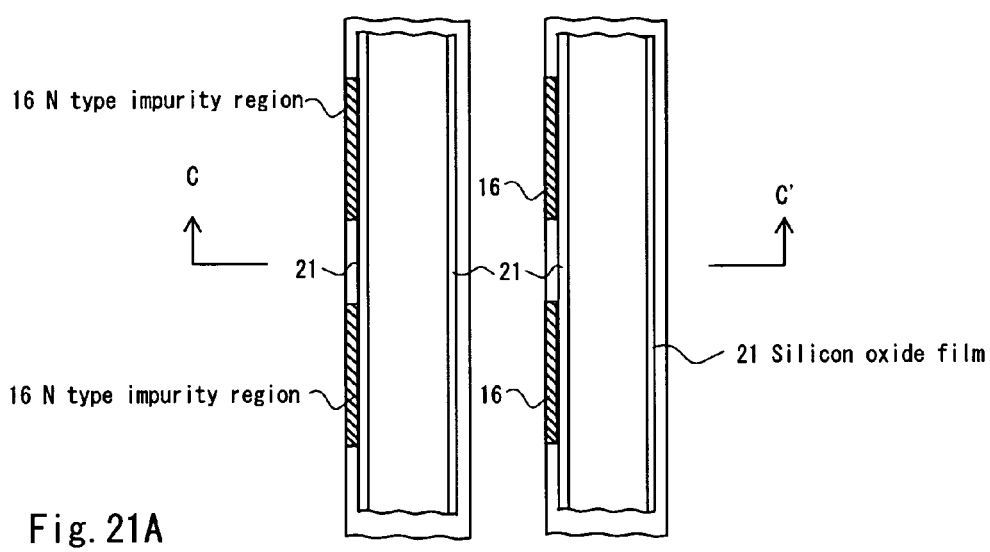
FIG. 21A is a diagram showing in plane view the manufacturing process of the bit line contact part in FIG. 2.
Figure 21B:
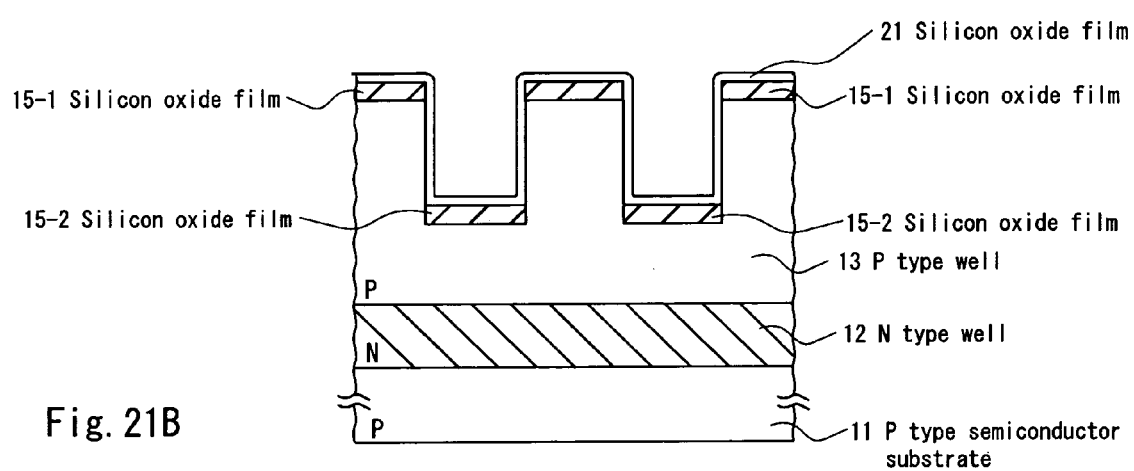
FIG. 21B is a diagram showing a cross section of the C–C' line.
Figure 22A:
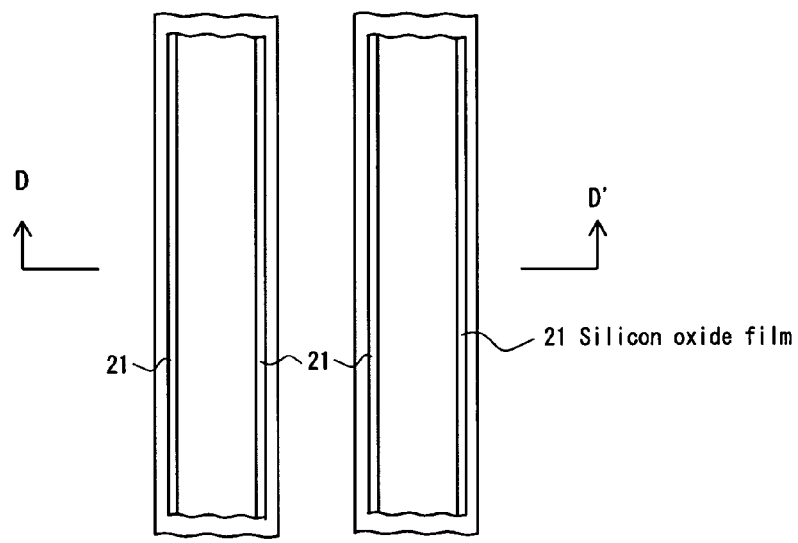
FIG. 22A is a diagram showing in plane view the manufacturing process of the source line contact part in FIG. 2.
Figure 22B:
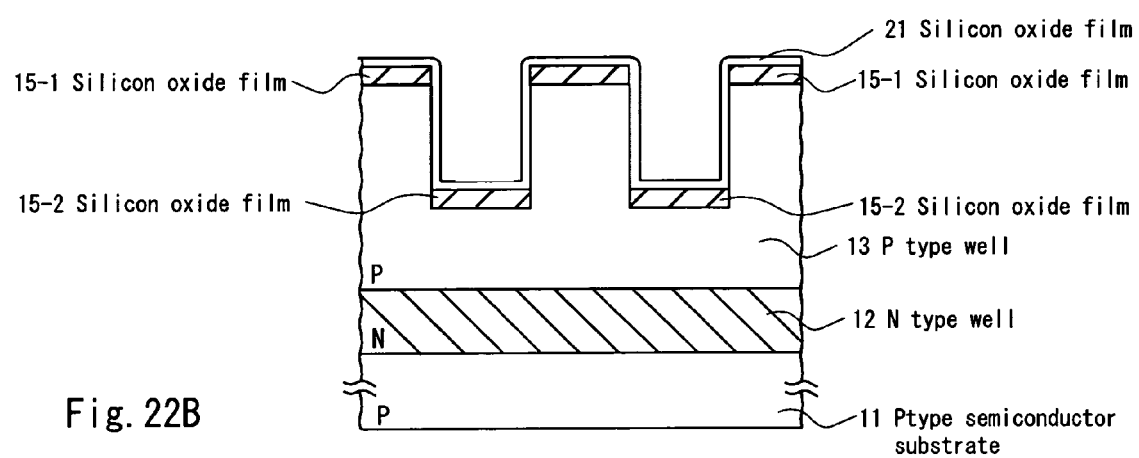
FIG. 22B is a diagram showing a cross section of the D–D' line.
Figure 23A:
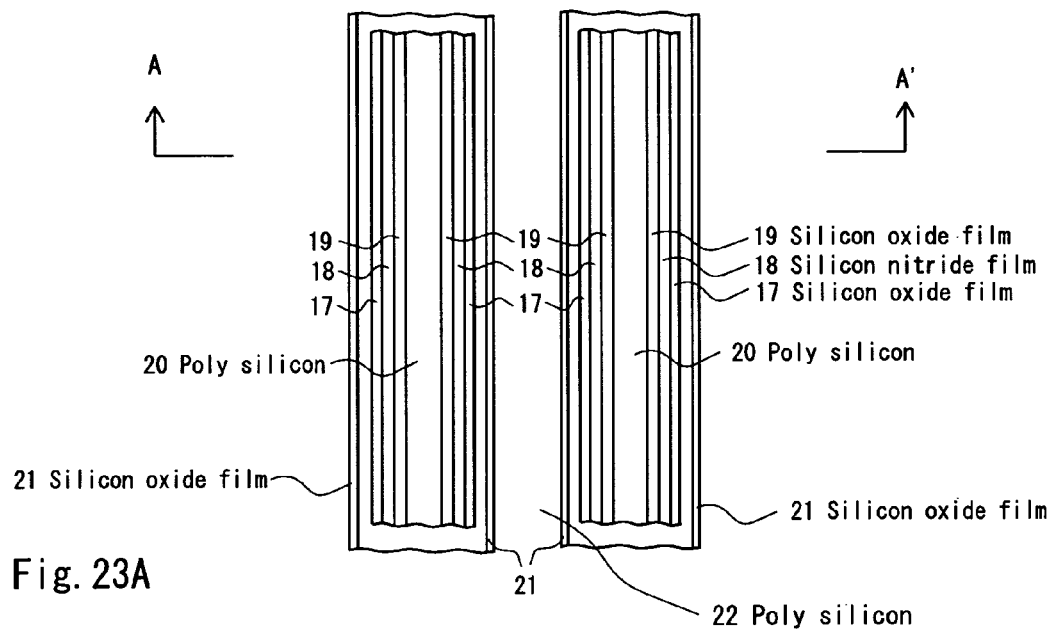
FIG. 23A is a diagram showing in plane view the manufacturing process of the memory cell transistor portion in FIG. 2.
Figure 23B:
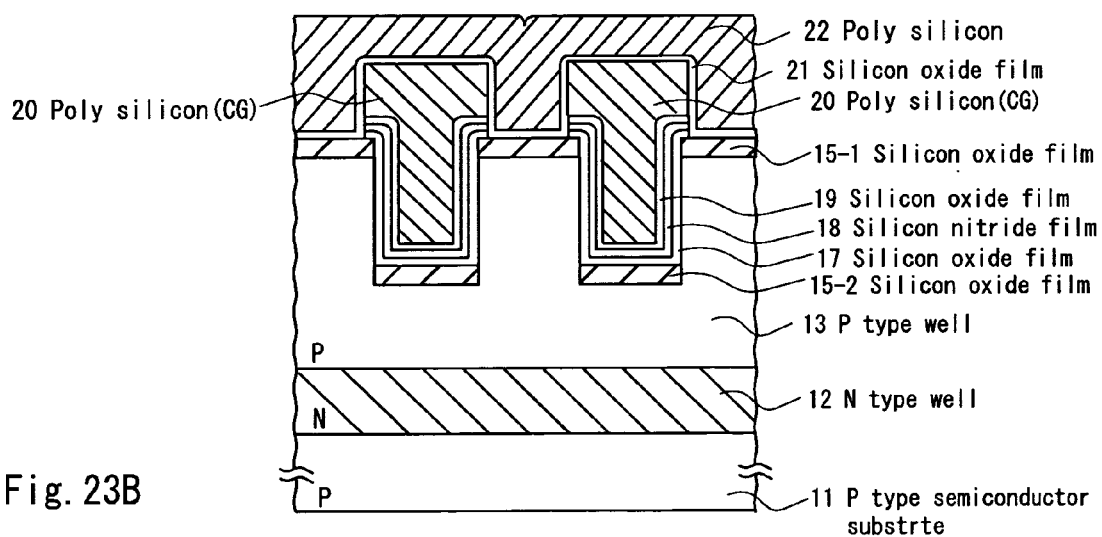
FIG. 23B is a diagram showing a cross section of the A–A' line.
Figure 24A:
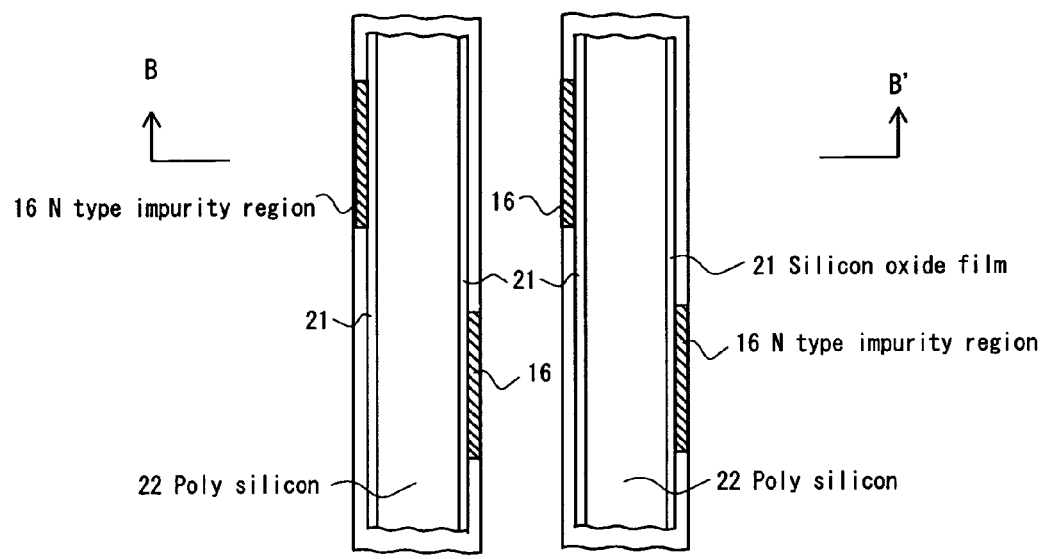
FIG. 24A is a diagram showing in plane view the manufacturing process of the selective gate transistor portion in FIG. 2.
Figure 24B:
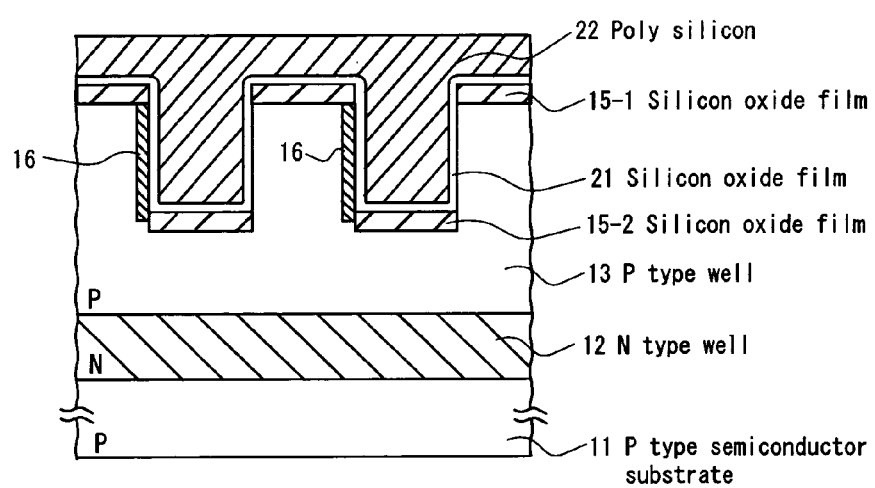
FIG. 24B is a diagram showing a cross section of the B–B' line.
Figure 25A:
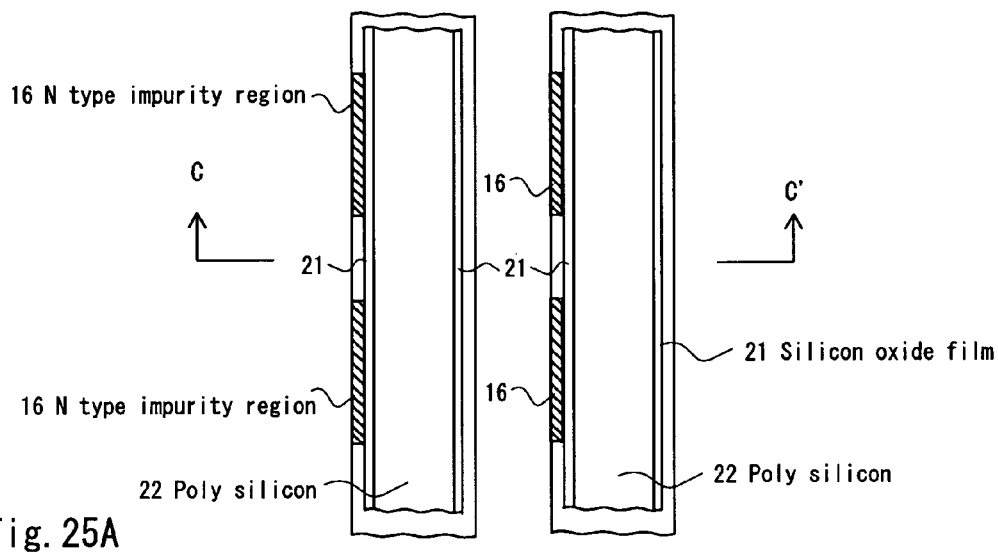
FIG. 25A is a diagram showing in plane view the manufacturing process of the bit line contact part in FIG. 2.
Figure 25B:
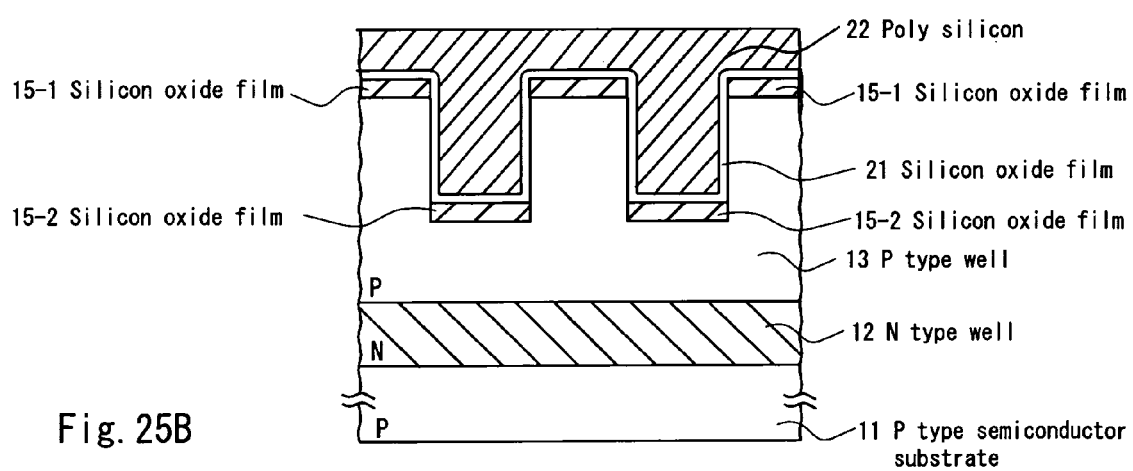
FIG. 25B is a diagram showing a cross section of the C–C' line.
Figure 26A:
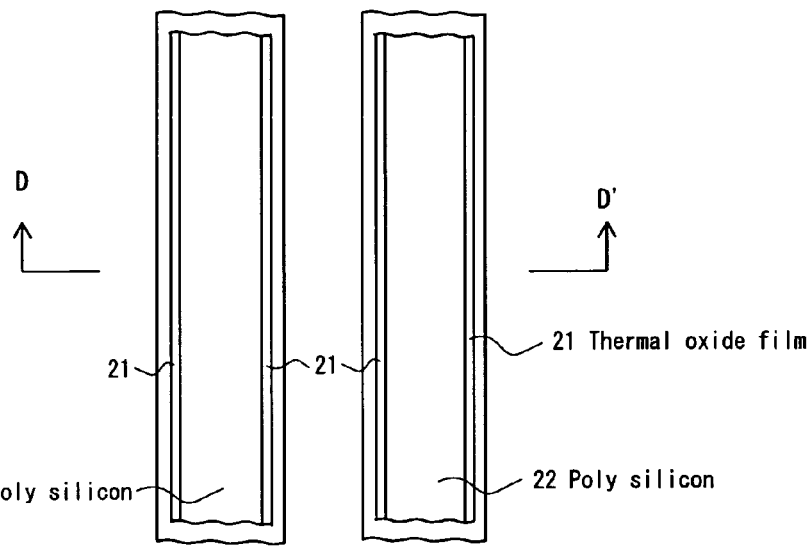
FIG. 26A is a diagram showing in plane view the manufacturing process of the source line contact part in FIG. 2.
Figure 26B:
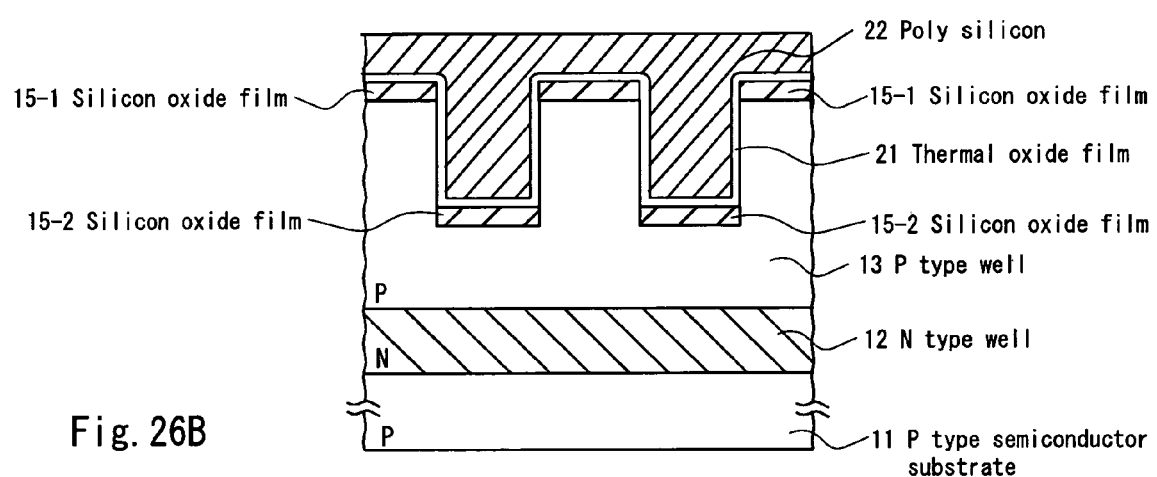
FIG. 26B is a diagram showing a cross section of the D–D' line.
Figure 27A:
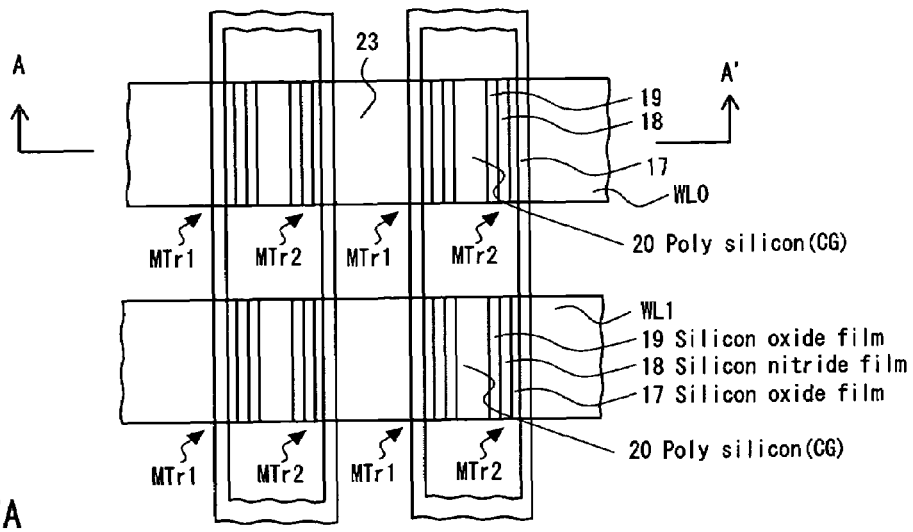
FIG. 27A is a diagram showing in plane view the manufacturing process of the memory cell transistor portion in FIG. 2.
Figure 27B:
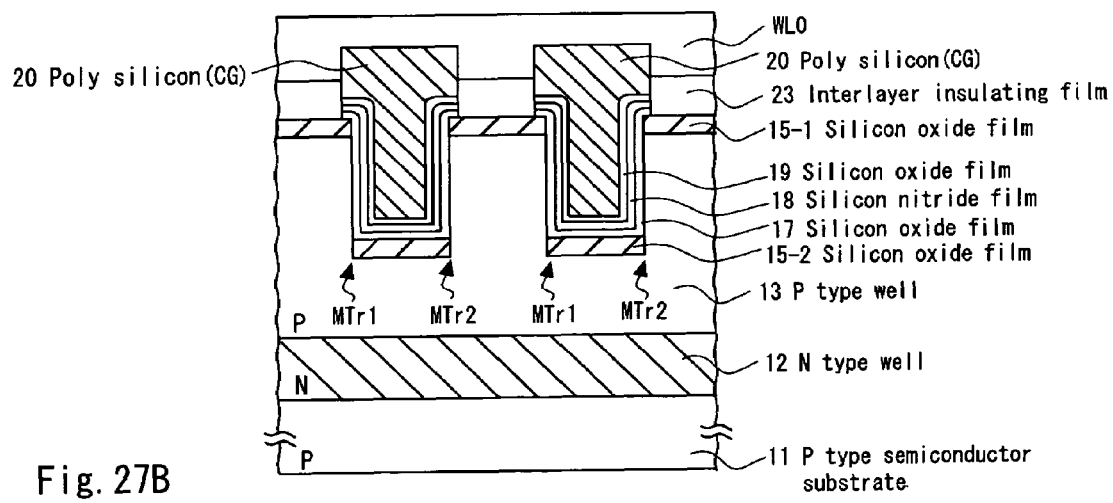
FIG. 27B is a diagram showing a cross section of the A–A' line.
Figure 28A:
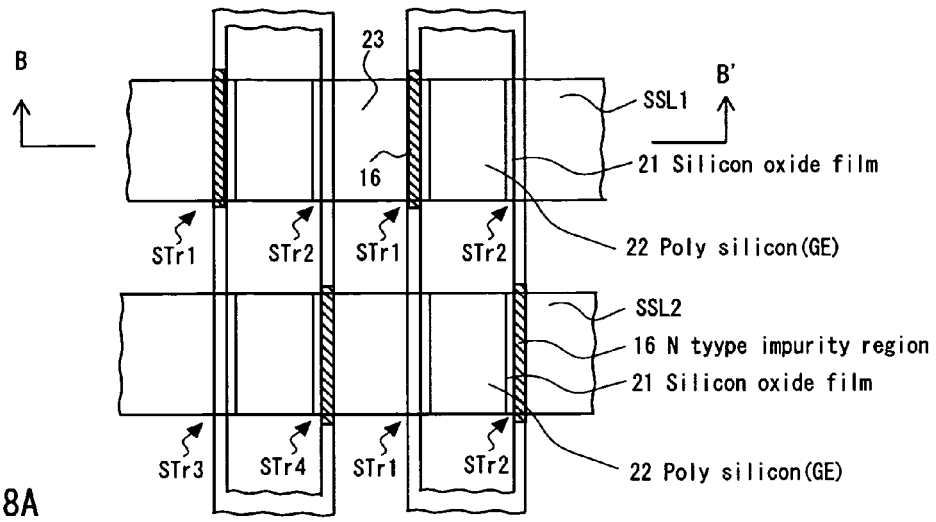
FIG. 28A is a diagram showing in plane view the manufacturing process of the selective gate transistor portion in FIG. 2.
Figure 28B:
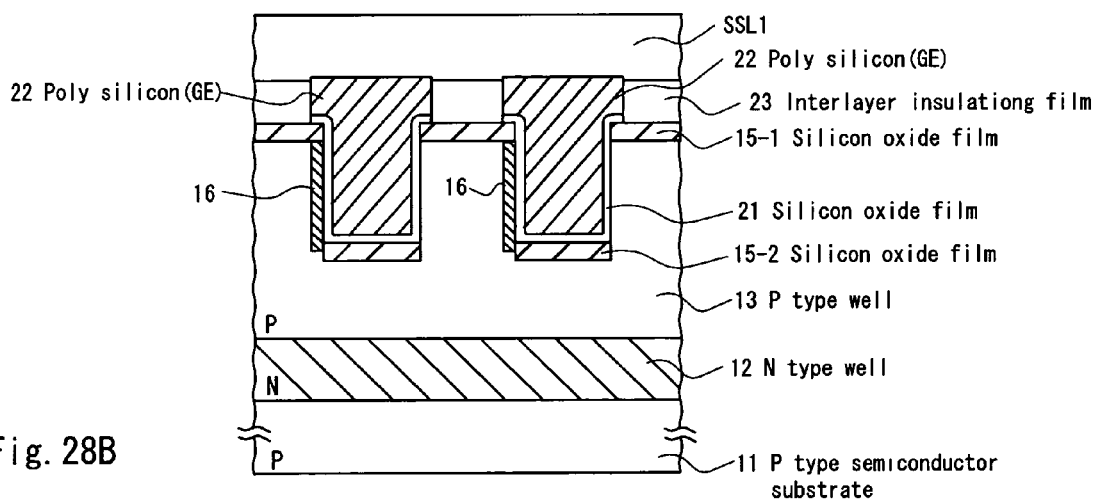
FIG. 28B is a diagram showing a cross section of the B–B' line.
Figure 29A:
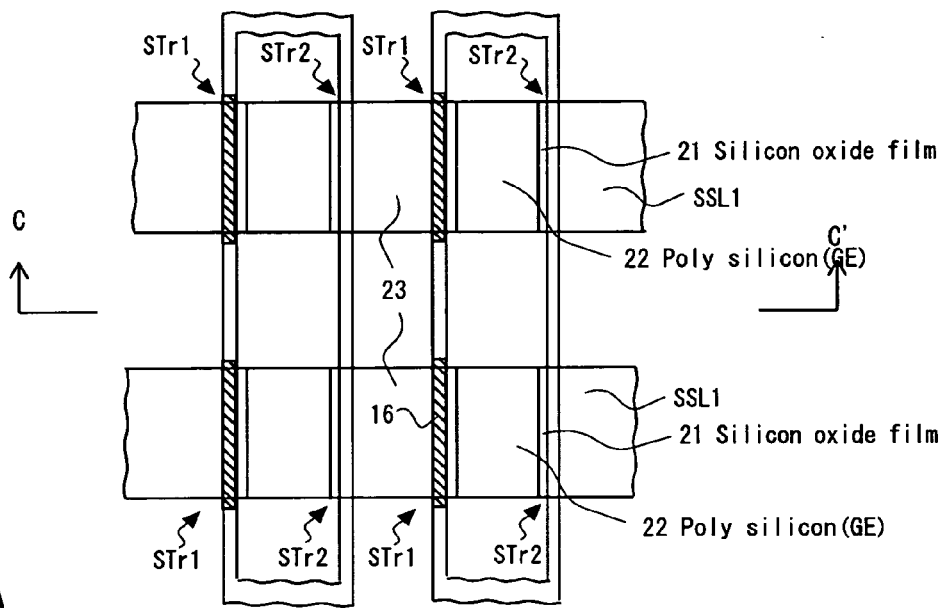
FIG. 29A is a diagram showing in plane view the manufacturing process of the bit line contact part in FIG. 2.
Figure 29B:
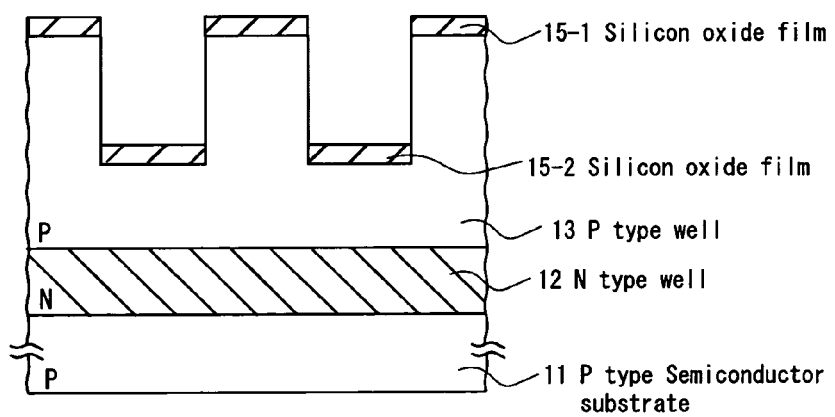
FIG. 29B is a diagram showing a cross section of the C–C' line.
Figure 30A:
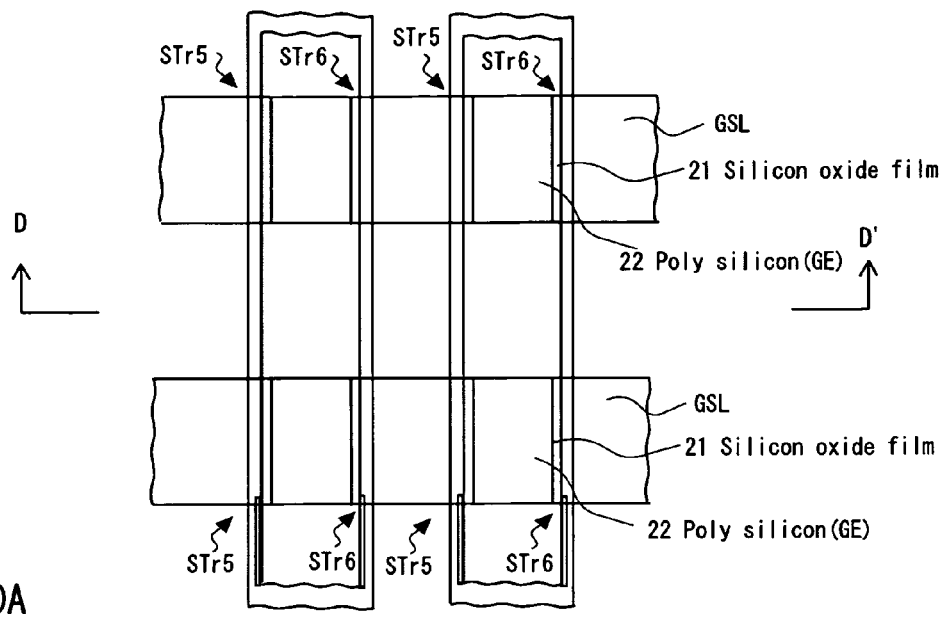
FIG. 30A is a diagram showing in plane view the manufacturing process of the source line contact part in FIG. 2.
Figure 30B:
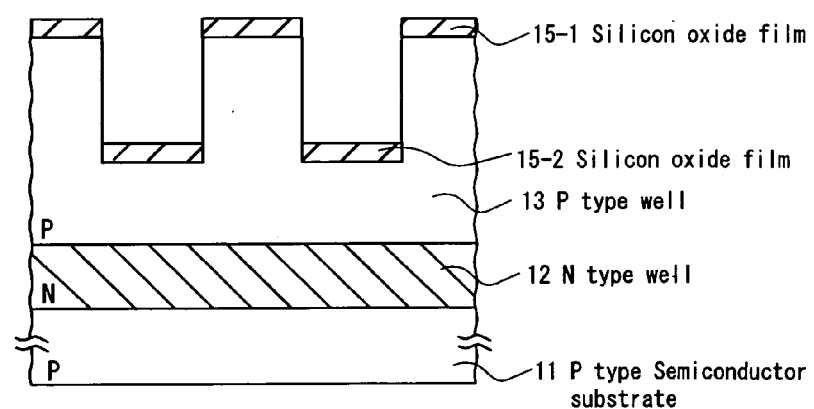
FIG. 30B is a diagram showing a cross section of the D–D' line.
Figure 31A:
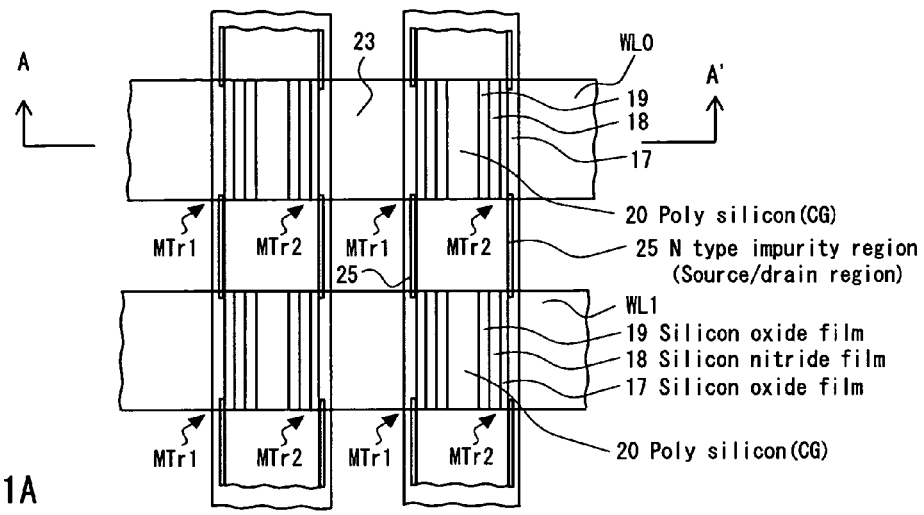
FIG. 31A is a diagram showing in plane view the manufacturing process of the memory cell transistor portion in FIG. 2.
Figure 31B:
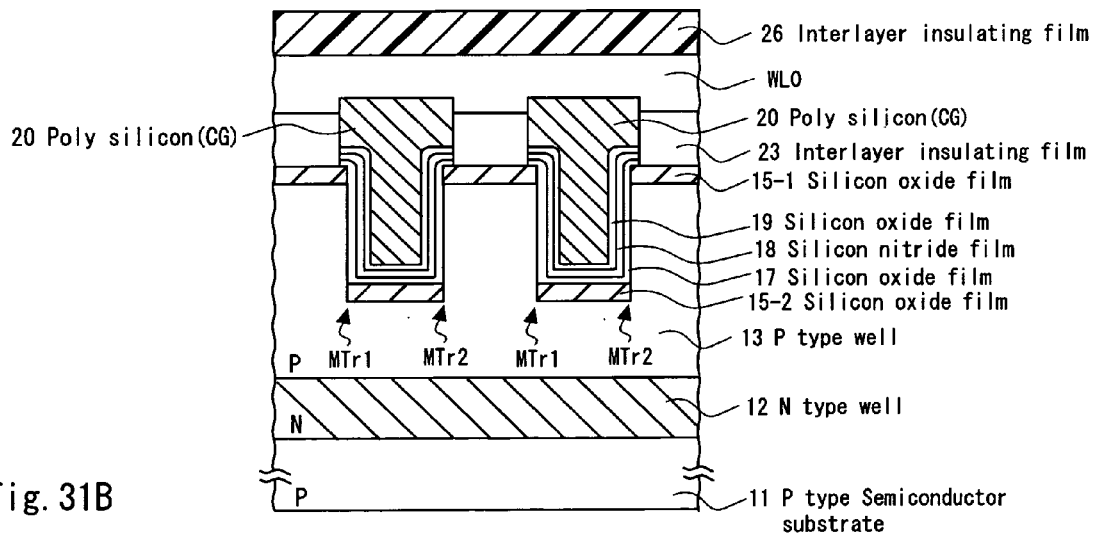
FIG. 31B is a diagram showing a cross section of the A–A' line.
Figure 32A:
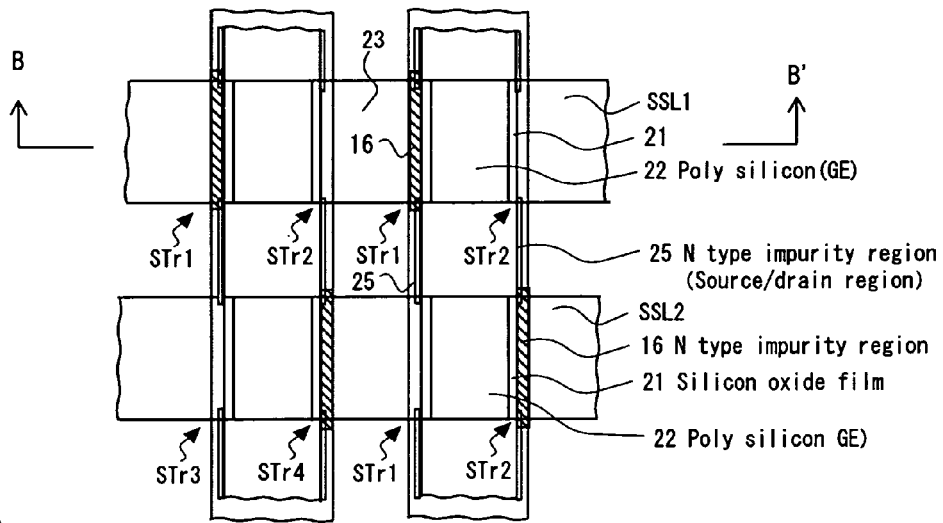
FIG. 32A is a diagram showing in plane view the manufacturing process of the selective gate transistor portion in FIG. 2.
Figure 32B:
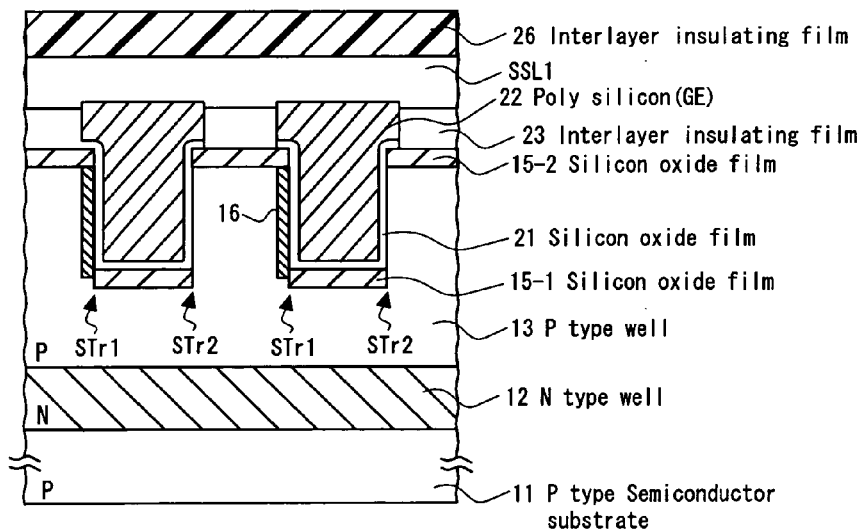
FIG. 32B is a diagram showing a cross section of the B–B' line.
Figure 56:
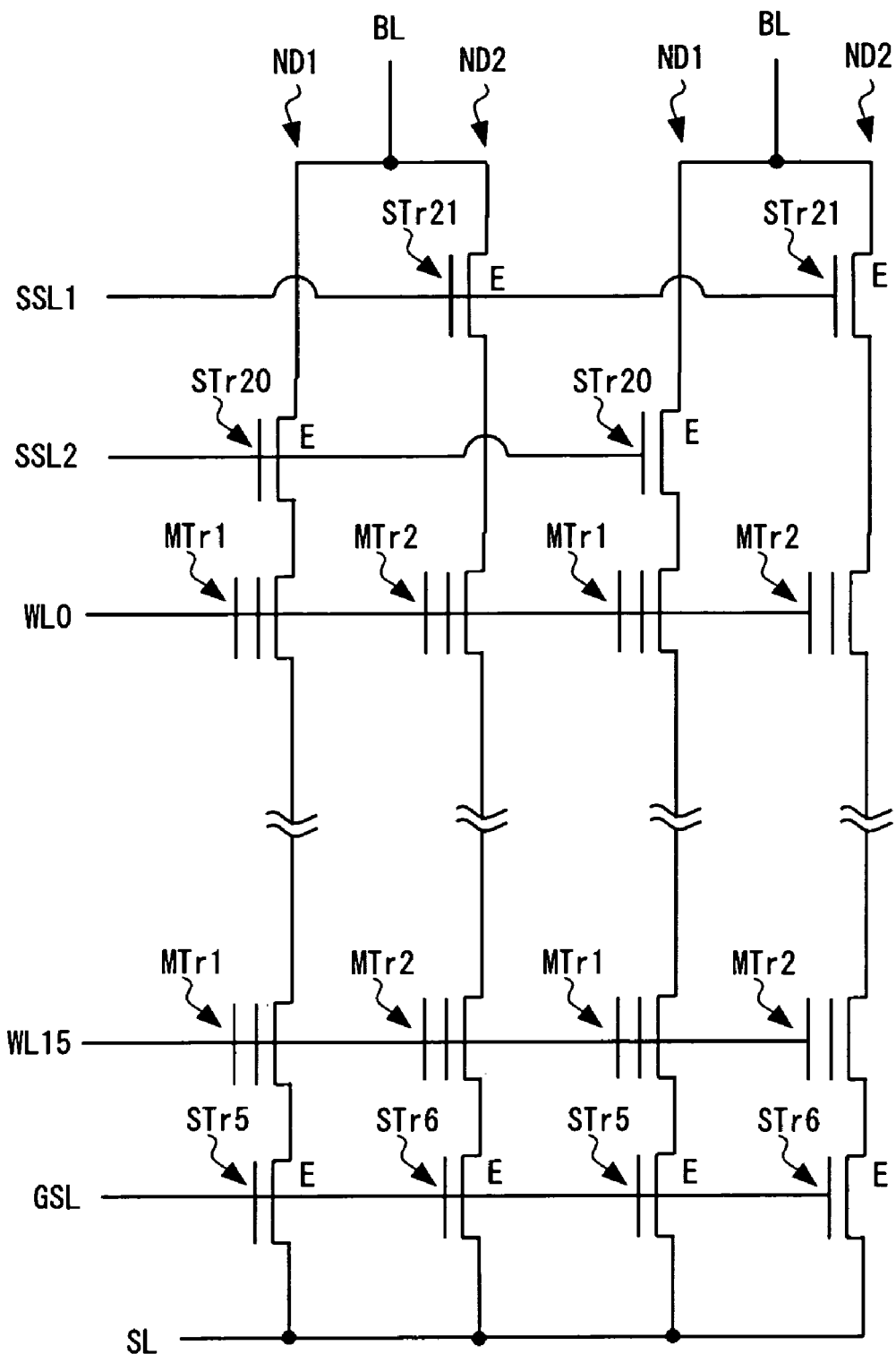
FIG. 56 is a diagram showing the equivalent circuit of the nonvolatile semiconductor memory device concerning one embodiment of this invention.
Figure 57:
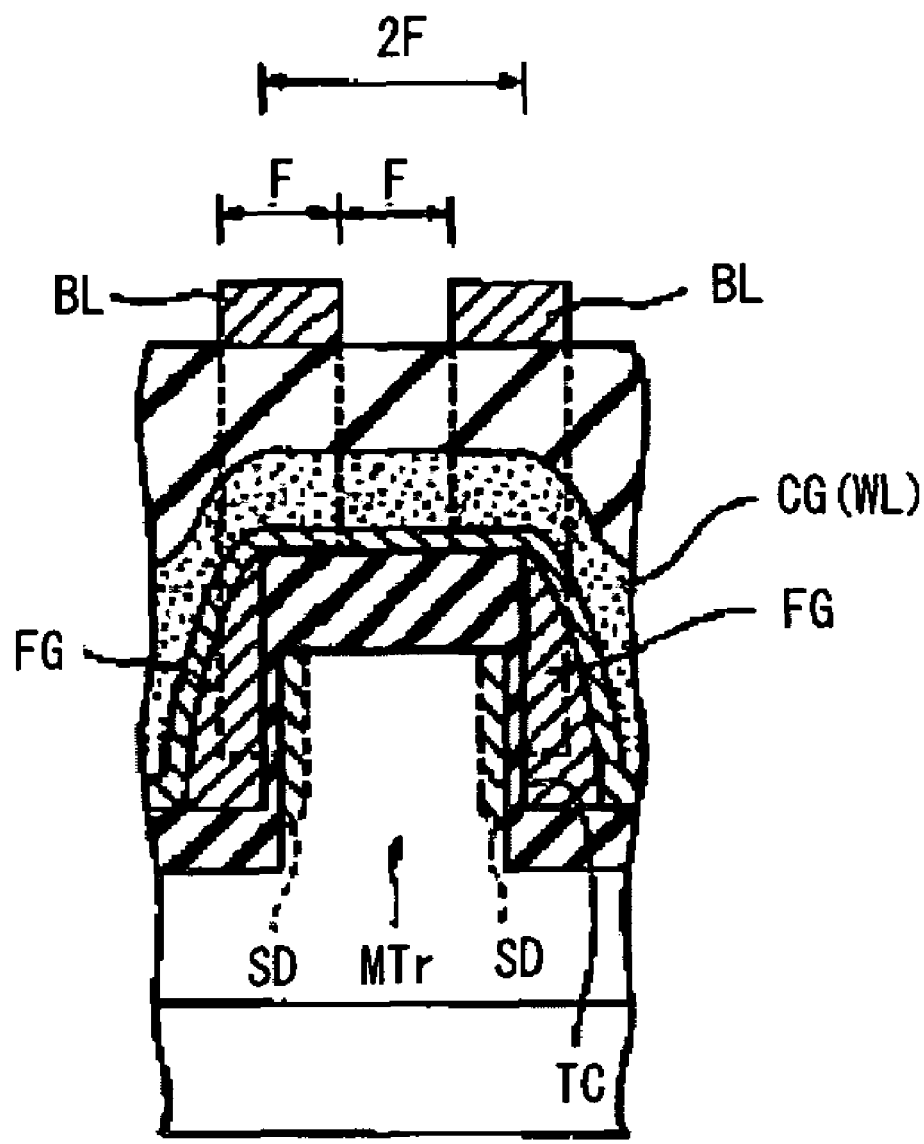
FIG. 57 is a cross sectional view of the conventional nonvolatile semiconductor memory device.

The nonvolatile semiconductor memory device of this invention is not limited to the above-mentioned embodiment and example, and it can change into various kinds. For example, in the above-mentioned embodiment and example, as shown in FIG. 1, two selective gate transistors STr1 and STr3 (STr2, STr4) are provided as a bit line side switch part at the bit line BL side of the NAND type memory cell unit ND 1 (ND2), and one selective gate transistor STr5 (STr6) is provided in the common source line SL side as a source line side switch part. However, the number of the selective gate transistors in these bit line side switch part and the source line side switch part may be switched. That is, as shown in FIG. 56, one selective gate transistor STr10 (STr11) may be provided to the bit line BL side of the NAND type memory cell unit ND1 (ND2) as a bit line side switch part, and two selective gate transistors STr12 and STr14 (STr13 and STr15) may be formed in the source line SL side as a source line side switch part. In this case, the selective gate transistor STr12 (STr15) may be a depression type while the selective gate transistor STr13 (STr14) may be an enhancement type. Moreover, as shown in FIG. 11, two selective gate transistors STr1 and STr3 (STr2 and STr4) may be formed as a bit line side switch part, and two selective gate transistors STr12 and STr14 (STr13 and STr15) may be formed as a source line side switch part.

As shown in FIG. 56, if allocation of bit line BL allows, it is unnecessary to use a depression type for a selective gate transistor as mentioned above, and in NAND type memory cell units ND1 and ND2, it is also possible to provide one enhancement type selective gate transistor STr20 (STr21) and STr5 (STr6) in each of the bit line side switch part and the source line side switch part, respectively.

As explained above, compared with the conventional nonvolatile semiconductor memory device, the nonvolatile semiconductor memory device of this invention can realize to minimize its size. According to the nonvolatile semiconductor memory device of this embodiment, since it does not have the floating gate which is used for the conventional nonvolatile semiconductor memory device, not only that minimization of the size of a nonvolatile semiconductor memory device can be realized, but also that an aspect ratio of the control gate (CG) can be made small without being influenced by coupling between the floating gates, which has been problems conventionally. In addition, the nonvolatile semiconductor memory device of this embodiment is applicable to the conventional CMOS process, and a highly efficient nonvolatile memory can be realized by a simpler process than the process required in the conventional nonvolatile semiconductor memory device.

Thus, since the nonvolatile semiconductor memory device of this invention can realize to minimize the size and to simplify a process, and a cheaper, smaller and high capacity nonvolatile semiconductor memory device can be realized. Therefore, the nonvolatile semiconductor memory device of this invention can be used as memory storage of electronic equipment including a computer, a digital camera, a cellular phone and home electronics.

Further, the nonvolatile semiconductor memory device of this invention is not limited to these embodiments, but various variations and modifications may be made without departing from the scope of this invention.

What is claimed is:

1. A nonvolatile semiconductor memory device comprising:
    a memory cell array having a first NAND type memory cell unit connecting a plurality of 1st memory cell transistors in-series in which a 1st electric charge accumulation layer and control gate are laminated, and a second NAND type memory cell unit connecting in-series a plurality of second memory cell transistors in which a 2nd electric charge accumulation layer and said control gate are laminated, are arranged in the shape of an array: and
    wherein said 1st memory cell transistors and said 2nd memory cell transistors are formed to face each other along with both side walls of a trench formed on a semiconductor substrate respectively, sharing said one control gate formed by extending in a depth direction of said trench;
    wherein said control gate is formed between said 1st electric charge accumulation layer of said 1st memory cell transistors and said 2nd electric charge accumulation layer of said 2nd memory cell transistors, and electrically connects with a word line extending continuously; and
    wherein said 1st electric charge accumulation layer and said 2nd electric charge accumulation layer are respectively formed by laminating silicon oxide film, a silicon nitride film and silicon oxide film in order, and said control gate is made of poly silicon doped with impurities or metal; and
    wherein said 1st electric charge accumulation layer and said 2nd electric charge accumulation layer are part of the same continuous layer.

2. A nonvolatile semiconductor memory device comprising:
    a memory cell array having a 1st NAND type memory cell unit and 2nd NAND type memory cell unit;
    the 1st memory cell unit having 1st NAND type memory cell array connecting in-series a plurality of 1st memory cell transistors in which a 1st electric charge accumulation layer and control gate are laminated, a 1st switch part at a source line side connecting between said 1st NAND type memory cell array and a common source line, and the 1st switch part at a bit line side connected between the 1st NAND type memory cell array and the bit line; and
    the 2nd memory cell unit having a 2nd NAND type memory cell array connecting in-series a plurality of 2nd memory cell transistors in which a 2nd electric charge accumulation layer and the control gate are laminated, a 2nd switch part at a source line side connecting between said 2nd NAND type memory cell array and the common source line, and the 2nd switch part at a bit line side connected between the 2nd NAND type memory cell array and the bit line; and
    wherein said 1st memory cell transistors and said 2nd memory cell transistors are formed respectively to face each other along with both side walls of a trench formed on a semiconductor substrate, sharing said control gate formed by extending in a depth direction of said trench;
    wherein said control gate is formed between said 1st electric charge accumulation layer of said 1st memory cell transistors and said 2nd electric charge accumulation layer of said 2nd memory cell transistors, and electrically connects with a word line extending continuously;

wherein said 1st electric charge accumulation layer and said 2nd electric charge accumulation layer are respectively formed by laminating silicon oxide film, a silicon nitride film and silicon oxide film in order, and said control gate is made of poly silicon doped with impurities or metal; and wherein said 1st electric charge accumulation layer and said 2nd electric charge accumulation layer are part of the same continuous layer.

3. A nonvolatile semiconductor memory device comprising:

a memory cell array having a first NAND type memory cell unit connecting a plurality of 1st memory cell transistors in-series in which a 1st electric charge accumulation layer and control gate are laminated and a second NAND type memory cell unit connecting in-series a plurality of second memory cell transistors in which a 2nd electric charge accumulation layer and said control gate are laminated, are arranged in the shape of an array; and wherein said 1st memory cell transistors and said 2nd memory cell transistors are formed respectively to face each other along with both side walls of a trench formed on a semiconductor substrate, sharing said control gate formed by extending in a depth direction of said trench, and said control gate is formed between said 1st electric charge accumulation layer of said 1st memory cell transistors and said 2nd electric charge accumulation layer of said 2nd memory cell transistors, electrically connecting with a word line extending continuously;

wherein said 1st electric charge accumulation layer and said 2nd electric charge accumulation layer respectively comprises an insulating layer including silicon, metal or conductive nano crystal and said control gate is made of poly silicon doped with impurities or metal; and wherein said 1st electric charge accumulation layer and said 2nd electric charge accumulation layer consists of the same continuous layer.

4. A nonvolatile semiconductor memory device comprising:

a memory cell array having a 1st NAND type memory cell unit and a 2nd NAND type memory cell unit;

the 1st memory cell unit having a 1st NAND type memory cell array connecting in-series a plurality of 1st memory cell transistors in which a 1st electric charge accumulation layer and control gate are laminated, a 1st switch part at a source line side connecting between said 1st NAND type memory cell array and a common source line, and the 1st switch part at a bit line side connected between the 1st NAND type memory cell array and the bit line;

the 2nd memory cell unit having 2nd NAND type memory cell array connecting in-series a plurality of 2nd memory cell transistors in which a 2nd electric charge accumulation layer and the control gate are laminated, a 2nd switch part at source line side connecting between said 2nd NAND type memory cell array and the common source line, and the 2nd switch part at a bit line side connected between the 2nd NAND type memory cell array and the bit line; and wherein the 1st memory cell transistor and said 2nd memory cell transistors are formed respectively to face each other along with both side walls of a trench formed on a semiconductor substrate, sharing said control gate formed by extending in a depth direction of said trench, and said control gate is formed between said 1st electric charge accumulation layer of said 1st memory cell transistors and said 2nd electric charge accumulation layer of said 2nd memory cell transistors, electrically connecting with a word line extending continuously;

wherein the 1st electric charge accumulation layer and said 2nd electric charge accumulation layer respectively comprise an insulating layer including silicon, metal or conductive nano-crystal, and said control gate is made of poly silicon doped with impurities or metal; and wherein said 1st electric charge accumulation layer and said 2nd electric charge accumulation layer consist of the same continuous layer.

* * * * *